(12) United States Patent
Chen et al.

(10) Patent No.: US 11,018,239 B2
(45) Date of Patent: May 25, 2021

(54) SEMICONDUCTOR DEVICE AND MANUFACTURING METHOD THEREOF

(71) Applicants: TAIWAN SEMICONDUCTOR MANUFACTURING CO., LTD., Hsinchu (TW); NATIONAL CHIAO TUNG UNIVERSITY, Hsinchu (TW)

(72) Inventors: Pin-Shiang Chen, Taipei (TW); Sheng-Ting Fan, Taipei (TW); Chee-Wee Liu, Taipei (TW)

(73) Assignees: TAIWAN SEMICONDUCTOR MANUFACTURING CO., LTD., Hsinchu (TW); NATIONAL CHIAO TUNG UNIVERSITY, Hsinchu (TW)

( * ) Notice: Subject to any disclaimer, the term of this patent is extended or adjusted under 35 U.S.C. 154(b) by 0 days.

(21) Appl. No.: 16/383,594

(22) Filed: Apr. 13, 2019

(65) Prior Publication Data
US 2020/0328287 A1 Oct. 15, 2020

(51) Int. Cl.
*H01L 29/51* (2006.01)
*H01L 29/66* (2006.01)
*H01L 29/78* (2006.01)
*H01L 21/28* (2006.01)

(52) U.S. Cl.
CPC ...... *H01L 29/516* (2013.01); *H01L 29/40111* (2019.08); *H01L 29/513* (2013.01); *H01L 29/6684* (2013.01); *H01L 29/78391* (2014.09)

(58) Field of Classification Search
CPC ............. H01L 29/516; H01L 29/40111; H01L 29/78391; H01L 29/6684; H01L 29/513; H01L 29/66545
See application file for complete search history.

(56) References Cited

U.S. PATENT DOCUMENTS

| | | | |
|---|---|---|---|
| 6,335,550 B1* | 1/2002 | Miyoshi | H01L 29/40111 257/295 |
| 6,420,742 B1* | 7/2002 | Ahn | H01L 29/516 257/295 |
| 9,679,893 B2* | 6/2017 | Yan | H01L 27/0733 |
| 2001/0052607 A1* | 12/2001 | Kato | H01L 29/78391 257/295 |
| 2011/0316059 A1* | 12/2011 | Ahn | H01L 29/78391 257/295 |

(Continued)

OTHER PUBLICATIONS

Sayeef Salahuddin et al., "Use of Negative Capacitance to Provide Voltage Amplification for Low Power Nanoscale Devices,"Nano Lett., vol. 8, No. 2, 2008.

(Continued)

*Primary Examiner* — Errol V Fernandes
*Assistant Examiner* — Jeremy J Joy
(74) *Attorney, Agent, or Firm* — Maschoff Brennan

(57) ABSTRACT

A semiconductor device includes a channel, source/drain structures, and a gate stack. The source/drain structures are on opposite sides of the channel. The gate stack is over the channel, and the gate stack includes a gate dielectric layer, a doped ferroelectric layer, and a gate electrode. The gate dielectric layer is over the channel. The doped ferroelectric layer is over the gate dielectric layer. The gate electrode is over the doped ferroelectric layer. A dopant concentration of the doped ferroelectric layer varies in a direction from the gate electrode toward the channel.

20 Claims, 59 Drawing Sheets

(56) References Cited

U.S. PATENT DOCUMENTS

| | | | |
|---|---|---|---|
| 2015/0287802 A1* | 10/2015 | Lee | H01L 29/40111 257/105 |
| 2015/0287834 A1* | 10/2015 | Liao | C23C 14/165 257/295 |
| 2017/0040331 A1* | 2/2017 | Van Houdt | H01L 29/516 |
| 2017/0141235 A1* | 5/2017 | Lai | H01L 29/401 |
| 2018/0240803 A1* | 8/2018 | Yoo | H01L 29/40111 |
| 2018/0277191 A1* | 9/2018 | Yoo | H01L 29/78391 |
| 2018/0286988 A1* | 10/2018 | Yoo | H01L 29/42368 |
| 2019/0019800 A1* | 1/2019 | Yoo | H01L 29/40111 |
| 2019/0019802 A1* | 1/2019 | Yoo | H01L 29/517 |
| 2019/0198673 A1* | 6/2019 | Liu | H01L 29/516 |

OTHER PUBLICATIONS

A. K. Tagantsev et al., "Interface-induced phenomena in polarization response of ferroelectric thin films," J. Appl. Phys. 100, 051607 (Jun. 28, 2006).

Sahar Saremi et al., "Local control of defects and switching properties in ferroelectric thin films," Physical Review Materials 2, 084414 (Aug. 31, 2018).

* cited by examiner

SEMICONDUCTOR DEVICE AND MANUFACTURING METHOD THEREOF

BACKGROUND

The metal-oxide-semiconductor (MOS) is a technology for integrated circuits at 90 nm technology and beyond. A MOS device can work in three regions, depending on gate voltage $V_g$ and source-drain voltage $V_{ds}$, linear, saturation, and sub-threshold regions. The sub-threshold region is a region where $V_g$ is smaller than the threshold voltage $V_t$. The sub-threshold swing represents the easiness of switching the transistor current off and thus is a factor in determining the speed of a MOS device. The sub-threshold swing can be expressed as a function of m*kT/q, where m is a parameter related to capacitance. The sub-threshold swing of a MOS device has a limit of about 60 mV/decade (kT/q) at room temperature, which in turn sets a limit for further scaling of operation voltage VDD and threshold voltage $V_t$. This limitation is due to the drift-diffusion transport mechanism of carriers. For this reason, existing MOS devices are hard to switch faster than 60 mV/decade at room temperatures. The 60 mV/decade sub-threshold swing limit also applies to FinFET or ultra thin-body MOSFET on silicon-on-insulator (SOI) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
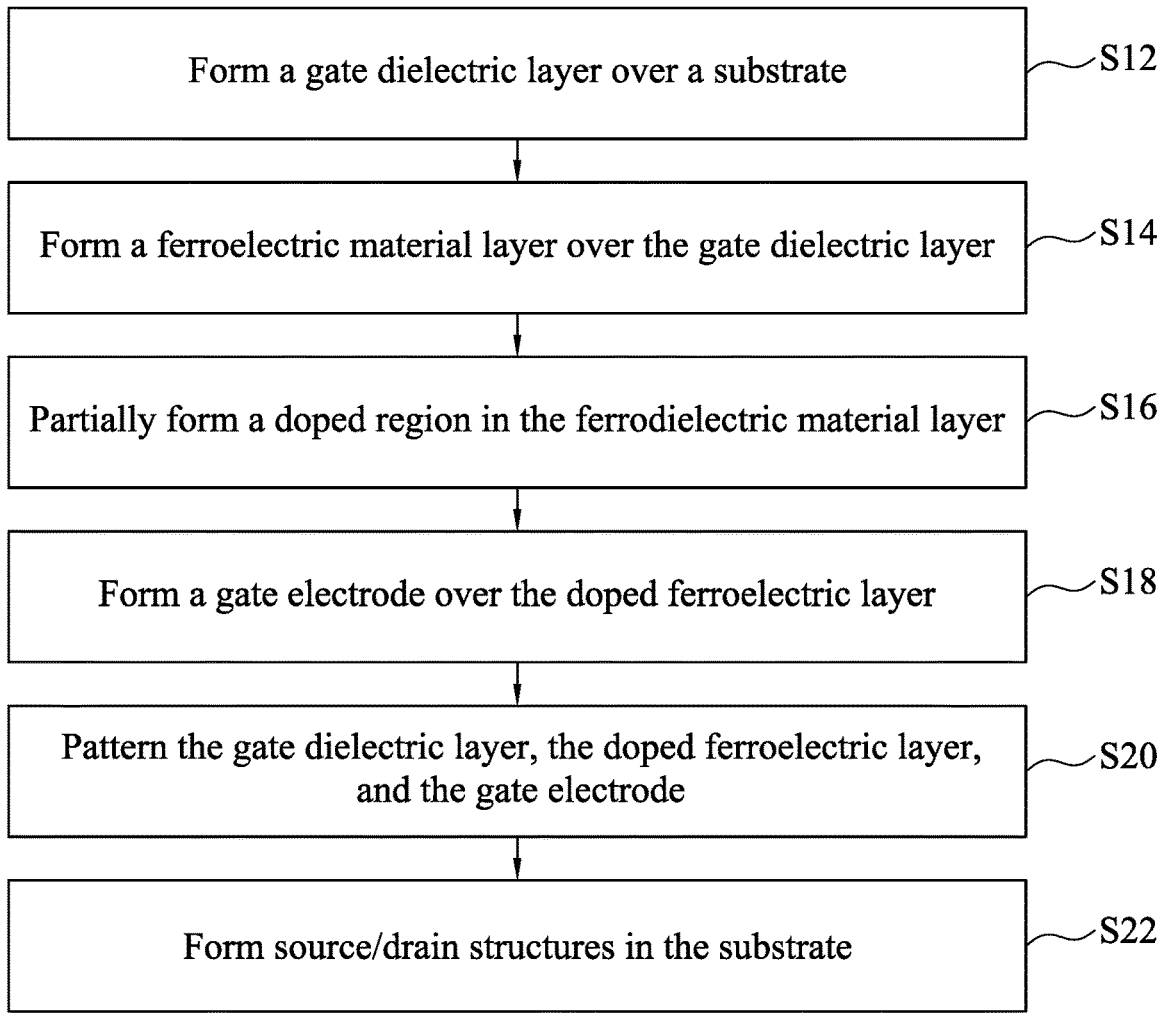
FIG. 1 is a flowchart of a method for making a semiconductor device according to aspects of the present disclosure in various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

This disclosure provides a negative capacitance gate stack structure with a doped ferroelectric layer to implement negative capacitance field effect transistors (NCFETs) with improved voltage gain. In some embodiments, the negative capacitance gate stack may be realized on the device selected from the group consisting of planar devices, multi-gate devices, FinFETs, and gate-all-around FETs.

FIG. 1 is a flowchart of a method M10 for making a semiconductor device according to aspects of the present disclosure in various embodiments. Various operations of the method M10 are discussed in association with perspective diagrams FIGS. 2A-2F. Throughout the various views and illustrative embodiments, like reference numbers are used to designate like elements. In some embodiments, the semiconductor device as shown in FIGS. 2A-2F may be intermediate devices fabricated during processing of an IC, or a portion thereof, that may include static random access memory (SRAM) and/or logic circuits, passive components such as resistors, capacitors, and inductors, and active components such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 2A:
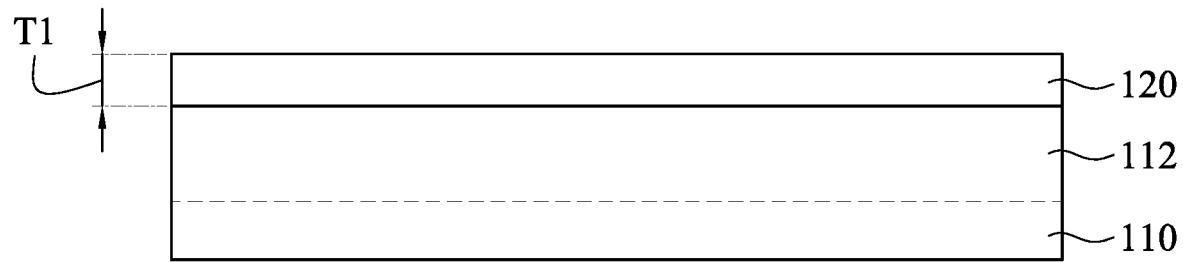
FIGS. 2A-2F are cross-sectional views of the method for making the semiconductor device at different stages according to aspects of the present disclosure in various embodiments.

In operation S12 of method M10, a gate dielectric layer 120 is formed over a substrate 110, as shown in FIG. 2A. Specifically, a substrate 110 is provided. In some embodiments, the substrate 110 may include silicon (Si). Alternatively, the substrate 110 may include germanium (Ge), silicon germanium, gallium arsenide (GaAs), germanium-tin (GeSn), or other appropriate semiconductor materials. Also alternatively, the substrate 110 may include an epitaxial layer. For example, the substrate 110 may have an epitaxial layer overlying a bulk semiconductor. The substrate 110 may include III-V materials such as InP, GaAs, AlAs, InAs, InAlAs, InGaAs, InSb, GaSb, InGaSb, combinations thereof, or the like. Further, the substrate 110 may be strained for performance enhancement. For example, the epitaxial layer may include a semiconductor material different from those of the bulk semiconductor such as a layer of silicon germanium overlying a bulk silicon or a layer of silicon overlying a bulk silicon germanium formed by a process including selective epitaxial growth (SEG). Furthermore, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or other appropriate method. In various embodiments may include any of a variety of substrate structures and material. The substrate 110 may include a well region 112 such as an n-well or a p-well formed by a proper technique, such as ion implantation.

The gate dielectric layer 120 is conformally formed over the substrate 110. In some embodiments, the gate dielectric layer 120 may include silicon dioxide, silicon nitride, a high-κ dielectric material (such as $GeO_2$, $HfO_2$, $ZrO_2$, $Al_2O_3$, $Ga_2O_3$, or $TiO_2$) or other suitable material. In various examples, the gate dielectric layer 120 may be deposited by an ALD process, a CVD process, a subatmospheric CVD (SACVD) process, a flowable CVD process, a PVD process, or other suitable process. By way of example, the gate dielectric layer 120 may be used to prevent damage to the substrate 110 by subsequent processing (e.g., subsequent formation of the dummy gate structure). In some embodiments, the thickness T1 of the gate dielectric layer 120 is about 0.5 nm to about 10 nm.

Figure 2B:
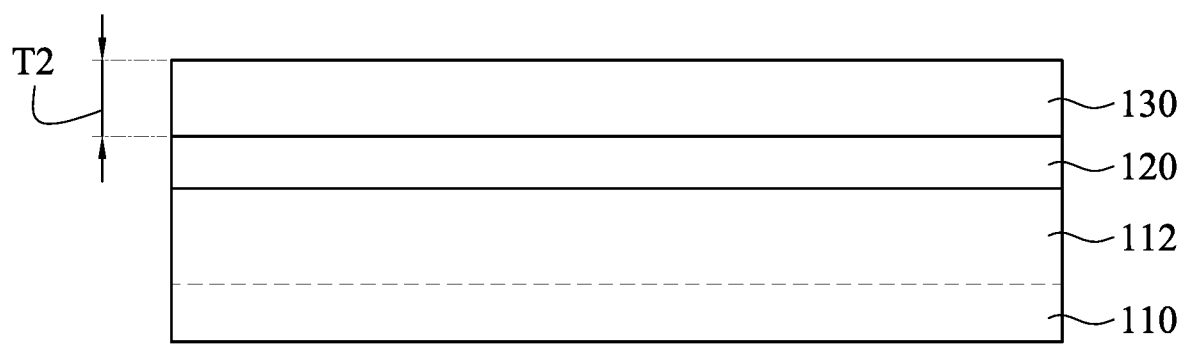

In operation S14 of method M10, a ferroelectric material layer 130 is formed over the gate dielectric layer 120, as shown in FIG. 2B. It is appreciated that the ferroelectric material layer 130, as-deposited without being annealed, may, or may not, have the ferroelectric property. However, it is still referred to as a ferroelectric material layer since the ferroelectric property will be achieved in subsequent processes. The ferroelectric material layer 130 includes electric dipoles. The thickness T2 of ferroelectric material layer 130 may be smaller than about 10 nm, and may be in the range between about 2 nm and about 10 nm. The exemplary materials of ferroelectric material layer 130 include $HfO_2$, $HfSiO_x$, $HfGeO_x$, $HfAlO_x$, $HfLaO_x$, $HfZrO_x$, $Al_2O_3$, $TiO_2$, $LaO_x$, $BaSrTiO_x$ (BST), $PbZrTiO_x$ (PZT), or the like, wherein value x is greater than zero and smaller than 1. The ferroelectric material layer 130 may be formed using PVD, ALD, CVD, or other suitable processes.

Figure 2C:
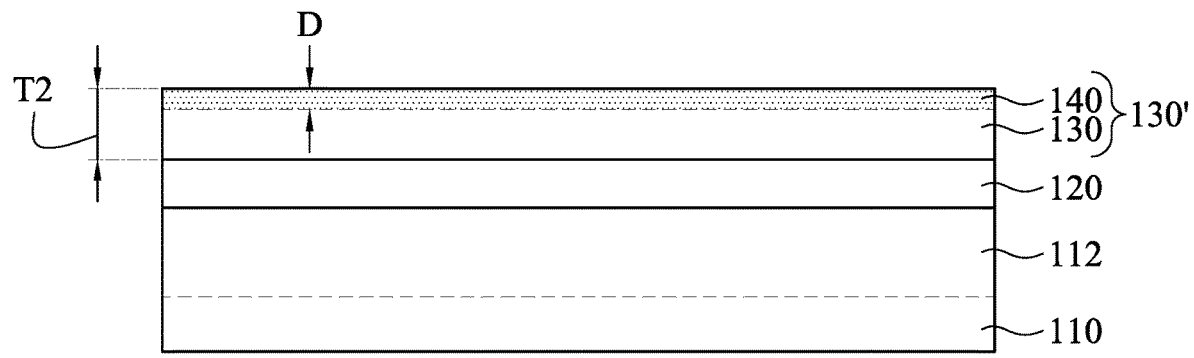

In operation S16 of method M10, a doped region 140 is partially formed in the ferroelectric material layer 130, e.g., in a top portion of the ferroelectric material layer 130, as shown in FIG. 2C. The doped region 140 may be formed using ion implantation or ion bombardment. Ion implantation involves the use of ions that are accelerated in an electrical field and impacted into a semiconductor feature, such as the ferroelectric material layer 130. For example, dopants may be implanted into the ferroelectric material layer 130. Each dopant atom may create a charge carrier in the ferroelectric material layer 130. A charge carrier can be a hole, created by a P-type dopant, or an electron, created by an N-type dopant. The P-type dopants may be Phosphorus, Arsenic, Antimony, Bismuth, Lithium, or other suitable materials, and the N-type dopants may be Boron, Gallium, Indium, or other suitable materials. The doped region 140 thus has different electrically conductive properties than the ferroelectric material layer 130 and induces an (vertical) electric field directing upwardly in the ferroelectric material layer 130. This electric field shifts the P-E curve of the first ferroelectric material layer 130, and the capacitance of ferroelectric $C_{FE}$ (which will be described in detail in FIGS.

3A and 3B) can be tuned accordingly. In FIG. 2C, the ferroelectric material layer 130 with the doped region 140 may be referred to as a doped ferroelectric layer 130'.

In some embodiments, a depth D of the doped region 140 may be in a range of about 5% to about 15% of the thickness T2 of the ferroelectric material layer 130. If the depth D is greater than about 15%, the profile or direction of the electric field formed in the ferroelectric material layer 130 may be undesired, or there is no electric field formed in the ferroelectric material layer 130. As such, the voltage gain of the resulting semiconductor device is unsuccessfully improved. If the depth D is less than about 5%, the doped region 140 may not be successfully formed in the ferroelectric material layer 130, or the formed doped region 140 may have non-uniform doping concentration. In some embodiments, a doping concentration of the doped region 140 may be in a range of about 1E12 $cm^{-2}$ to about 5E13 $cm^{-2}$.

Figure 2D:
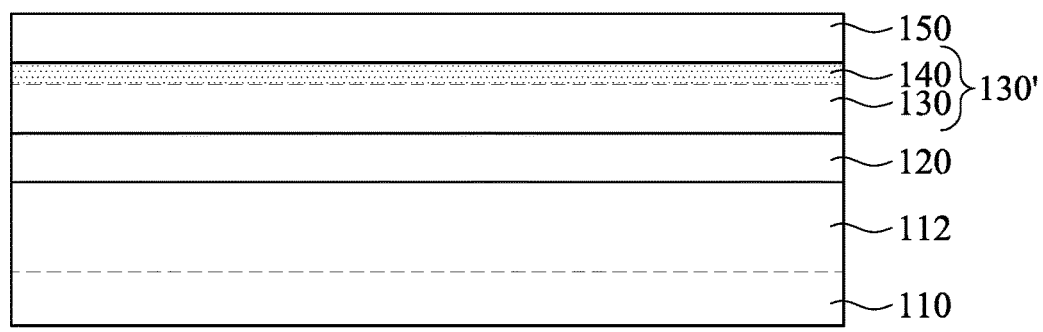

In operation S18 of method M10, a gate electrode 150 is formed over the doped ferroelectric layer 130', as shown in FIG. 2D. In some embodiments, the gate electrode 150 includes a metallic material such as Pt, Al, W, Ni, alloys thereof (such as aluminum copper alloy), or metal compound (such as titanium nitride or tantalum nitride). The gate electrode 150 may be formed using physical vapor deposition (PVD), plating, combinations thereof, or other suitable technology. The gate electrode 150 may include metal silicide, doped silicon or other suitable conductive material in accordance with some embodiments.

Figure 2E:
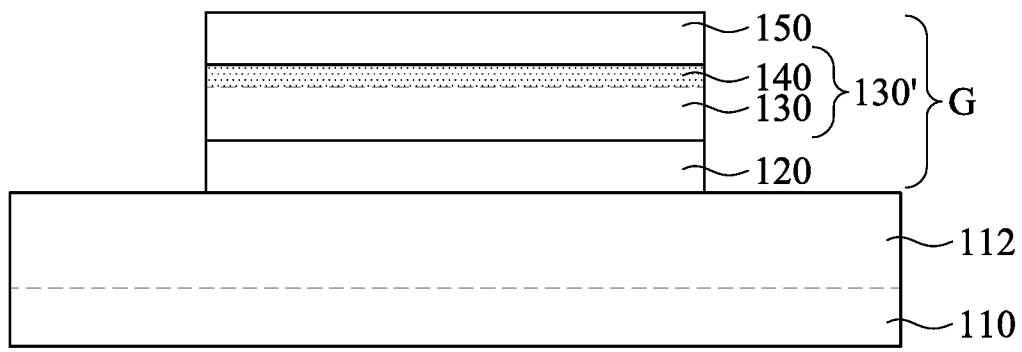

In operation S20 of method M10, the gate dielectric layer 120, the doped ferroelectric layer 130', and the gate electrode 150 are patterned to form a gate stack G, as shown in FIG. 2E. In some embodiments, a patterned mask may be formed over the structure of FIG. 2D, and a patterning process (such as an etching process) is performed on the gate dielectric layer 120, the doped ferroelectric layer 130', and the gate electrode 150 using the patterned mask as a mask to form the gate stack G.

Figure 2F:
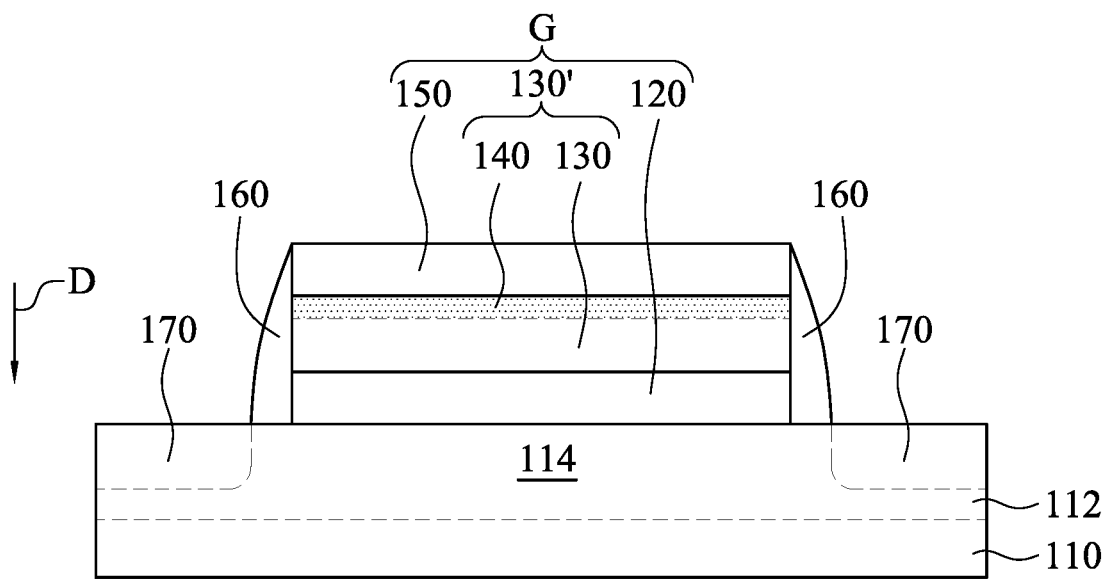

In operation S22 of method M10, source/drain structures 170 are formed in the substrate 110, as shown in FIG. 2F. In some embodiments, before forming the source/drain structures 170, a spacer structure 160 is formed on the substrate 110 and surrounds the gate stack G. The spacer structure 160 may include a seal spacer and a main spacer (not shown). The spacer structure 160 includes one or more dielectric materials, such as silicon oxide, silicon nitride, silicon oxynitride, SiCN, SiCxOyNz, or combinations thereof. The seal spacers are formed on sidewalls of the gate stack G and the main spacers are formed on the seal spacers. The spacer structure 160 can be formed using a deposition method, such as plasma enhanced chemical vapor deposition (PECVD), low-pressure chemical vapor deposition (LPCVD), sub-atmospheric chemical vapor deposition (SACVD), or the like. The formation of the spacer structure 160 may include blanket forming spacer layers and then performing etching operations to remove the horizontal portions of the spacer layers. The remaining vertical portions of the spacer layers form the spacer structure 160.

Then, an implantation process is performed in the substrate 110 to form the source/drain structures 170. In this process, the gate stack G and the spacer structure 160 are used as implant mask, such that the source/drain structures 170 are formed on opposite sides of the gate stack G. A portion of the well region 112 between the source/drain structures 170 and under the gate stack G is referred to as a channel 114. In some other embodiments, for straining effect or other performance enhancement, the source/drain structures 170 may be formed by epitaxy growth of different semiconductor materials. For example, the substrate 110 within the source/drain structures 170 is recessed by etching, and a semiconductor material is epitaxially grown on the recessed region with in-situ doping to form the source/drain structures 170.

The method M10 may also include other operations to form various features and components, such as other features for a negative capacitance FET. For examples, an interconnect structure is formed on the substrate 110 and configured to couple various devices into a functional circuit. The interconnection structure includes metal lines distributed in multiple metal layers; contacts to connect the metal lines to devices (such as sources, drains and gates); and vias to vertically connect metal lines in the adjacent metal layers. The formation of the interconnect structure includes damascene process or other suitable procedure. The metal components (metal lines, contacts and vias) may include copper, aluminum, tungsten, metal alloy, silicide, doped polysilicon, other suitable conductive materials, or combinations thereof.

In FIG. 2F, the gate stack G, the channel 114, and the source/drain structures 170 form a negative capacitance field effect transistor (NCFET). The gate stack G is a negative capacitance gate stack structure and includes the gate dielectric layer 120, the doped ferroelectric layer 130', and the gate electrode 150. The doped ferroelectric layer 130' is over the gate dielectric layer 120, the doped region 140 is in a top portion of the doped ferroelectric layer 130', and the gate electrode 150 is over the doped ferroelectric layer 130'. The gate electrode 150 is in contact with the doped region 140. Since the existence of the doped region 140, a dopant concentration of the doped ferroelectric layer 130' varies in a vertical direction (or the thickness direction of the doped ferroelectric layer 130' or a direction D from the gate electrode 150 toward the channel 114). In some embodiments, the thickness direction represents a direction normal to a top surface of the doped ferroelectric layer 130'. In FIG. 2F, the dopant concentration decreases in the vertical direction.

The NCFET in FIG. 2F has two capacitances $C_{MOS}$ and $C_{FE}$. The capacitance $C_{MOS}$ is from the equivalent capacitor of the gate dielectric layer 120 and the channel 114, and the capacitance $C_{FE}$ is from the equivalent capacitor of the doped ferroelectric layer 130' and the gate electrode 150. For an NCFET device, the sub-threshold swing (SS) is a factor to evaluate the performance of the FET device. SS represents the easiness of switching the transistor current off and on, and is a factor in determining the switching speed of the FET device. In order to achieve SS less than 60 mV/dec, one of the solutions is to increasing the voltage gain Av near the threshold voltage of the semiconductor device. When the capacitances $C_{MOS}$ and $C_{FE}$ have a good match, the voltage gain Av near the threshold voltage of the FET will be increased. In the embodiments of this context, the capacitance $C_{FE}$ can be tuned by forming a doped region 140 in the ferroelectric material layer 130. As such, the capacitance $C_{FE}$ can be matched to the capacitance $C_{MOS}$.

As mentioned above, the doping concentration of the doped region 140 may be in a range of about 1E12 $cm^{-2}$ to about 5E13 $cm^{-2}$. The doping concentration of the dopants depends on the shift degree of the capacitance $C_{FE}$, which will be explained in FIGS. 13A and 13B. If the doping concentration is higher than about 5E13 $cm^{-2}$, the capacitance $C_{FE}$ may be overshifted, and if the doping concentration is lower than about 1E12 $cm^{-2}$, the capacitance $C_{FE}$ may not be shifted enough. As such, the capacitances $C_{FE}$ and $C_{MOS}$ of the resulting semiconductor device may not be matched, and the voltage gain Av will not improved.

Figure 3A:
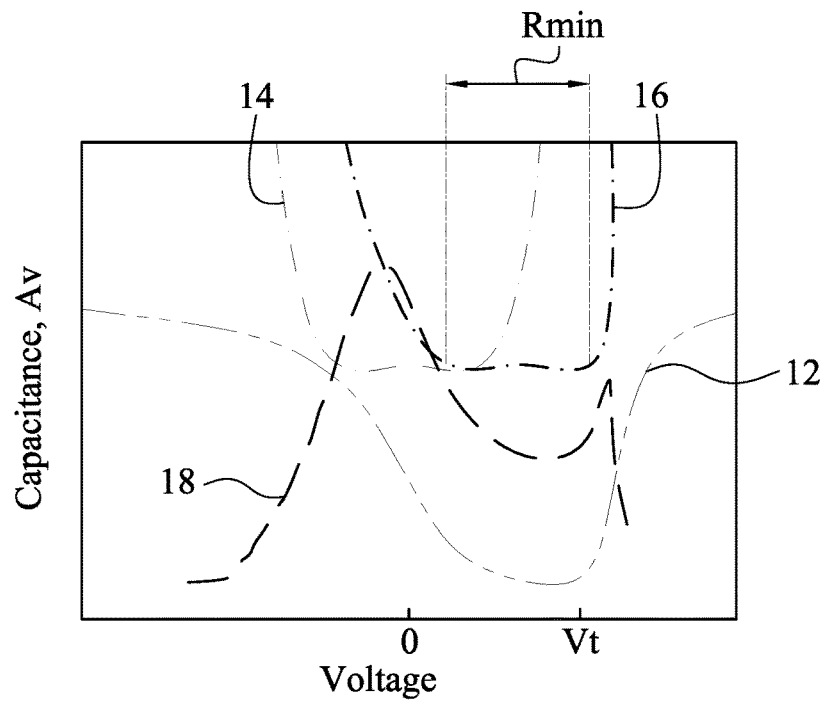
FIG. 3A illustrates the simulation results of comparing the performance of a P-type NCFET having the structure shown in FIG. 2F before and after forming the doping layer in the ferroelectric material layer.

In some embodiments, the semiconductor device is a P-type NCFET. That is, the channel 114 is P-type and the source/drain structures 170 are N-type. In this case, the dopants in the doped region 140 may be N-type (such as Boron, Gallium, Indium, or other suitable materials). That is, the doped region 140 and the source/drain structures 170 have the same conductivity type, and the doped region 140 and the channel 114 have different conductivity types. Further, the doped region 140 is negative charged, and an electric field directing upwardly is formed in the ferroelectric material layer 130. With such configuration, the capacitance $C_{FE}$ can be tuned to match the capacitance $C_{MOS}$. In greater detail, reference is made to FIGS. 2F and 3A, where FIG. 3A illustrates the simulation results of comparing the performance of a P-type NCFET having the structure shown in FIG. 2F before and after forming the doping layer in the ferroelectric material layer. The capacitances $C_{FE}$ and $C_{MOS}$ values and voltage gain Av value are illustrated as a function of voltage. Line 12 is obtained from the capacitance $C_{MOS}$, line 14 is obtained from the absolute value of the capacitance $C_{FE}$ without forming the doping layer, line 16 is obtained from the absolute value of the capacitance $C_{FE}$ with forming the doping layer, and line 18 is obtained from the voltage gain Av with forming the doping layer. In FIG. 3A, a threshold voltage Vt of the P-type NCFET is positive, and the capacitance $C_{FE}$ (line 14 and 16) has a minimum value region Rmin. By providing the negative charges (N-type dopants) in the top portion of the ferroelectric material layer 130, the curve of capacitance $C_{FE}$ shifts toward the positive direction of the voltage (line 16). The voltage gain Av increases near the threshold voltage Vt when the minimum value region Rmin is aligned with the threshold voltage Vt, i.e., the minimum value region Rmin overlaps the threshold voltage Vt), and the capacitances $C_{MOS}$ and $C_{FE}$ have a good match.

Figure 3B:
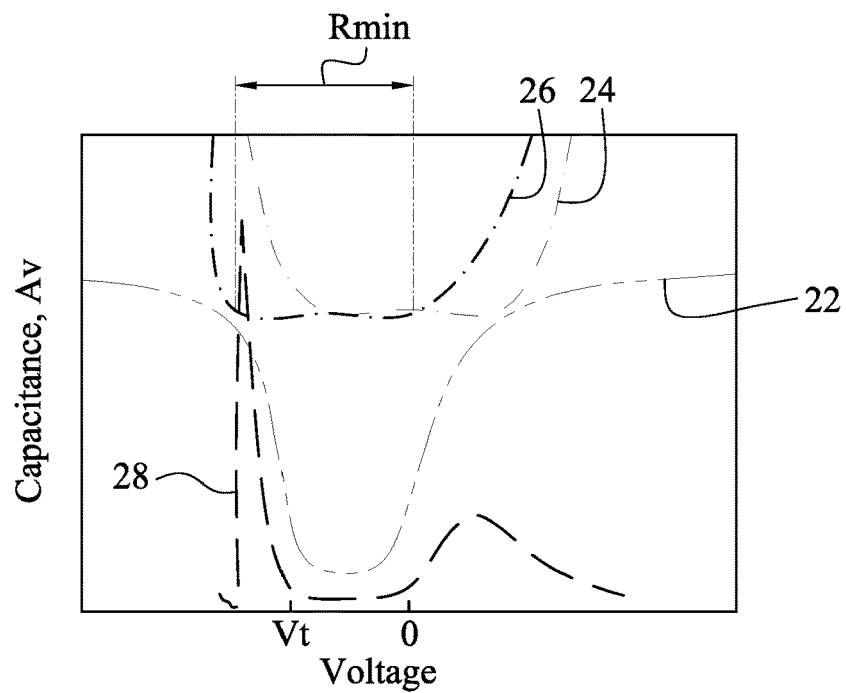
FIG. 3B illustrates the simulation results of comparing the performance of an N-type NCFET having the structure shown in FIG. 2F before and after forming the doping layer in the ferroelectric material layer.

In some other embodiments, the semiconductor device is an N-type NCFET. That is, the channel 114 is N-type and the source/drain structures 170 are P-type. In this case, the dopants in the doped region 140 may be P-type (such as Phosphorus, Arsenic, Antimony, Bismuth, Lithium, or other suitable materials). That is, the doped region 140 and the source/drain structures 170 have the same conductivity type, and the doped region 140 and the channel 114 have different conductivity types. Further, the doped region 140 is positive charged, and an electric field directing downwardly is formed in the ferroelectric material layer 130. With such configuration, the capacitance $C_{FE}$ can be tuned to match the capacitance $C_{MOS}$. In greater detail, reference is made to FIGS. 2F and 3B, where FIG. 3B illustrates the simulation results of comparing the performance of an N-type NCFET having the structure shown in FIG. 2F before and after forming the doping layer in the ferroelectric material layer. The capacitances $C_{FE}$ and $C_{MOS}$ values and voltage gain Av value are illustrated as a function of voltage. Line 22 is obtained from the capacitance $C_{MOS}$, line 24 is obtained from the absolute value of the capacitance $C_{FE}$ without forming the doping layer, line 26 is obtained from the absolute value of the capacitance $C_{FE}$ with forming the doping layer, and line 28 is obtained from the voltage gain Av with forming the doping layer. In FIG. 3B, a threshold voltage Vt of the NCFET is negative, and the capacitance $C_{FE}$ (lines 24 and 26) has a minimum value region Rmin. By providing the positive charges (P-type dopants) in the top portion of the ferroelectric material layer 130, the curve of capacitance $C_{FE}$ shifts toward the negative direction of the voltage (line 26). The voltage gain Av increases near the threshold voltage Vt when the minimum value region Rmin is aligned with the threshold voltage Vt, i.e., the minimum value region Rmin overlaps the threshold voltage Vt, and the capacitances $C_{MOS}$ and $C_{FE}$ have a good match.

Figure 4:
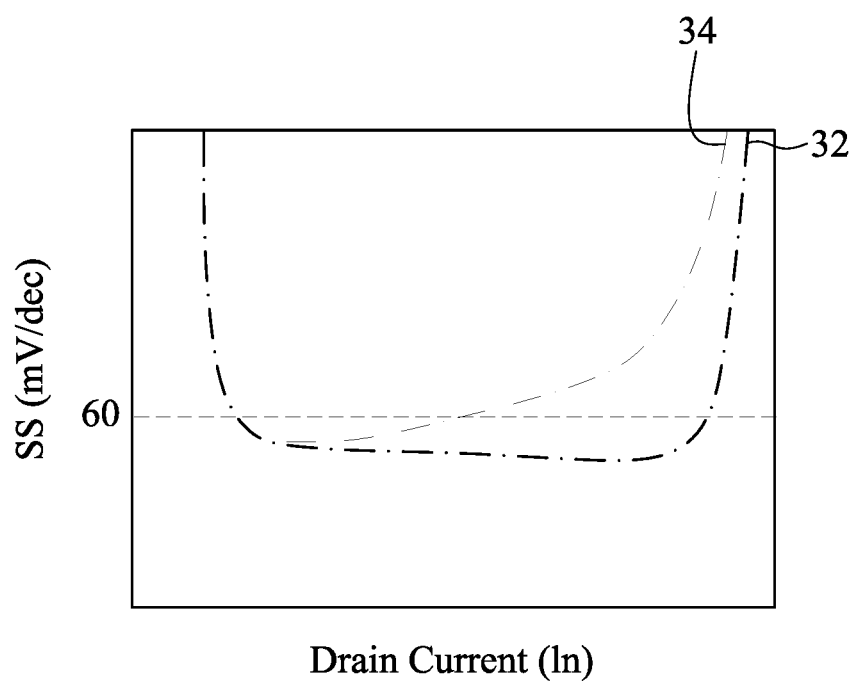
FIG. 4 illustrates the simulation results of comparing the performance of a P-type NCFET having the structure shown in FIG. 2F to the performance of a P-type NCFET without forming the doping layer in the ferroelectric material layer.

In the embodiments in FIGS. 3A and 3B, the SS of the NCFET can be less than 60 mV/dec. FIG. 4 illustrates the simulation results of comparing the performance of a P-type NCFET having the structure shown in FIG. 2F to the performance of a P-type NCFET without forming the doping layer in the ferroelectric material layer. The SS values are illustrated as a function of drain current (log scale). Line 32 is obtained from a P-type NCFET having the structure shown in FIG. 2F, and line 34 is obtained from a P-type NCFET having a structure similar to what is shown in FIG. 2F, except that the ferroelectric material layer is not doped. In FIG. 4, the SS curve is improved (less than 60 mV/dec) when the doped region is formed in the ferroelectric material layer.

Figure 5:
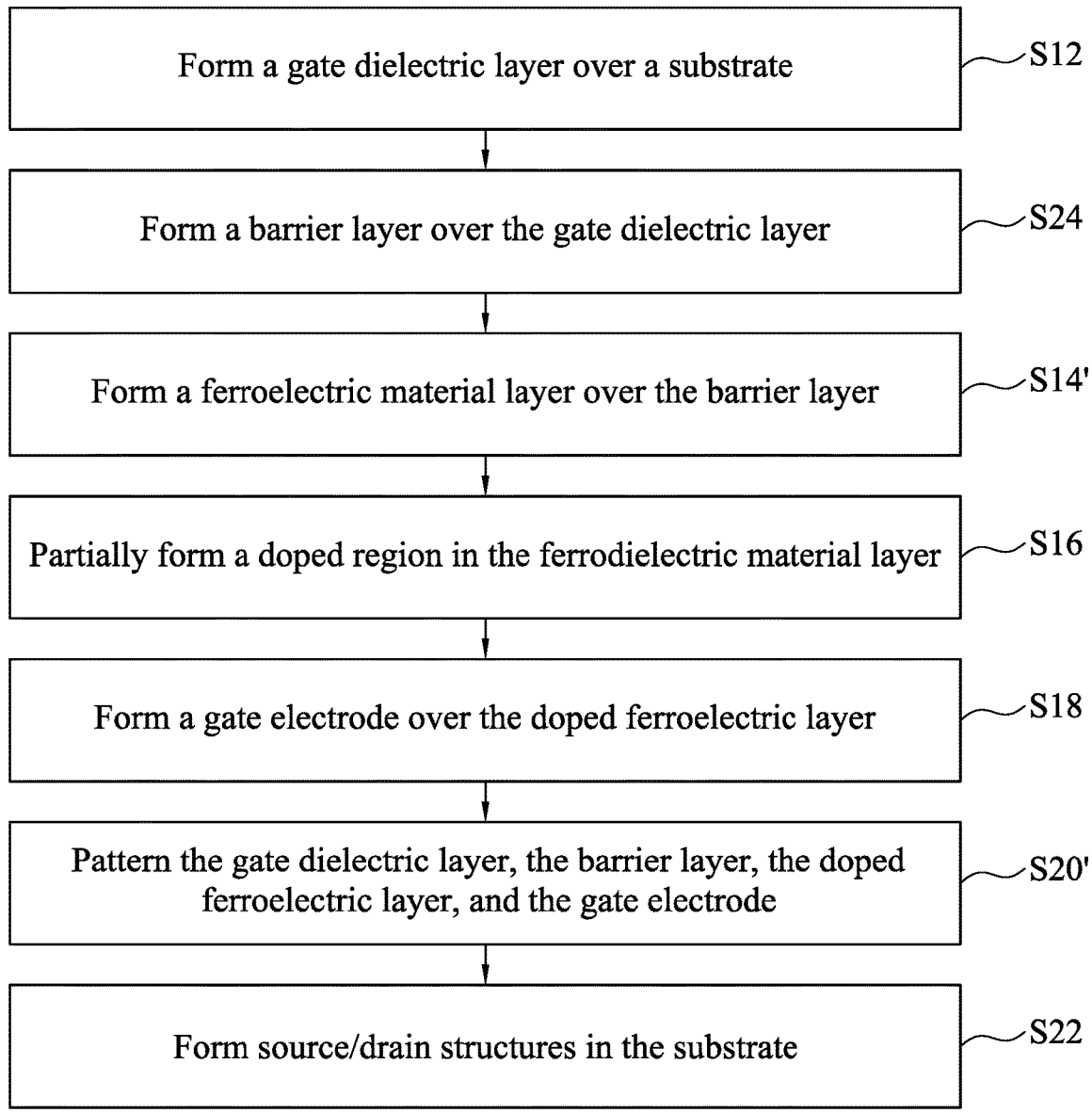
FIG. 5 is a flowchart of a method for making a semiconductor device according to aspects of the present disclosure in various embodiments.
Figure 6:
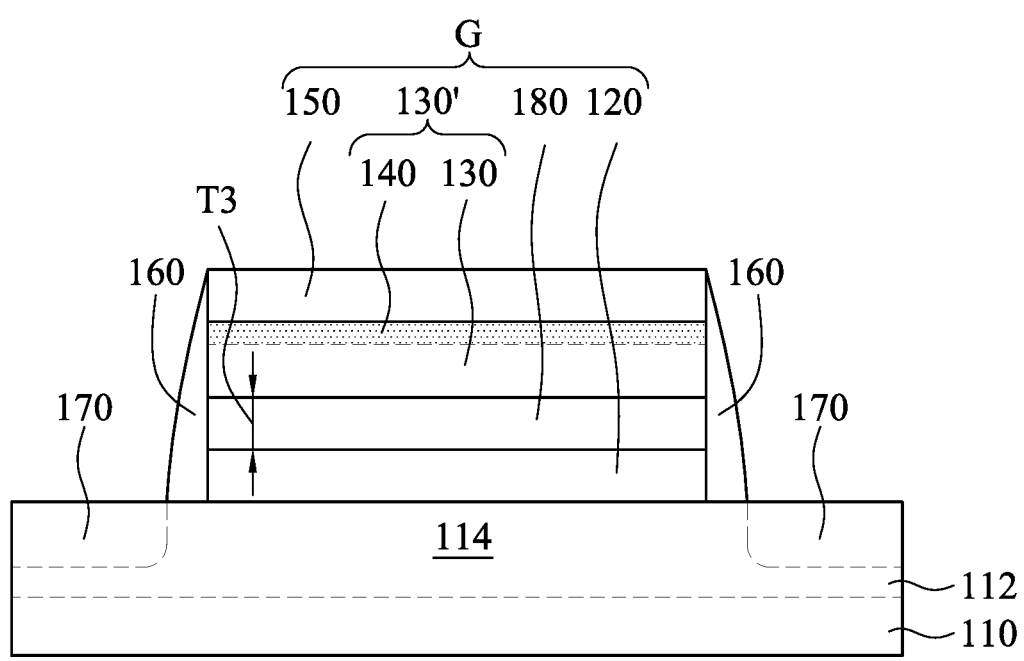
FIG. 6 is a cross-sectional view of the semiconductor device in FIG. 5 according to aspects of the present disclosure in various embodiments.

FIG. 5 is a flowchart of a method M10' for making a semiconductor device according to aspects of the present disclosure in various embodiments, and FIG. 6 is a cross-sectional view of the semiconductor device in FIG. 5 according to aspects of the present disclosure in various embodiments. Throughout the various views and illustrative embodiments, like reference numbers are used to designate like elements. The present embodiment may repeat reference numerals and/or letters used in FIGS. 2A-2F. This repetition is for the purpose of simplicity and clarity and does not in itself dictate a relationship between the various embodiments and/or configurations discussed. In the following embodiments, the structural and material details described before are not repeated hereinafter, and only further information is supplied to perform the semiconductor devices of FIG. 6.

The difference between the method M10' and M10 pertains to operation S24. In the method M10', the operation S24 may be performed between the operations S12 and S14 (S14'). Specifically, in the operation S24 of method M10', a barrier layer 180 is formed over the gate dielectric layer 120 before forming the ferroelectric material layer 130. The barrier layer 180 may be a metallic material such as Pt, Al, W, Ni, alloys thereof (such as aluminum copper alloy), or metal compound (such as titanium nitride or tantalum nitride). The barrier layer 180 may be used to shield the electric field formed in the ferroelectric layer 130 from the gate dielectric layer 120, such that the capacitance $C_{MOS}$ is not effected by the electric field (or the doped region 140). In some embodiments, the barrier layer 180 may have a thickness T3 in a range of about 3 nm to about 6 nm.

In operation S14' of method M10', a ferroelectric material layer 130 is formed over the barrier layer 180. In operation S16 of method M10', a doped region 140 is partially formed in the ferroelectric material layer 130. In operation S18 of method M10', a gate electrode 150 is formed over the doped ferroelectric layer 130'. In operation S20' of method M10', the gate dielectric layer 120, the barrier layer 180, the doped ferroelectric layer 130', and the gate electrode 150 are patterned to form a gate stack G. In operation S22 of method M10', source/drain structures 170 are formed in the substrate 110. Since the details of the operations S12, S14', S16, S18, S20', and S22 are similar to the operations S12, S14, S16, S18, S20, and S22 in the method M10 of FIG. 1, a description in this regard will not be repeated herein.

In FIG. 6, the gate stack G, the channel 114, and the source/drain structures 170 form a negative capacitance field effect transistor (NCFET). The gate stack G is a negative capacitance gate stack structure and includes the gate dielectric layer 120, the barrier layer 180, the doped ferroelectric layer 130', and the gate electrode 150. The barrier layer 180 is over the gate dielectric layer 120, the doped ferroelectric layer 130' is over the barrier layer 180, the doped region 140 is in a top portion of the doped ferroelectric layer 130', and the gate electrode 150 is over the ferroelectric material layer 130. The gate electrode 150 is in contact with the doped region 140, and the doped region 140 is spaced apart from the barrier layer 180. Since the existence of the doped region 140, a dopant concentration of the doped ferroelectric layer 130' varies in a vertical direction (or the thickness direction of the doped ferroelectric layer 130'). In FIG. 2F, the dopant concentration decreases in the vertical direction.

In some embodiments, the semiconductor device may be a P-type NCFET. That is, the channel 114 is P-type and the source/drain structures 170 are N-type. In this case, the dopants in the doped region 140 may be N-type (such as Boron, Gallium, Indium, or other suitable materials). That is, the doped region 140 is negative charged. In some other embodiments, the semiconductor device may be an N-type NCFET. That is, the channel 114 is N-type and the source/drain structures 170 are P-type. In this case, the dopants in the doped region 140 may be P-type (such as Phosphorus, Arsenic, Antimony, Bismuth, Lithium, or other suitable materials). That is, the doped region 140 is positive charged.

Figure 7:
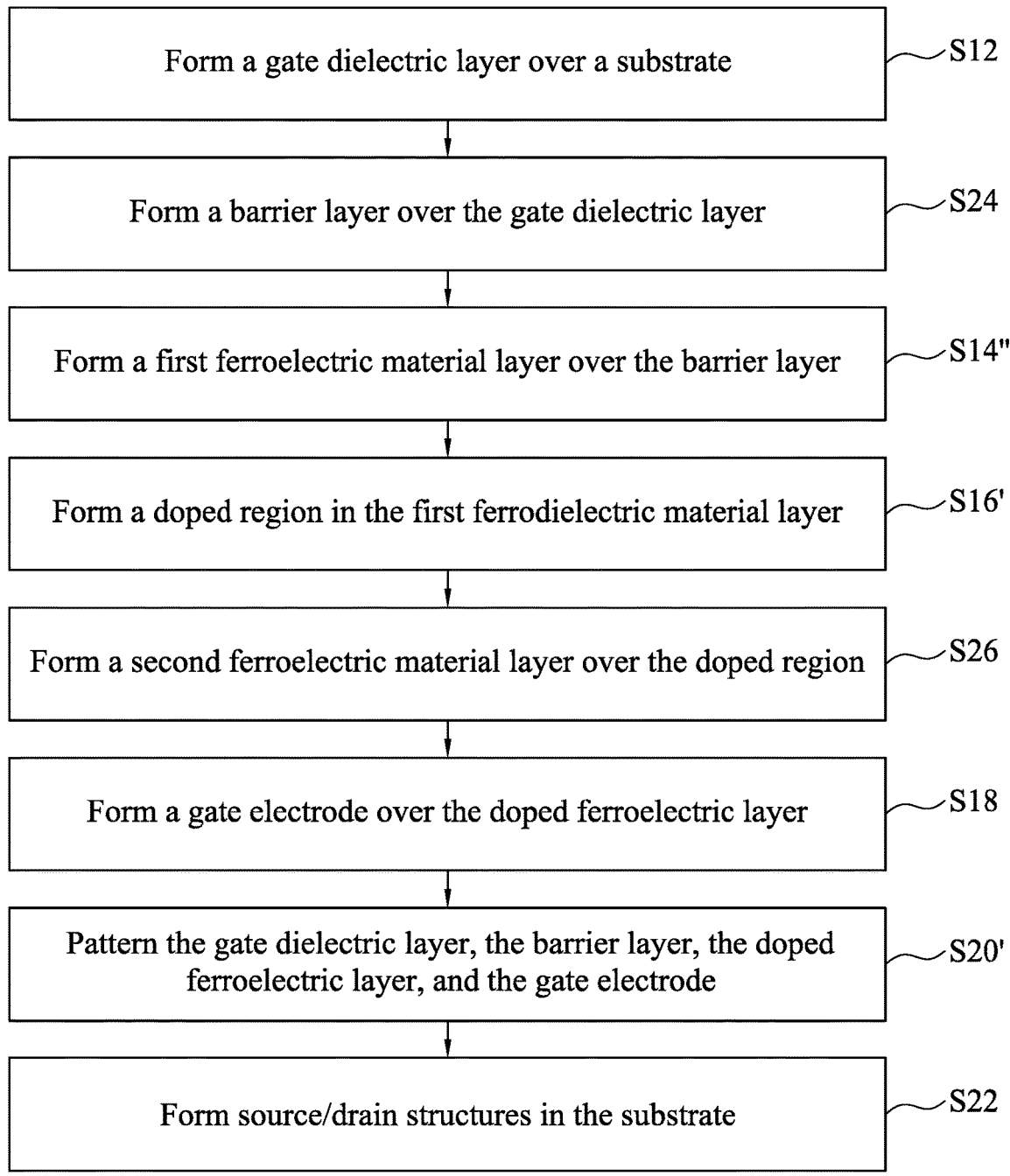
FIG. 7 is a flowchart of a method for making a semiconductor device according to aspects of the present disclosure in various embodiments.

FIG. 7 is a flowchart of a method M10" for making a semiconductor device according to aspects of the present disclosure in various embodiments. Various operations of the method M10" are discussed in association with perspective diagrams FIGS. 8A-8F. Throughout the various views and illustrative embodiments, like reference numbers are used to designate like elements. The present embodiment may repeat reference numerals and/or letters used in FIGS. 2A-2F and 6. This repetition is for the purpose of simplicity and clarity and does not in itself dictate a relationship between the various embodiments and/or configurations discussed. In the following embodiments, the structural and material details described before are not repeated hereinafter, and only further information is supplied to perform the semiconductor devices of FIGS. 8A-8F.

Figure 8A:
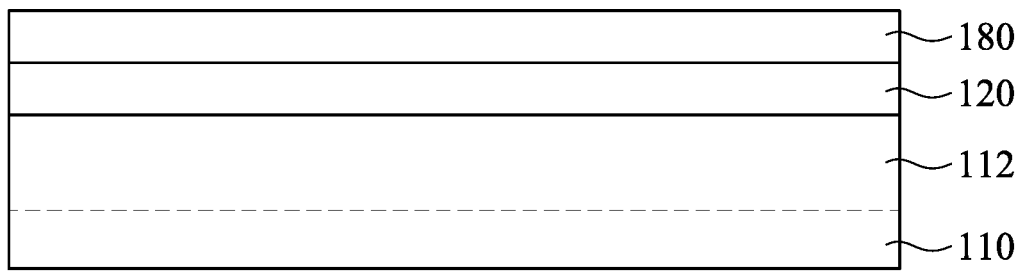
FIGS. 8A-8F are cross-sectional views of the method for making the semiconductor device at different stages according to aspects of the present disclosure in various embodiments.
Figure 8B:
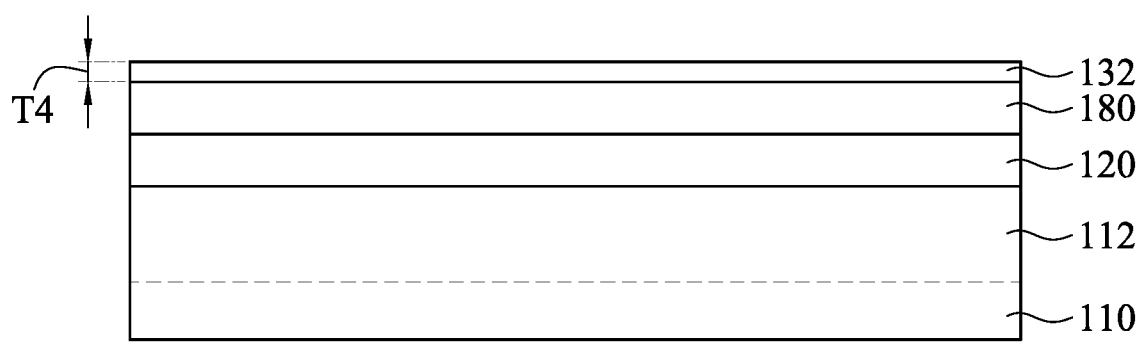

In operation S12 of method M10", a gate dielectric layer 120 is formed over a substrate 110, and in operation S24 of method M10", a barrier layer 180 is formed over the gate dielectric layer 120, as shown in FIG. 8A. In operation S14" of method M10", a first ferroelectric material layer 132 is formed over the barrier layer 180, as shown in FIG. 8B. The first ferroelectric material layer 132 may have the similar material and manufacturing methods to the ferroelectric material layer 130 in FIG. 2B, and a description in this regard will not be provided hereinafter. In some embodiments, the thickness T4 of first ferroelectric material layer 132 may be smaller than about 2 nm, and may be in the range between about 1 nm and about 2 nm.

Figure 8C:
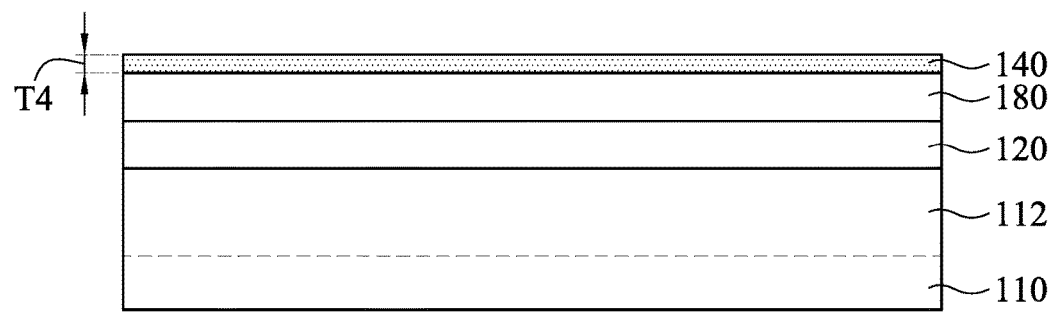

In operation S16' of method M10", a doped region 140 is formed in the first ferroelectric material layer 132, as shown in FIG. 8C. In some embodiments, the first ferroelectric material layer 132 is fully doped. That is, the doping depth of the doped region 140 is substantially the same as the thickness of the first ferroelectric material layer 132. As such, the doped region 140 has the thickness T4, and is in contact with the barrier layer 180.

Figure 8D:
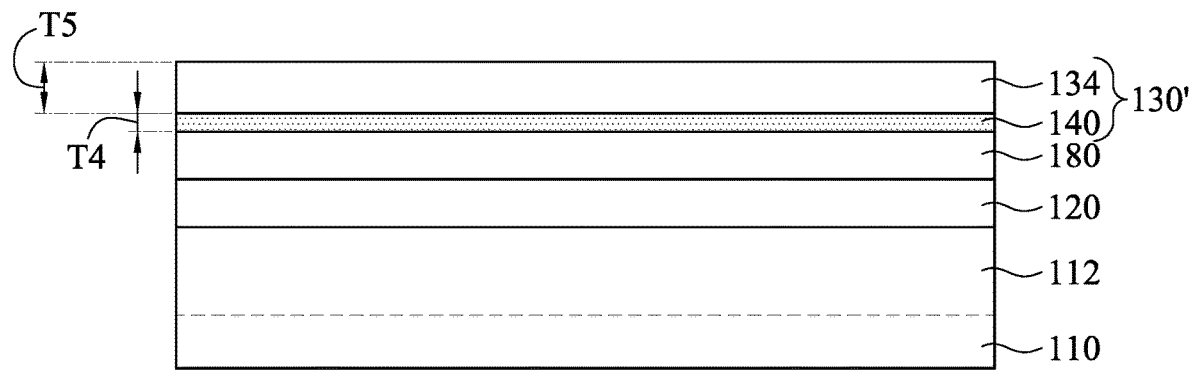

In operation S26 of method M10", a second ferroelectric material layer 134 is formed over the doped region 140, as shown in FIG. 8D. The second ferroelectric material layer 134 may have the similar material and manufacturing methods to the first ferroelectric material layer 132 in FIG. 8B, and a description in this regard will not be provided hereinafter. In some embodiments, the thickness T5 of the second ferroelectric material layer 134 may be smaller than about 10 nm, and may be in the range between about 1 nm and about 10 nm. Further, the thickness T5 is greater than the thickness T4. For example, the thickness T4 may be about 5% to about 15% of the thickness T5. In this regard, the doped region 140 and the second ferroelectric material layer 134 are together referred to as a doped ferroelectric layer 130'.

Figure 8E:
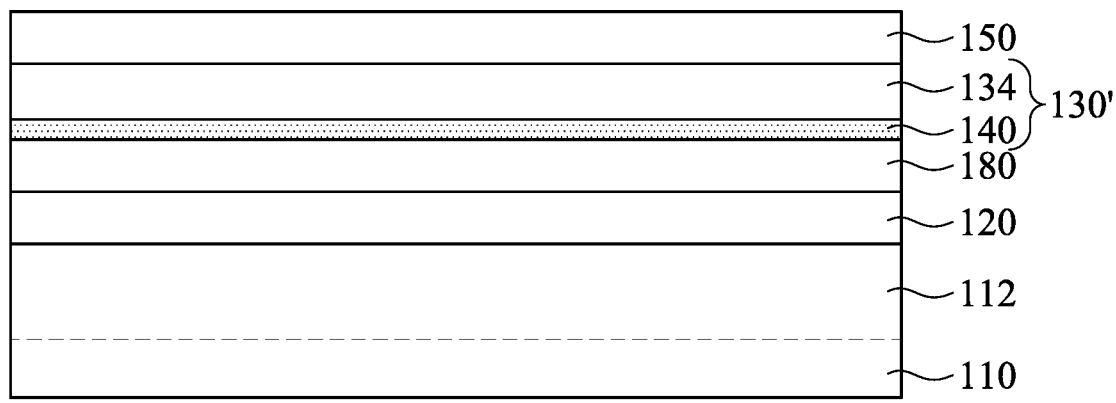
Figure 8F:
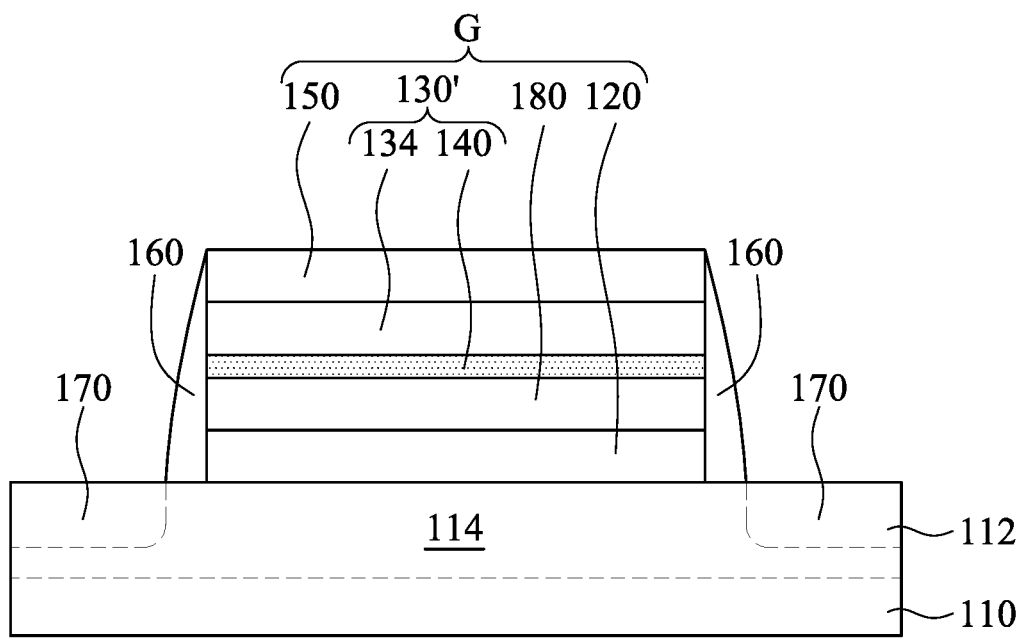

In operation S18 of method M10", a gate electrode 150 is formed over the doped ferroelectric layer 130', as shown in FIG. 8E. In operation S20' of method M10", the gate dielectric layer 120, the barrier layer 180, the doped ferroelectric layer 130', and the gate electrode 150 are patterned to form a gate stack G, and in operation S22 of method M10", source/drain structures 170 are formed in the substrate 110, as shown in FIG. 8F. Since the details of the operations S12, S24, S18, S20', and S22 are similar to the operations S12, S24, S18, S20, and S22 in the method M10 of FIGS. 1 and 5, a description in this regard will not be repeated herein.

In FIG. 8F, the gate stack G, the channel 114, and the source/drain structures 170 form a negative capacitance field effect transistor (NCFET). The gate stack G is a negative capacitance gate stack structure and includes the gate dielectric layer 120, the barrier layer 180, the doped ferroelectric layer 130', and the gate electrode 150. The barrier layer 180 is over the gate dielectric layer 120, the doped ferroelectric layer 130' is over the barrier layer 180, and the gate electrode 150 is over the doped ferroelectric layer 130'. The barrier layer 180 is in contact with the doped region 140 and is spaced apart from the gate electrode 150. In other words, the gate electrode 150 is in contact with the second ferroelectric material layer 134. Since the existence of the doped region 140, a dopant concentration of the doped ferroelectric layer 130' varies in a vertical direction (or the thickness direction of the doped ferroelectric layer 130'). In FIG. 8F, the dopant concentration increases in the vertical direction.

In FIG. 8F, the barrier layer 180 may be used to shield the electric field formed in the doped ferroelectric layer 130' from the gate dielectric layer 120, such that the capacitance $C_{MOS}$ is not effected by the electric field (or the doped region 140). In some embodiments, the semiconductor device is a P-type NCFET. That is, the channel 114 is P-type and the source/drain structures 170 are N-type. In this case, the dopants in the doped region 140 may be P-type (such as Phosphorus, Arsenic, Antimony, Bismuth, Lithium, or other suitable materials). That is, the doped region 140 and the channel 114 have the same conductivity type, and the doped region 140 and the source/drain structures 170 have different conductivity types. Further, the doped region 140 is positive charged. In some other embodiments, the semiconductor device is an N-type NCFET. That is, the channel 114 is N-type and the source/drain structures 170 are P-type. In this case, the dopants in the doped region 140 may be N-type (such as Boron, Gallium, Indium, or other suitable materials). That is, the doped region 140 and the channel 114 have the same conductivity type, and the doped region 140 and the source/drain structures 170 have different conductivity types. Further, the doped region 140 is negative charged.

Figure 9:
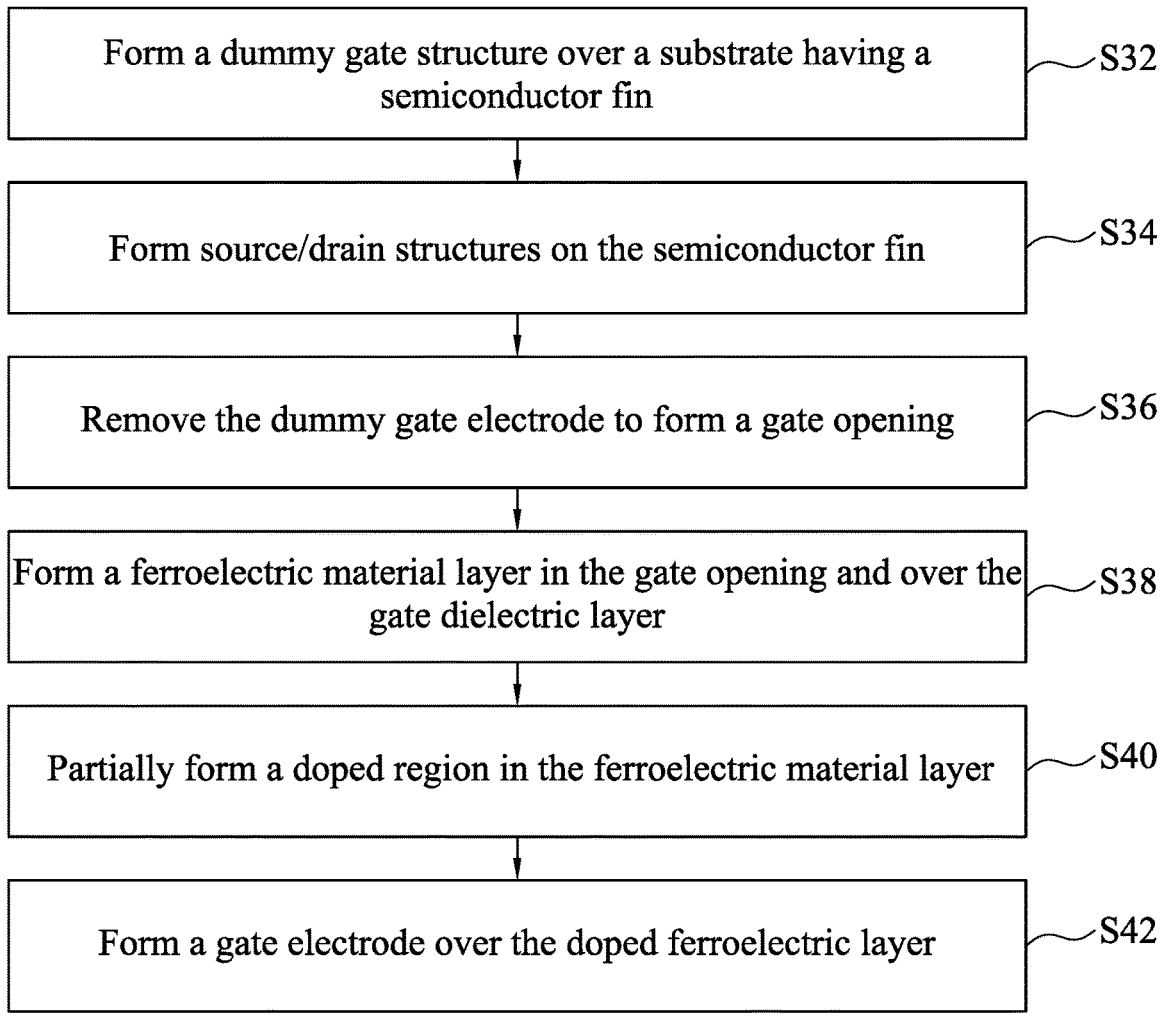
FIG. 9 is a flowchart of a method for making a semiconductor device according to aspects of the present disclosure in various embodiments.

FIG. 9 is a flowchart of a method M30 for making a semiconductor device according to aspects of the present disclosure in various embodiments. Various operations of the method M30 are discussed in association with perspective diagrams FIGS. 10A-15C. In the following embodiments, the structural and material details described before are not repeated hereinafter, and only further information is supplied to perform the semiconductor devices of FIGS. 10A-15C. FIGS. 10A, 11A, 12A, 13A, 14A, and 15A are perspective views of the method M30 for manufacturing a semiconductor device at various stages in accordance with some embodiments of the present disclosure, FIGS. 10B, 11B, 12B, 13B, 14B, and 15B are cross-sectional view respectively taking along line B-B of FIGS. 10A, 11A, 12A, 13A, 14A, and 15A, and FIGS. 13C, 14C, and 15C are cross-sectional view respectively taking along line C-C of FIGS. 13A, 14A and 15A.

Figure 10A:
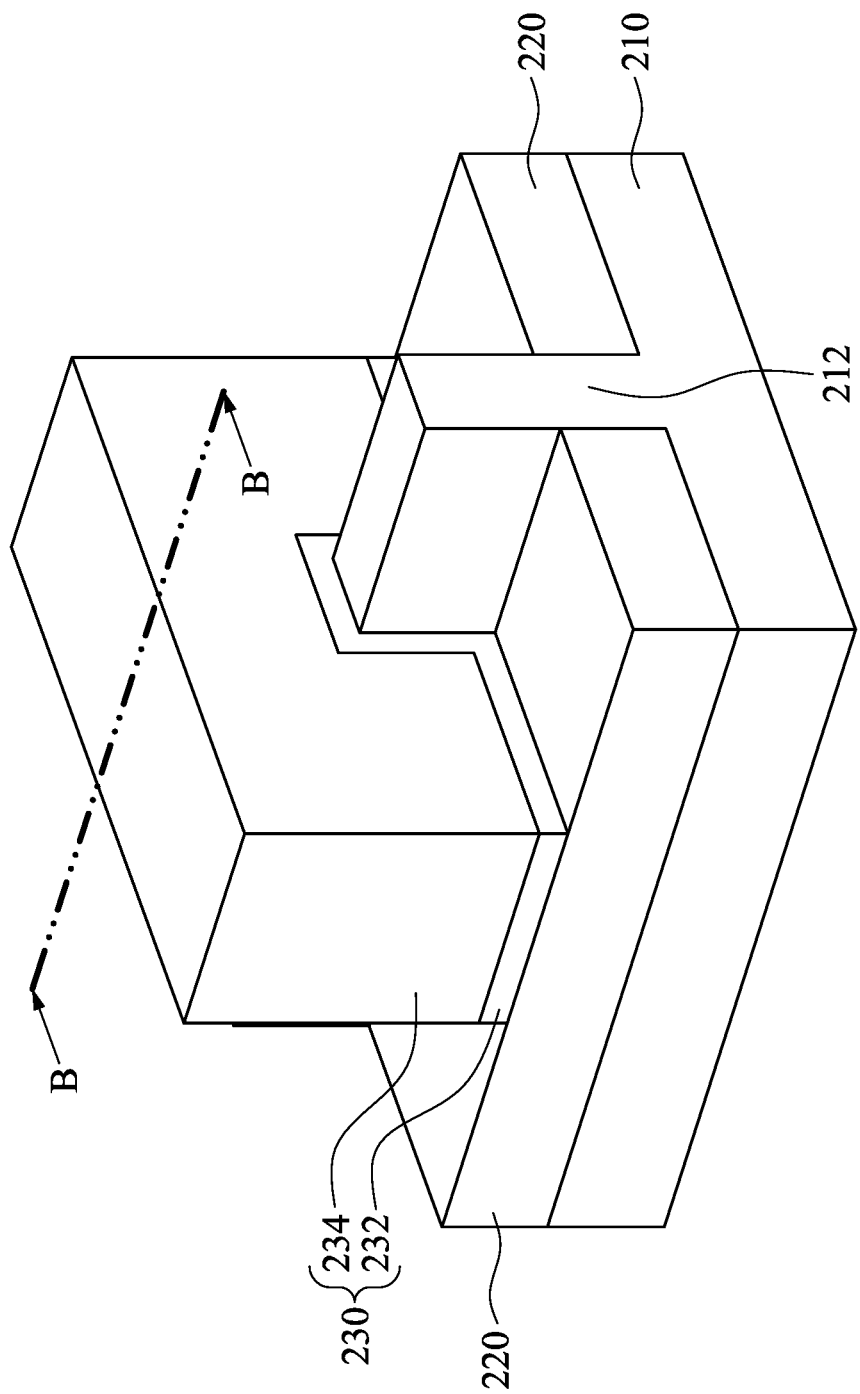
FIGS. 10A, 11A, 12A, 13A, 14A, and 15A are perspective views of the method for manufacturing a semiconductor device at various stages in accordance with some embodiments of the present disclosure.
Figure 10B:
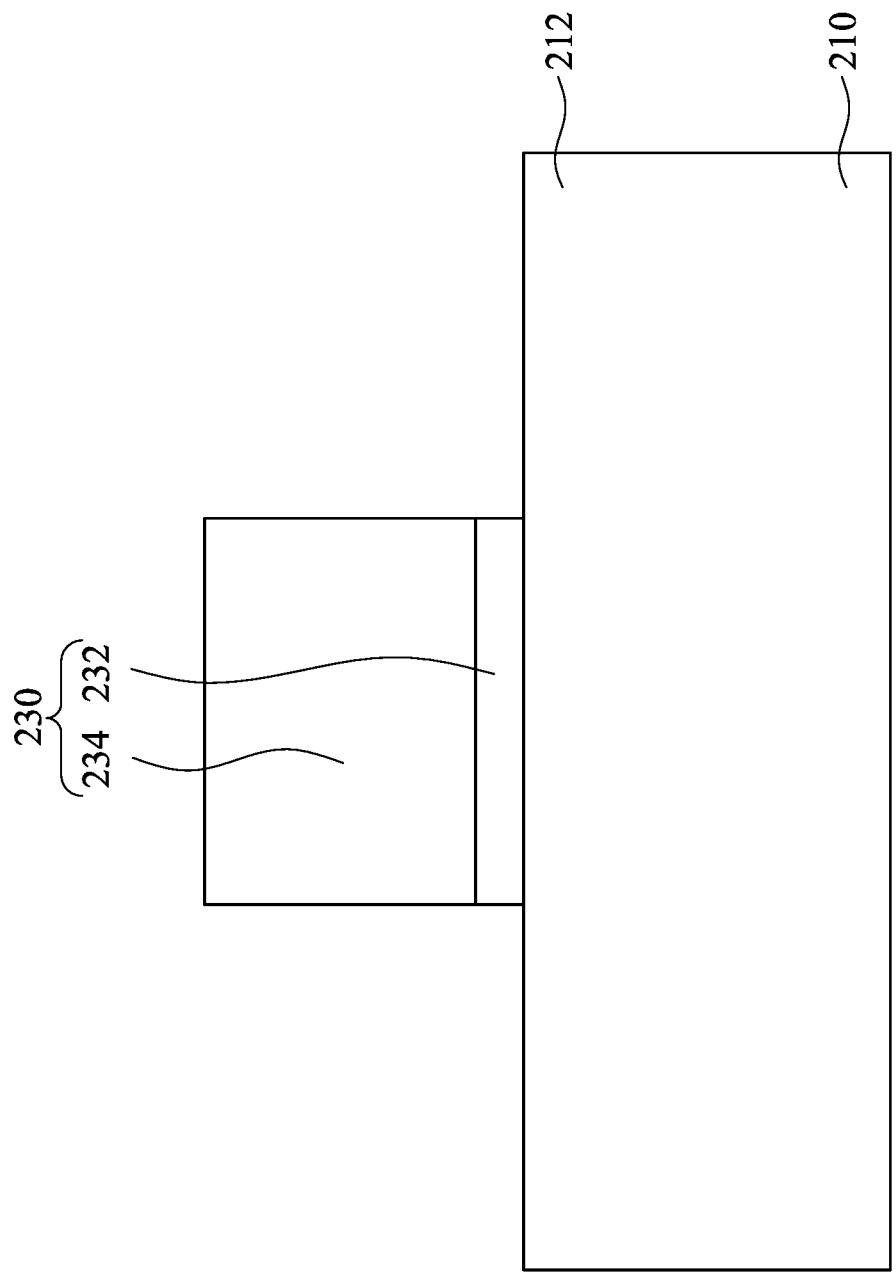
FIGS. 10B, 11B, 12B, 13B, 14B, and 15B are cross-sectional view respectively taking along line B-B of FIGS. 10A, 11A, 12A, 13A, 14A, and 15A.

In operation S32 of method M30, a dummy gate structure 230 is formed over a substrate 210 having a semiconductor fin 212, as shown in FIGS. 10A and 10B. Specifically, a substrate 210 is provided. Since the substrate 210 has the similar materials and manufacturing methods to the substrate 110 of FIG. 2A, a description in this regard will not be provided hereinafter. The substrate 210 further includes at least one semiconductor fin 212 protruded from the substrate 210. The semiconductor fin 212 serves as source/drain features of a transistor. It is note that the numbers of the semiconductor fin 212 in FIGS. 10A and 10B are illustrative, and should not limit the present disclosure. The semiconductor fin 212 may be formed, for example, by patterning and etching the substrate 210 using photolithography techniques. In some embodiments, a layer of photoresist material (not shown) is deposited over the substrate 210. The layer of photoresist material is irradiated (exposed) in accordance with a desired pattern (the semiconductor fin 212 in this case) and developed to remove a portion of the photoresist material. The remaining photoresist material protects the underlying material from subsequent processing steps, such as etching. It should be noted that other masks, such as an oxide or silicon nitride mask, may also be used in the etching process.

In some other embodiments, the semiconductor fin 212 may be epitaxially grown. For example, exposed portions of an underlying material, such as an exposed portion of the substrate 210, may be used in an epitaxial process to form the semiconductor fin 212. A mask may be used to control the shape of the semiconductor fin 212 during the epitaxial growth process.

A plurality of isolation features 220, such as shallow trench isolation (STI), are formed in the substrate 210 to separate various devices. The formation of the isolation features 220 may include etching a trench in the substrate 210 and filling the trench by insulator materials such as silicon oxide, silicon nitride, or silicon oxynitride. The filled trench may have a multi-layer structure such as a thermal oxide liner layer with silicon nitride filling the trench. In some embodiments, the isolation features 220 may be created using a process sequence such as: growing a pad oxide, forming a low pressure chemical vapor deposition (LPCVD) nitride layer, patterning an STI opening using photoresist and masking, etching a trench in the substrate 210, optionally growing a thermal oxide trench liner to improve the trench interface, filling the trench with CVD oxide, and using chemical mechanical planarization (CMP) to remove the excessive dielectric layers.

In FIGS. 10A and 10B, a dummy gate structure 230 including a gate dielectric layer 232 and a dummy gate electrode 234 is formed on the substrate 210. In some embodiments, in order to form the dummy gate structure 230, a gate dielectric film is formed on the substrate 210, followed by a gate electrode layer. The gate dielectric film and the gate electrode layer are then patterned, forming the gate dielectric layer 232 and the dummy gate electrode 234. In some embodiments, hard masks may be formed on the dummy gate structure 230 for process reasons, wherein the hard masks may include silicon nitride. In some embodiments, the gate dielectric layer 232 may has similar material to the gate dielectric layer in FIG. 2A, and a description in this regard will not be provided hereinafter. The dummy gate electrode 234 can be made of polycrystalline-silicon (poly-Si), poly-crystalline silicon-germanium (poly-SiGe), or other suitable materials.

Figure 11A:
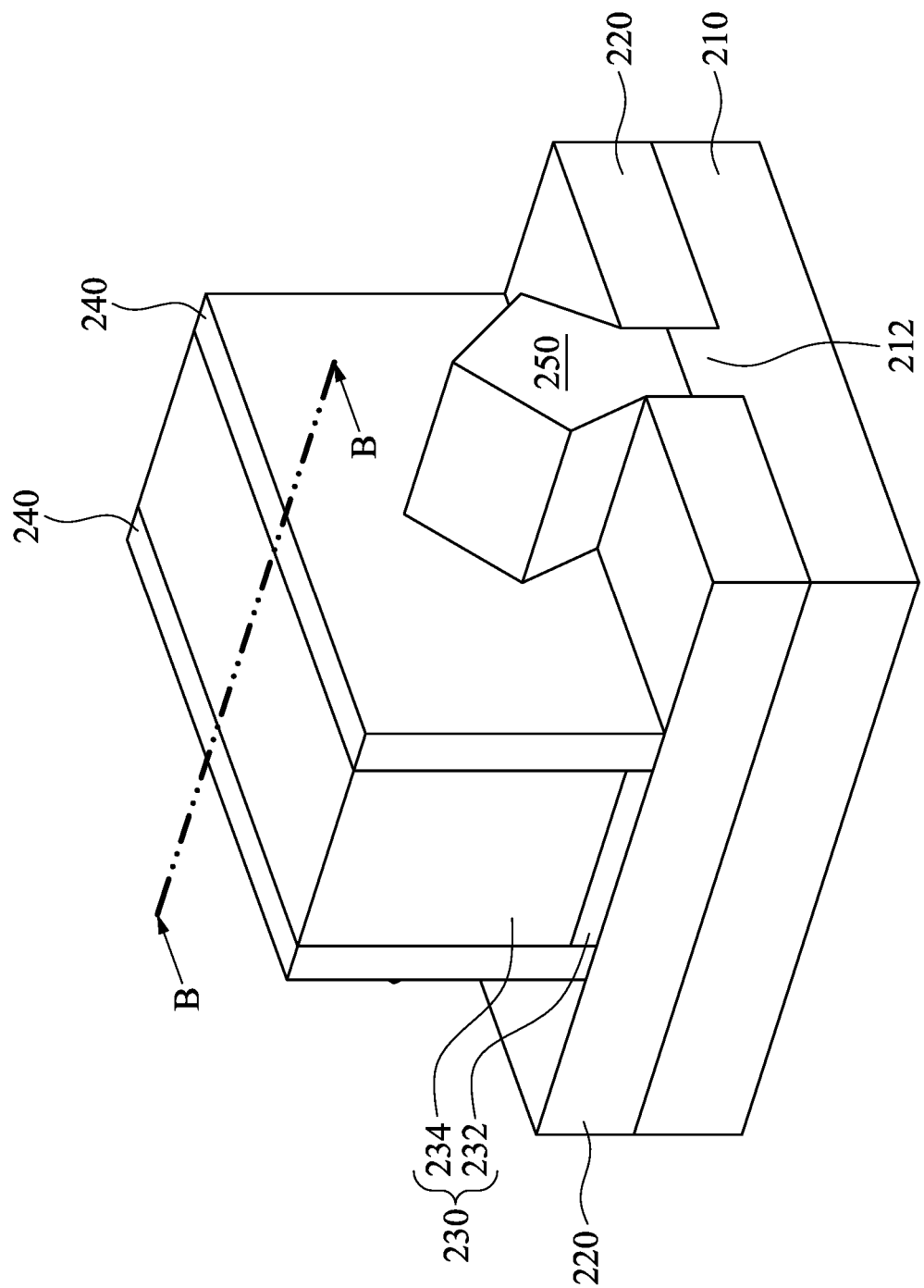
Figure 11B:
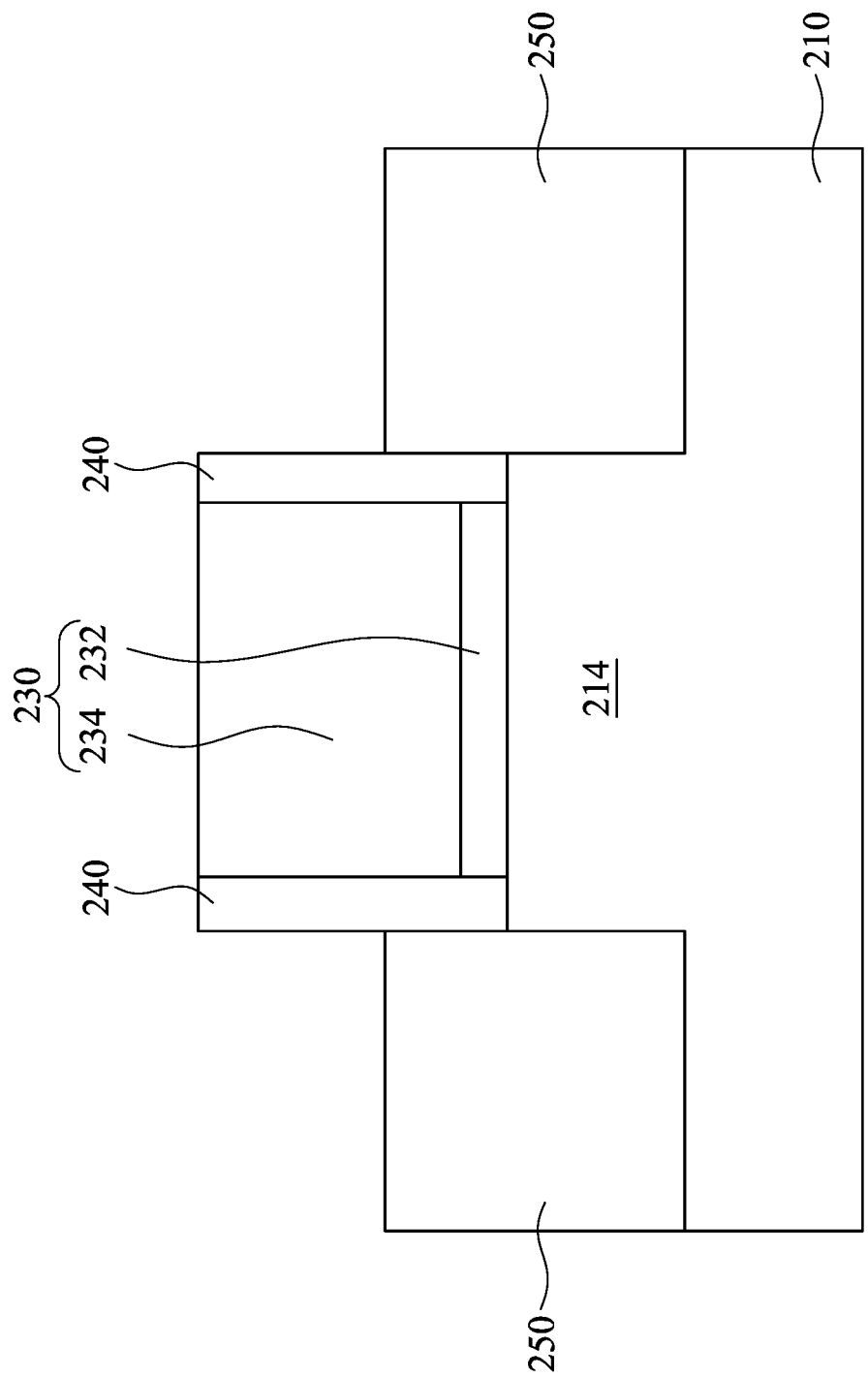

In operation S34 of method M30, source/drain structures 250 are formed on the semiconductor fin 212, as shown in FIGS. 11A and 11B. Specifically, a spacer structure 240 is formed on sidewalls of the dummy gate structure 230, and the spacer structure 240 surrounds the dummy gate structure 230. Since the spacer structure 240 has the similar materials and manufacturing methods to the spacer structure 160 of FIG. 2F, a description in this regard will not be provided hereinafter. Then, source/drain structures 250 are formed at least on the semiconductor fin 212 and adjacent to the dummy gate structure 230 and the spacer structure 240. In some embodiments, the source/drain structures 250 are formed by performing an implantation process. The dummy gate structure 230 and the spacer structure 240 are used as implant mask, such that the source/drain structures 250 are formed on opposite sides of the dummy gate structure 230. In some other embodiments, for straining effect or other performance enhancement, the source/drain structures 250 may be formed by epitaxy growth of different semiconductor materials, as shown in FIGS. 11A and 11B. For example, the semiconductor fin 212 is recessed by etching, and a semiconductor material is epitaxially grown on the recessed region with in-situ doping to form the source/drain structures 250. In FIG. 11B, a portion of the semiconductor fin 212 between two source/drain structures 250 is referred to as a channel 214 of the transistor.

Figure 12A:
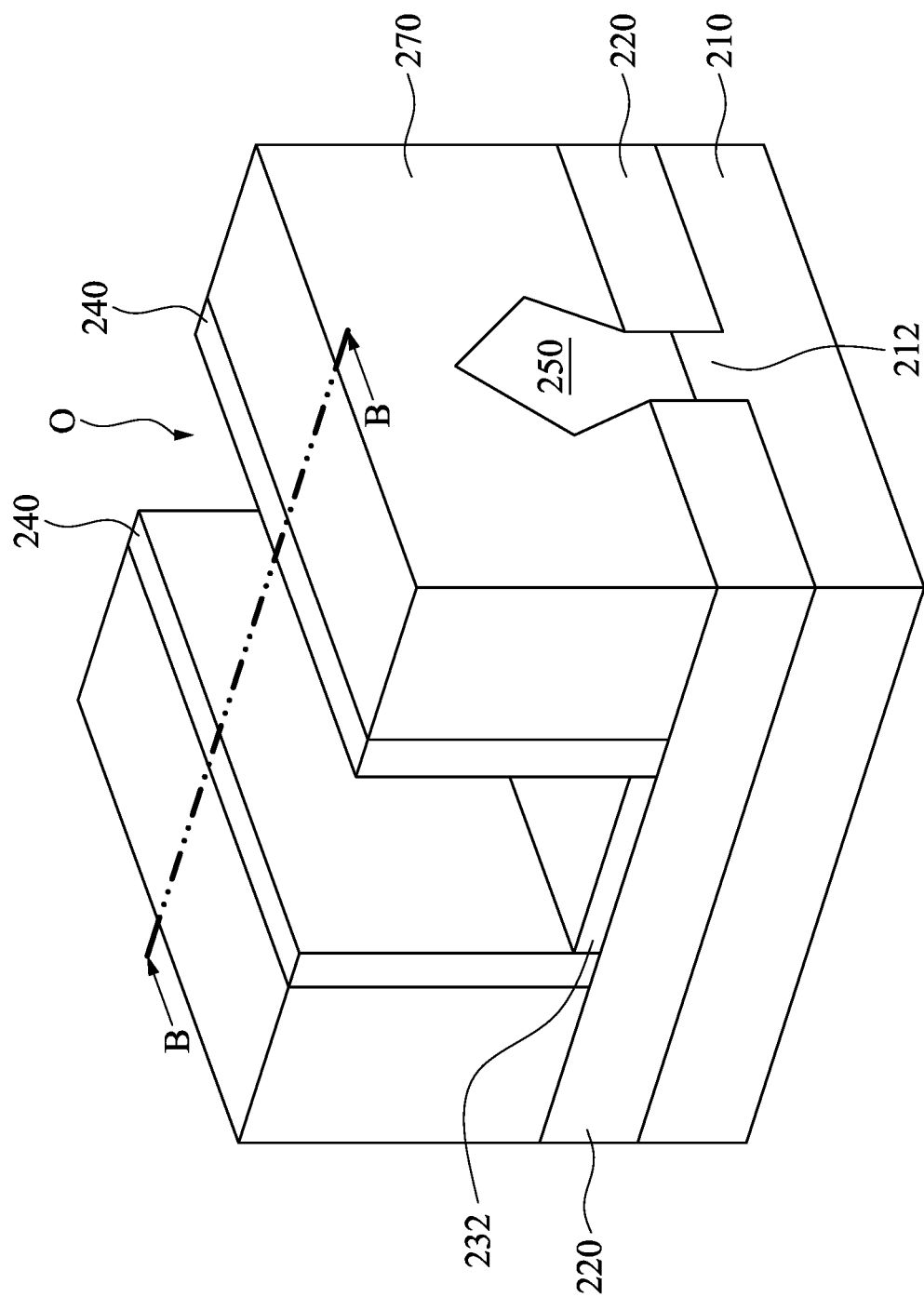
Figure 12B:
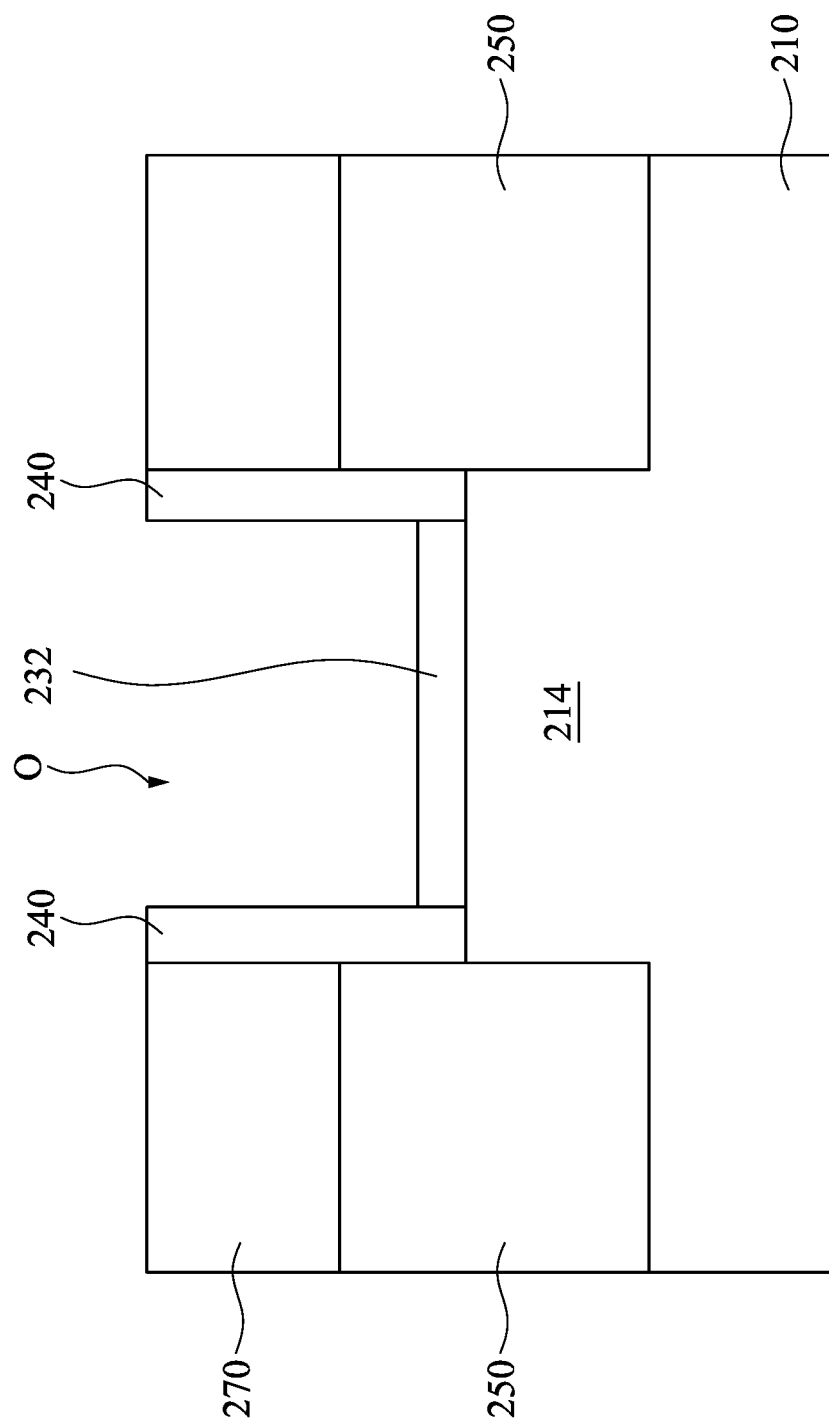

In operation S36 of method M30, the dummy gate electrode 234 is removed to form a gate opening O, as shown in FIGS. 12A and 12B. Specifically, a dielectric layer 270 is formed to cover the structure of FIGS. 11A and 11B. The dielectric layer 270 may be formed by chemical vapor deposition (CVD), high-density plasma CVD, spin-on, sputtering, or other suitable methods. In some embodiments, the dielectric layer 270 may include a contact etch stop layer (CESL) conformally covering the structure of FIGS. 11A and 11B and an interlayer dielectric (ILD) over the CESL, and may include silicon oxide, silicon oxy-nitride, silicon nitride, or a low-k material.

Then, a replacement gate (RPG) process scheme is employed. In a RPG process scheme, a dummy polysilicon gate (the dummy gate electrode 234 in this case) is formed in advance and is replaced later by a metal gate after high thermal budget processes are performed. In some embodiments, the dummy gate electrode 234 (see FIGS. 11A and 11B) is removed to form the gate opening O with the spacer structure 240 as its sidewall. The dummy gate electrode 234 may be removed by dry etch, wet etch, or a combination of dry and wet etch.

Figure 13A:
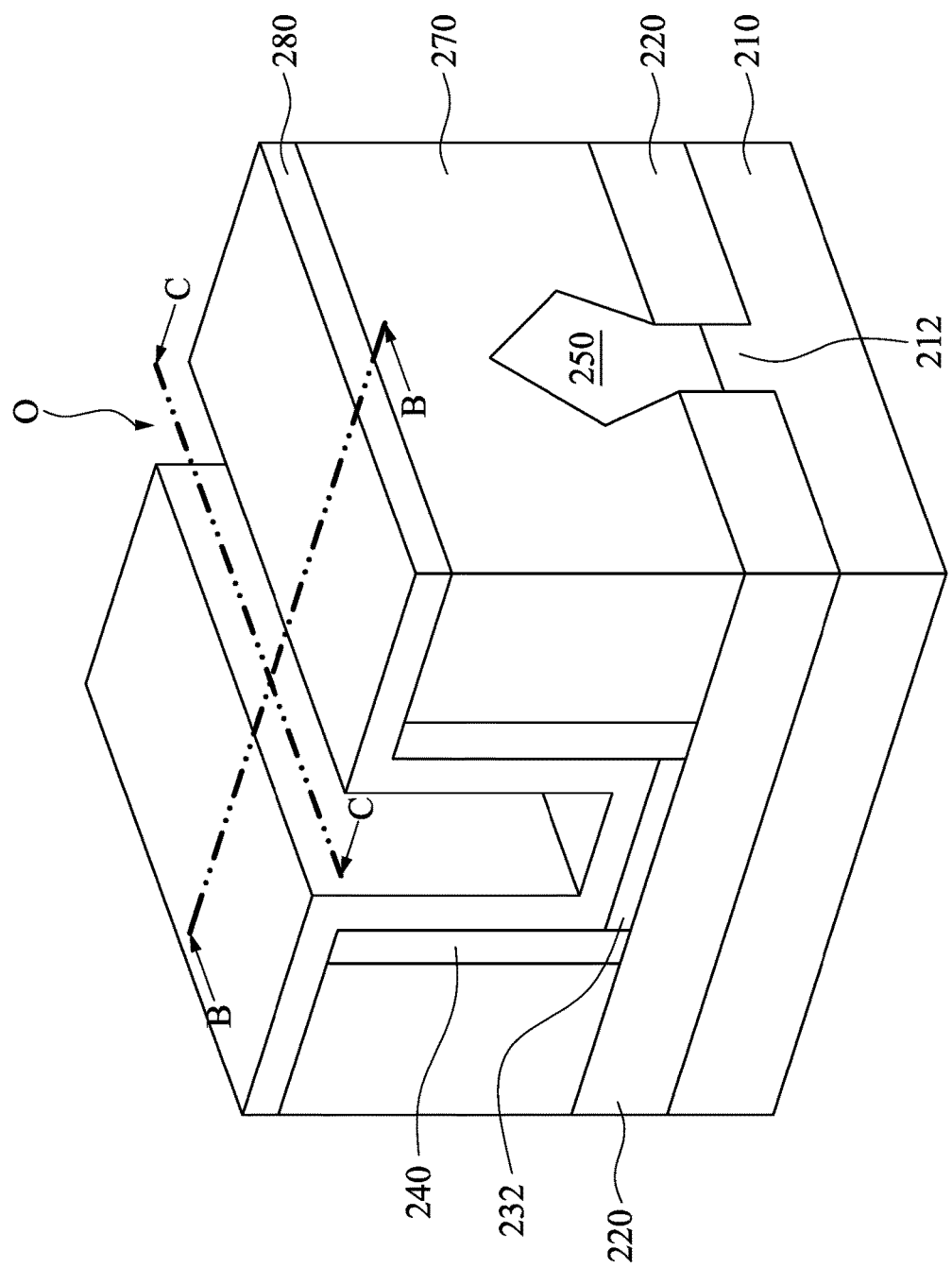
Figure 13B:
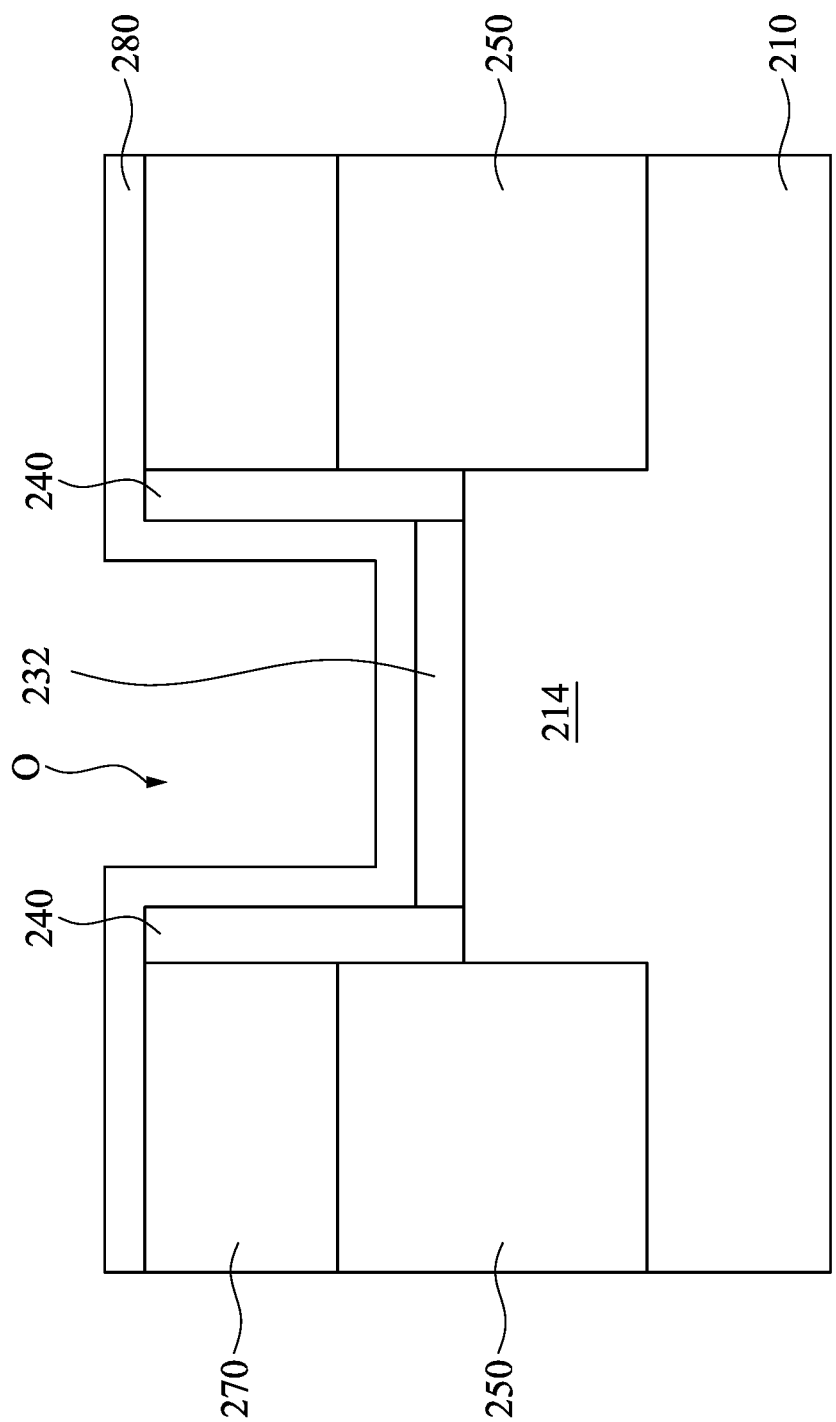
Figure 13C:
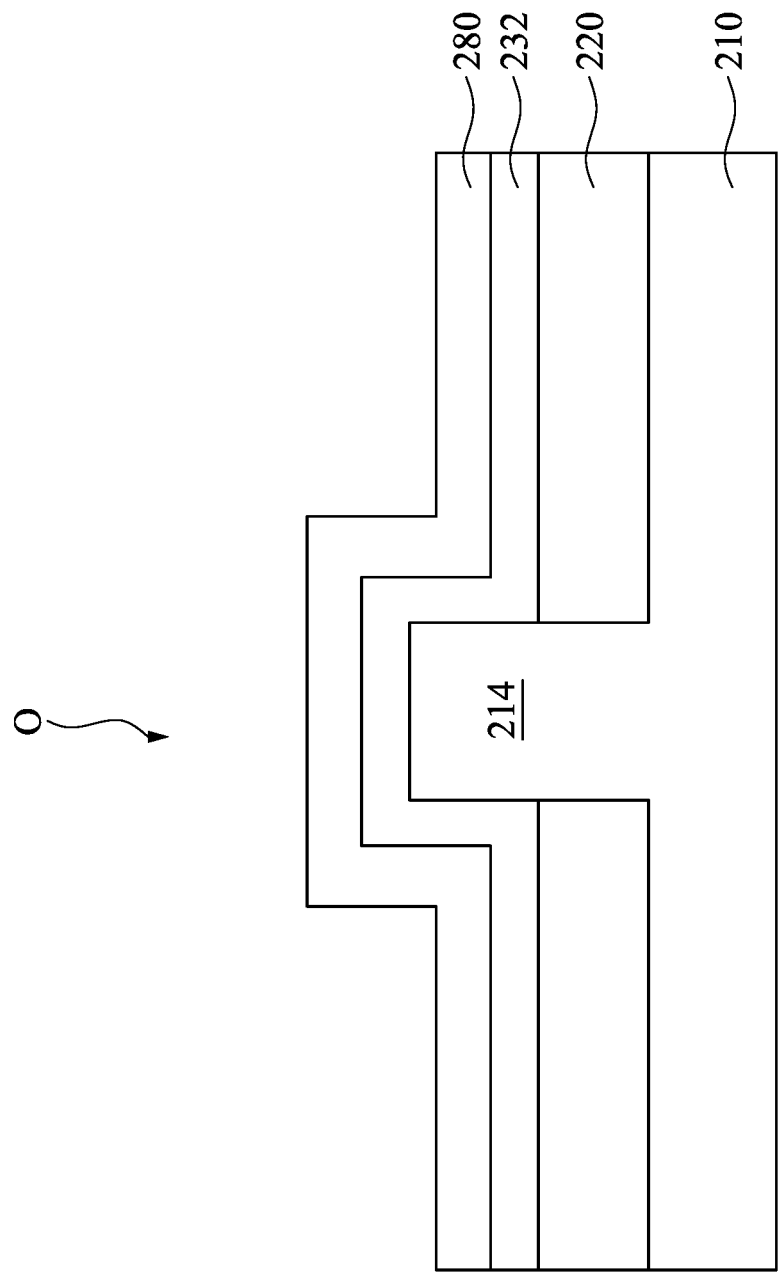
FIGS. 13C, 14C, and 15C are cross-sectional view respectively taking along line C-C of FIGS. 13A, 14A and 15A.

In operation S38 of method M30, a ferroelectric material layer 280 is formed in the gate opening O and over the gate dielectric layer 232, as shown in FIGS. 13A, 13B, and 13C. Since the ferroelectric material layer 280 has the similar materials and manufacturing methods to the ferroelectric material layer 130 of FIG. 2B, a description in this regard will not be provided hereinafter. In FIG. 13B, the ferroelectric material layer 280 is conformally formed in the gate opening O and on the dielectric layer 270, and the ferroelectric material layer 280 is in contact with the gate dielectric layer 232 and the spacer structure 240.

Figure 14A:
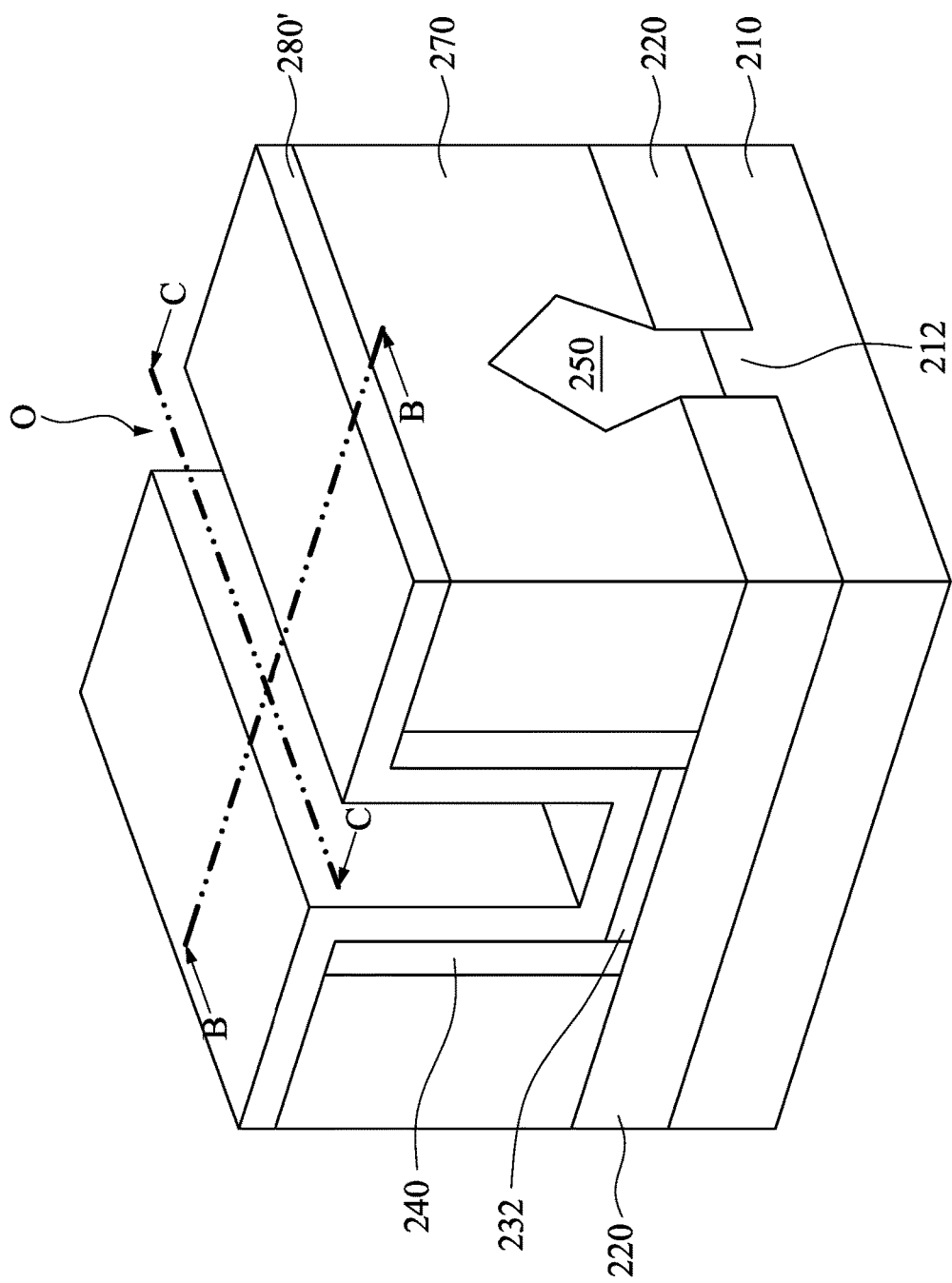
Figure 14B:
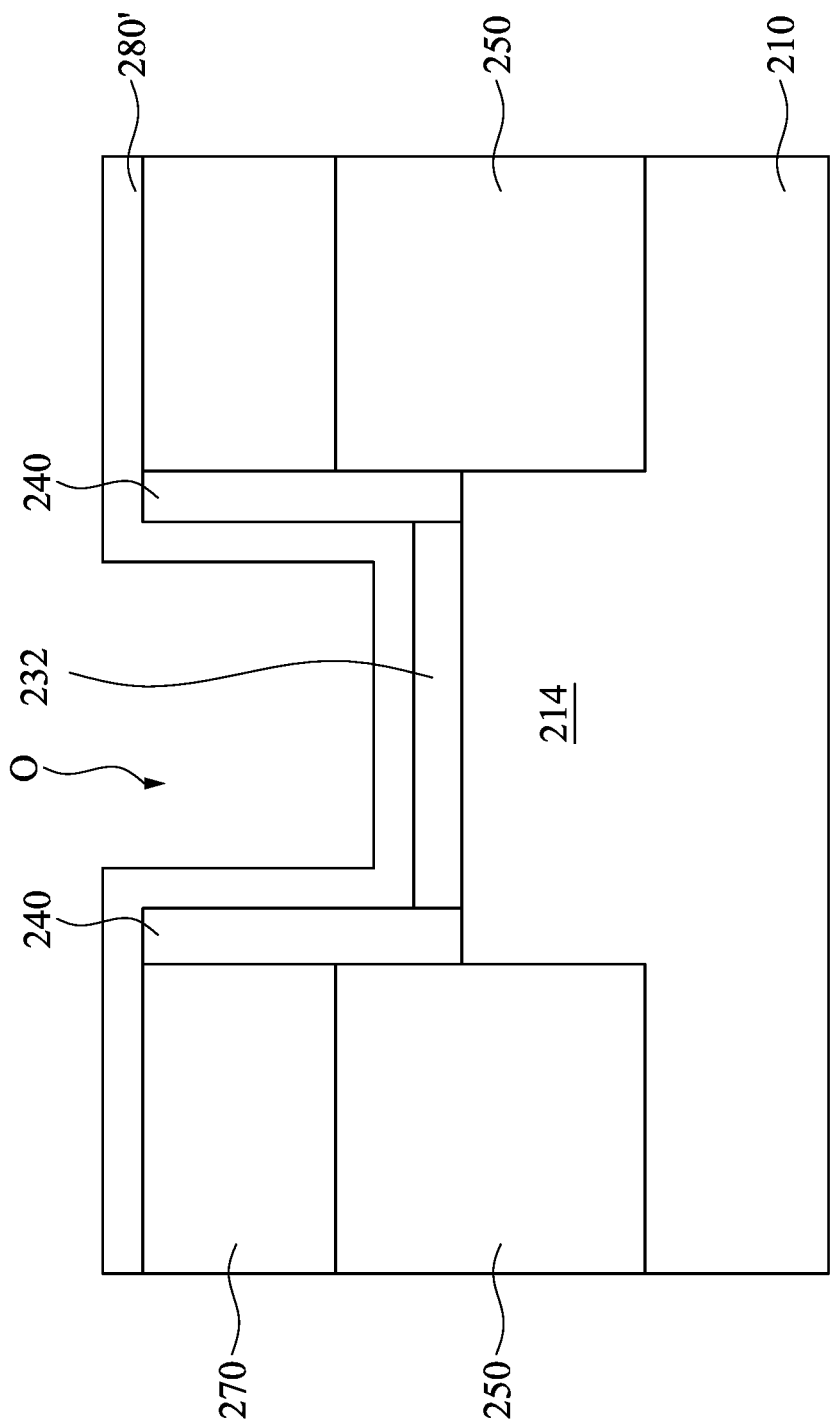
Figure 14C:
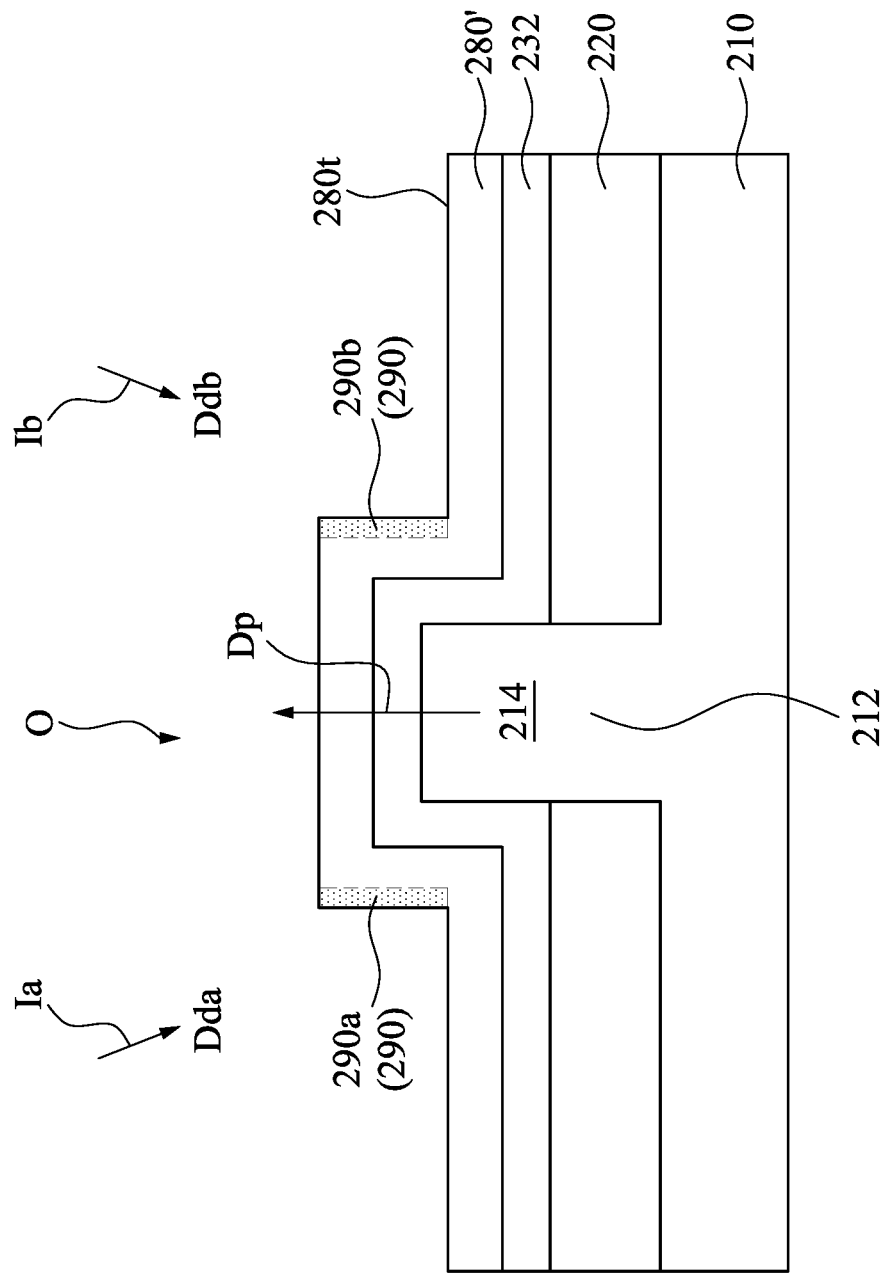

In operation S40 of method M30, at least one doped region is partially formed in the ferroelectric material layer 280, as shown in FIGS. 14A, 14B, and 14C. For example, at least one ion implantation process (or ion bombardment process) is performed on the ferroelectric material layer 280. P-type dopants such as Phosphorus, Arsenic, Antimony, Bismuth, and/or Lithium, or N-type dopants such as Boron, Gallium, and/or Indium may be implanted into the ferroelectric material layer 280. In some embodiments, the ion implantation process may include oblique ion implantation processes Ia and Ib. The ion implantation processes Ia and Ib have predetermined downward directions Dda and Ddb oblique to a protruding direction Dp of the semiconductor fin 212. A tilt angle between the directions Dda (Ddb) and Dp is greater than about 0 degree and less than about 90 degrees. The tilt angle is constrained by fin height and fin pitch associated with smaller technology nodes, such that portions of the ferroelectric material layer 280 on sides of the semiconductor fin 212 has a greater dopant concentration than another portions of the ferroelectric material layer 280 over the semiconductor fin 212. The ion implantation processes Ia is performed on the top surface 280t of the ferroelectric material layer 280 to form the doped region 290a, which is formed along a sidewall of the semiconductor fin 212. Further, the ion implantation processes Ib is performed on the top surface 280t of the ferroelectric material layer 280 to form the doped region 290b, which is formed along another sidewall of the semiconductor fin 212. In some embodiments, the doped regions 290a and 290b extend to above the top surface of the semiconductor fin 212, and may be connected to each other. The oblique ion implantation process increases the area of the doped regions 290a and 290b around the channel 214/semiconductor fin 212. The doped regions 290a and 290b and the (undoped) ferroelectric material layer 280 are together referred to as a doped ferroelectric layer 280'.

Figure 15A:
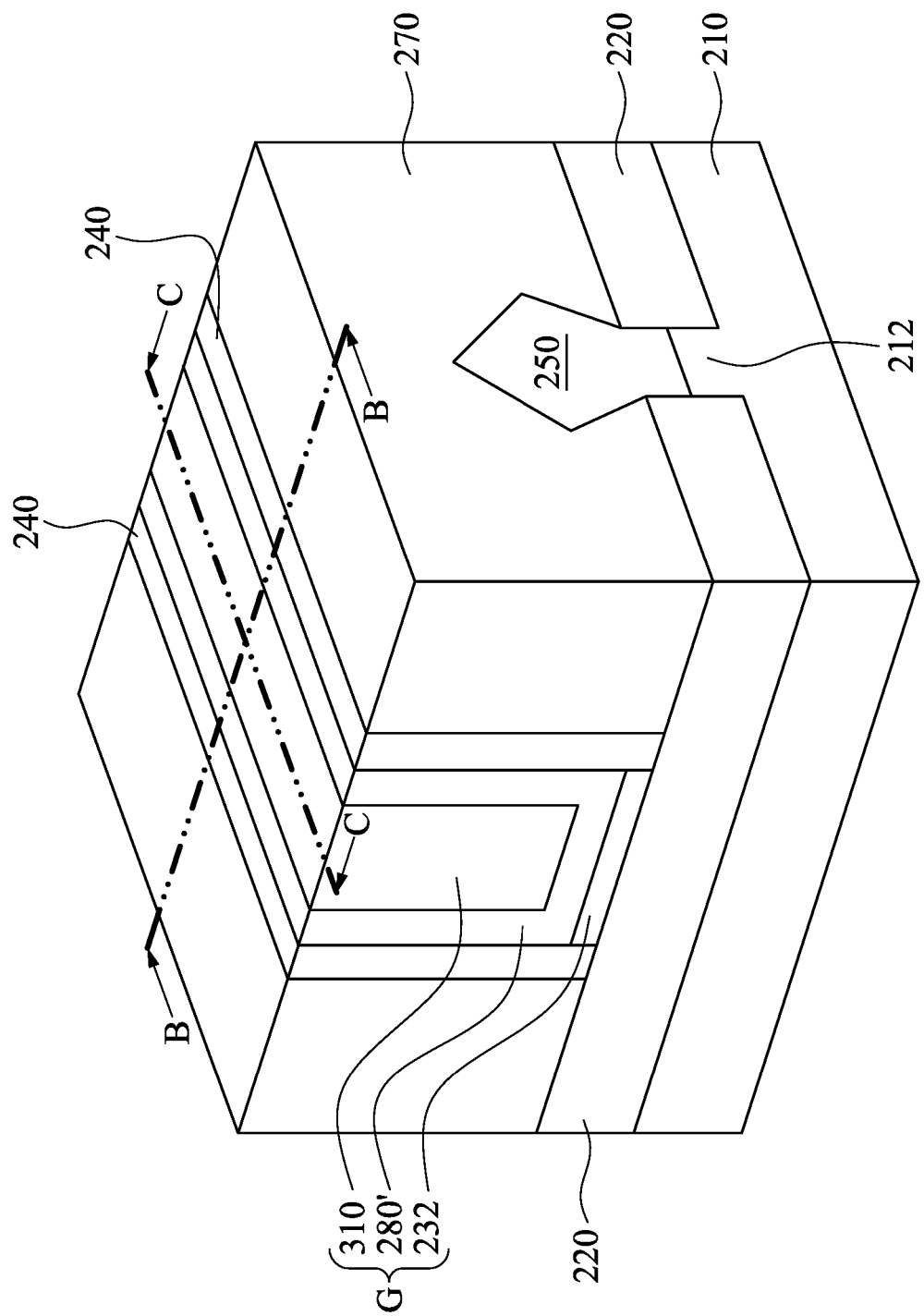
Figure 15B:
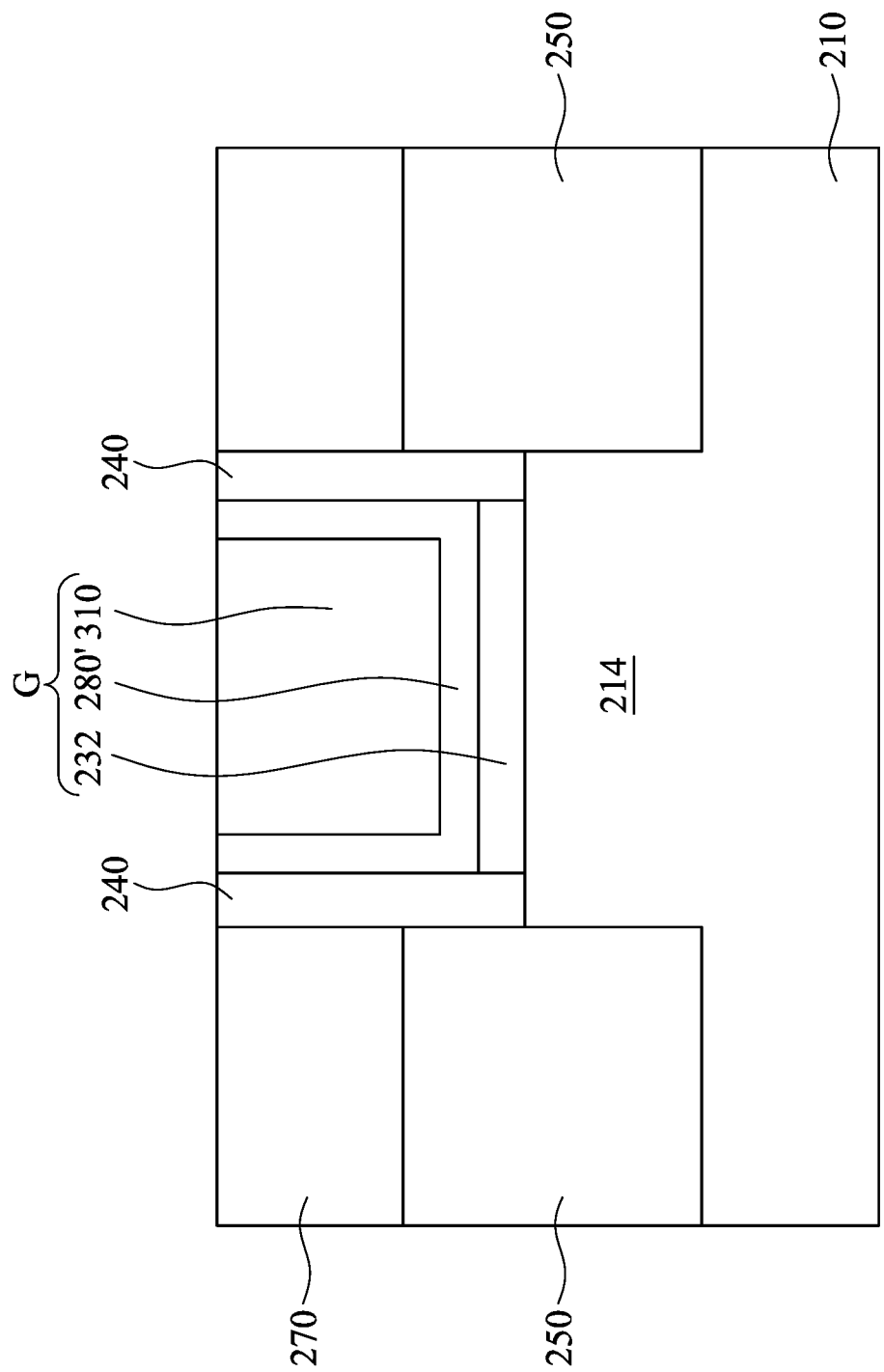
Figure 15C:
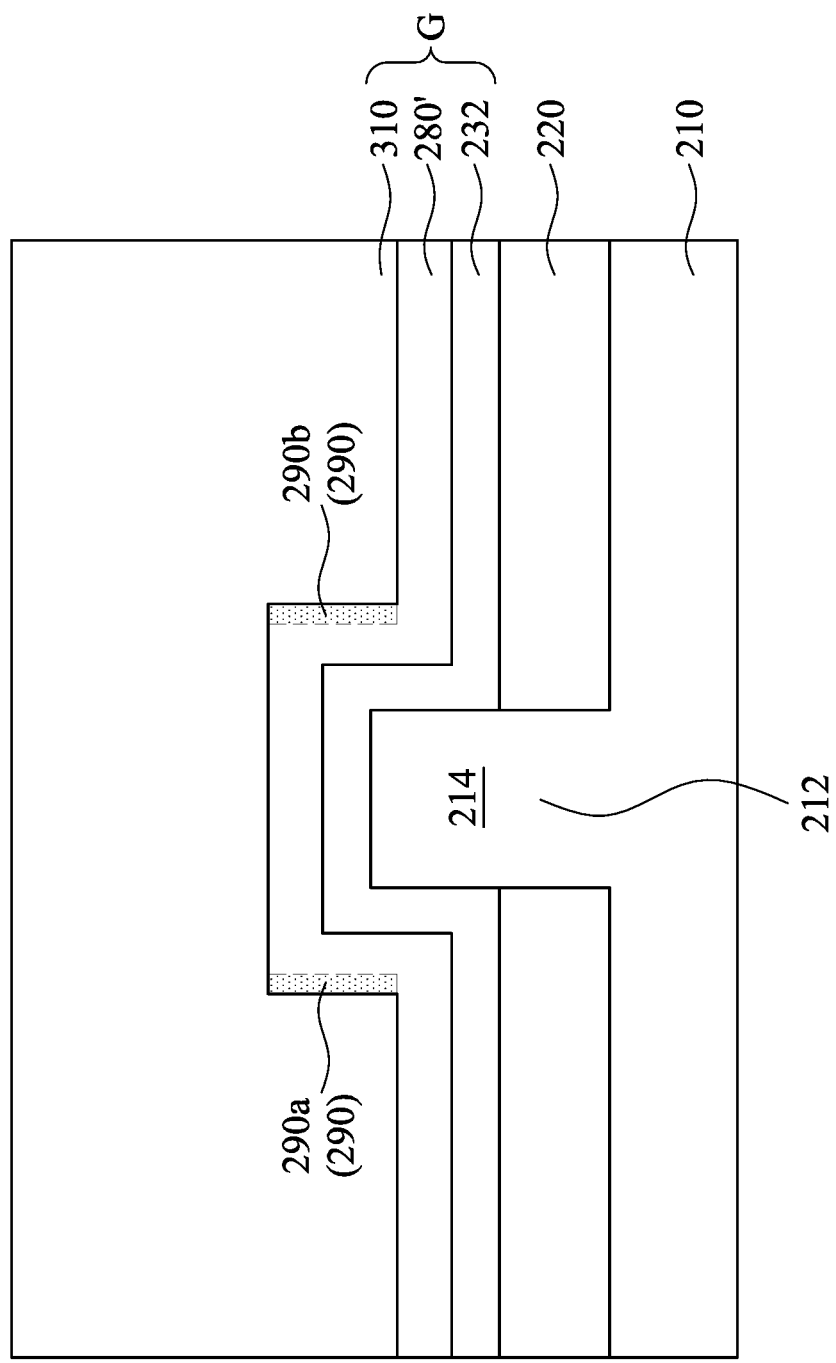

In operation S42 of method M30, a gate electrode 310 is formed over the doped ferroelectric layer 280', as shown in FIGS. 15A, 15B, and 15C. Specifically, at least one metal layer is formed in the gate opening O (see FIGS. 14A, 14B, and 14C) and on the doped ferroelectric layer 280'. Subsequently, a chemical mechanical planarization (CMP) process is performed to planarize the metal layer and the doped ferroelectric layer 280' to form a metal gate stack G in the gate opening O.

The metal gate stack G crosses over the semiconductor fin 212. The metal gate stack G includes the gate dielectric layer 232, the doped ferroelectric layer 280', and the gate electrode 310. The gate electrode 310 may include work function metal layer(s), capping layer(s), fill layer(s), and/or other suitable layers that are desirable in a metal gate stack. The work function metal layer may include n-type and/or p-type work function metal. Exemplary n-type work function metals include Ti, Ag, TaAl, TaAlC, TiAlN, TaC, TaCN, TaSiN, Mn, Zr, other suitable n-type work function materials, or combinations thereof. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. The work function metal layer may have multiple layers. The work function metal layer(s) may be deposited by CVD, PVD, electroplating and/or other suitable process. In some embodiments, the gate electrode 310 is a p-type metal gate including a p-type work function metal layer. In some embodiments, the capping layer in the gate electrode 310 may include refractory metals and their nitrides (e.g. TiN, TaN, $W_2N$, TiSiN, TaSiN). The capping layer may be deposited by PVD, CVD, metal-organic chemical vapor deposition (MOCVD) ALD, or the like. In some embodiments, the fill layer in the metal gate electrode 310 may include tungsten (W). The fill layer may be deposited by ALD, PVD, CVD, or other suitable process.

The method M30 may also include other operations to form various features and components, such as other features for a negative capacitance FET. For examples, an interconnect structure is formed on the substrate 210 and configured to couple various devices into a functional circuit. The interconnection structure includes metal lines distributed in multiple metal layers; contacts to connect the metal lines to devices (such as sources, drains and gates); and vias to vertically connect metal lines in the adjacent metal layers. The formation of the interconnect structure includes damascene process or other suitable procedure. The metal components (metal lines, contacts and vias) may include copper, aluminum, tungsten, metal alloy, silicide, doped polysilicon, other suitable conductive materials, or a combination thereof.

In FIGS. 15A, 15B, and 15C, the metal gate stack G, the semiconductor fin 212, and the source/drain structures 250 form a negative capacitance field effect transistor (NCFET). The metal gate stack G is a negative capacitance gate stack structure and includes the gate dielectric layer 232, the doped ferroelectric layer 280', and the gate electrode 310. The doped ferroelectric layer 280' is over the gate dielectric layer 232, and the gate electrode 310 is over the doped ferroelectric layer 280'. The doped regions 290a and 290b are in contact with (the work function layer of) the gate electrode 310 and spaced apart from the gate dielectric layer 232. The doped regions 290a and 290b may be separated from each other or may be connected. Since the existence of the doped regions 290a and 290b, a dopant concentration of the doped ferroelectric layer 280' varies in a thickness direction of the doped ferroelectric layer 280 (i.e., in a direction from the gate electrode 310 toward the channel 214/semiconductor fin 212). In FIGS. 15A, 15B, and 15C, the dopant concentration decreases in the thickness direction.

The doping concentration of the doped regions 290a and 290b may be in a range of about 1E12 $cm^{-2}$ to about 5E13 $cm^{-2}$. If the doping concentration is higher than about 5E13 $cm^{-2}$, the capacitance $C_{FE}$ may be overshifted, and if the doping concentration is lower than about 1E12 $cm^{-2}$, the capacitance $C_{FE}$ may not be shifted enough. As such, the capacitances $C_{FE}$ and $C_{MOS}$ of the resulting semiconductor device may not be matched.

In some embodiments, the semiconductor device is a P-type NCFET. That is, the semiconductor fin 212 is P-type and the source/drain structures 250 are N-type. In this case, the dopants in the doped regions 290a and 290b may be N-type (such as Boron, Gallium, Indium, or other suitable materials). That is, the doped regions 290a and 290b are negative charged. In some other embodiments, the semiconductor device is an N-type NCFET. That is, the semiconductor fin 212 is N-type and the source/drain structures 250 are P-type. In this case, the dopants in the doped regions 290a and 290b may be P-type (such as Phosphorus, Arsenic, Antimony, Bismuth, Lithium, or other suitable materials). That is, the doped regions 290a and 290b are positive charged.

Figure 16A:
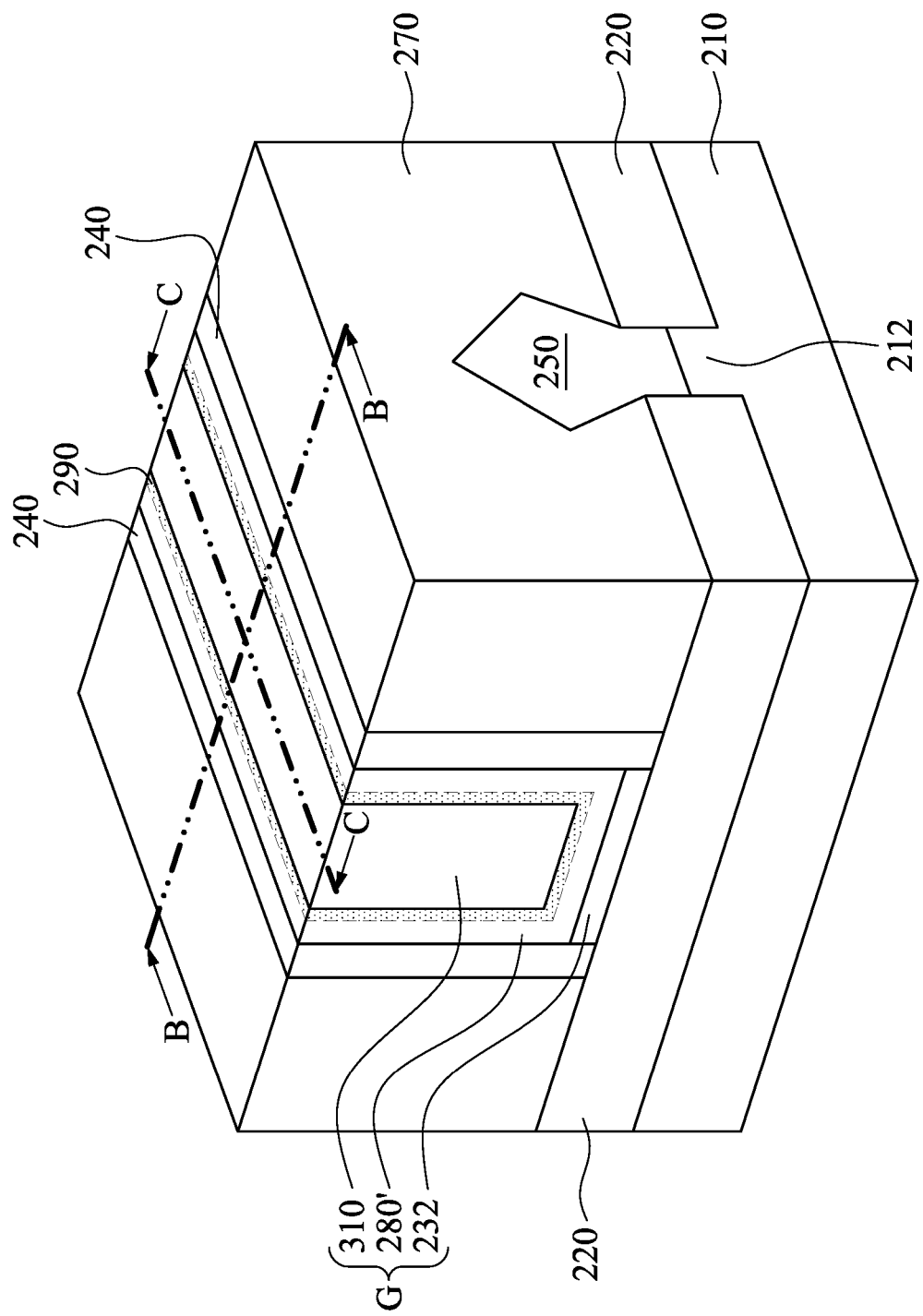
FIG. 16A is a perspective view of the method for manufacturing a semiconductor device in accordance with some embodiments of the present disclosure.
Figure 16B:
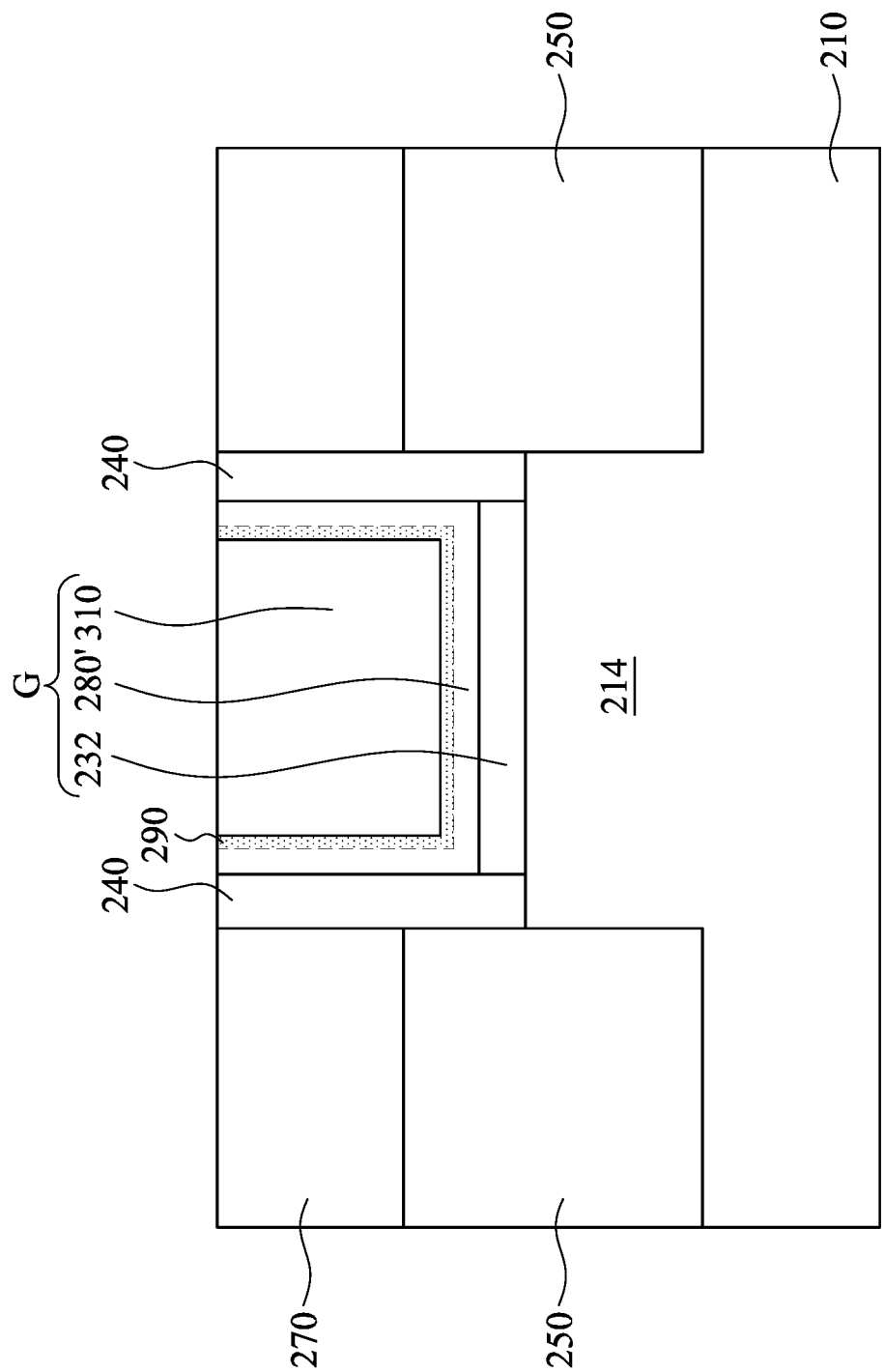
FIG. 16B is a cross-sectional view taking along line B-B of FIG. 16A.
Figure 16C:
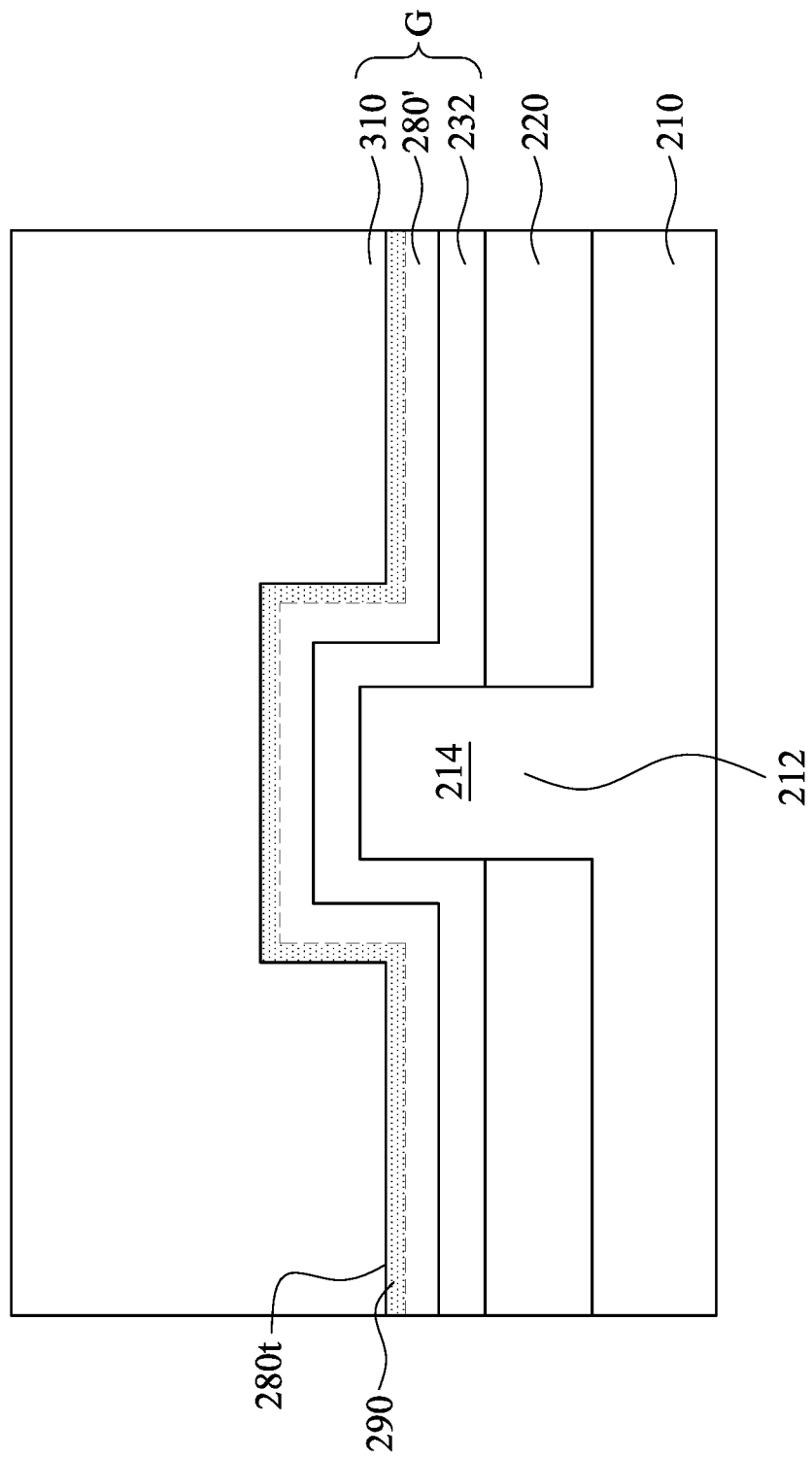
FIG. 16C is a cross-sectional view taking along line C-C of FIG. 16A.

FIG. 16A is a perspective view of the method M30 for manufacturing a semiconductor device in accordance with some embodiments of the present disclosure, FIG. 16B is a cross-sectional view taking along line B-B of FIG. 16A, and FIG. 16C is a cross-sectional view taking along line C-C of FIG. 16A. In some embodiments, the ion implantation process in operation S40 may be an ion implantation process such as a diffusion process or multi-directional ion implantation process. Or, the ion implantation process may have a predetermined downward direction parallel to the protruding direction Dp (see FIG. 14C) of the semiconductor fin 212. Therefore, a doped region 290 conformal with the top surface 280t of the doped ferroelectric layer 280' is formed. Since other manufacturing method of the semiconductor device in FIGS. 16A to 16C are similar to the semiconductor device in FIGS. 15A to 15C, a description in this regard will not be repeated herein.

Figure 17:
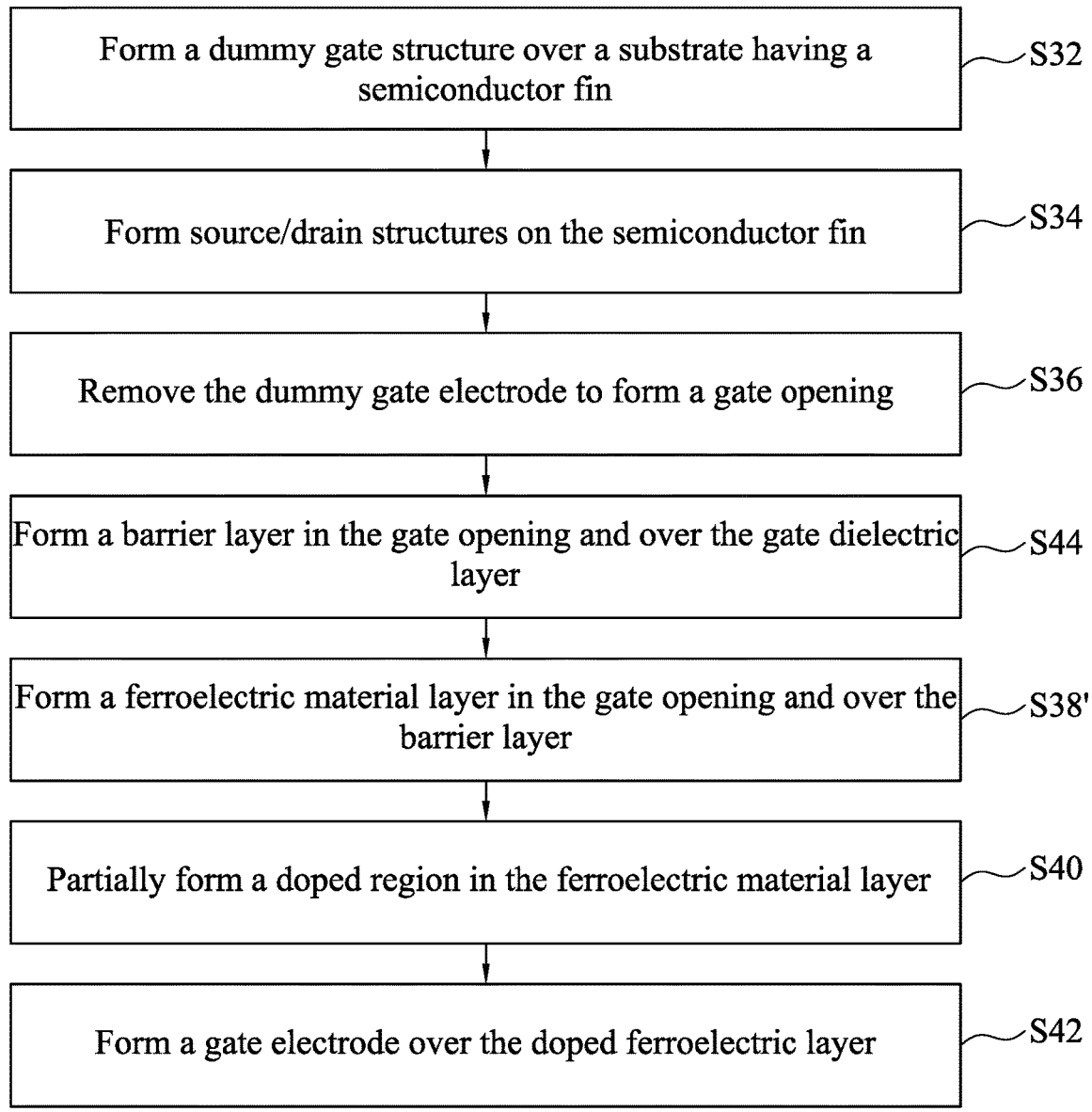
FIG. 17 is a flowchart of a method for making a semiconductor device according to aspects of the present disclosure in various embodiments.
Figure 18A:
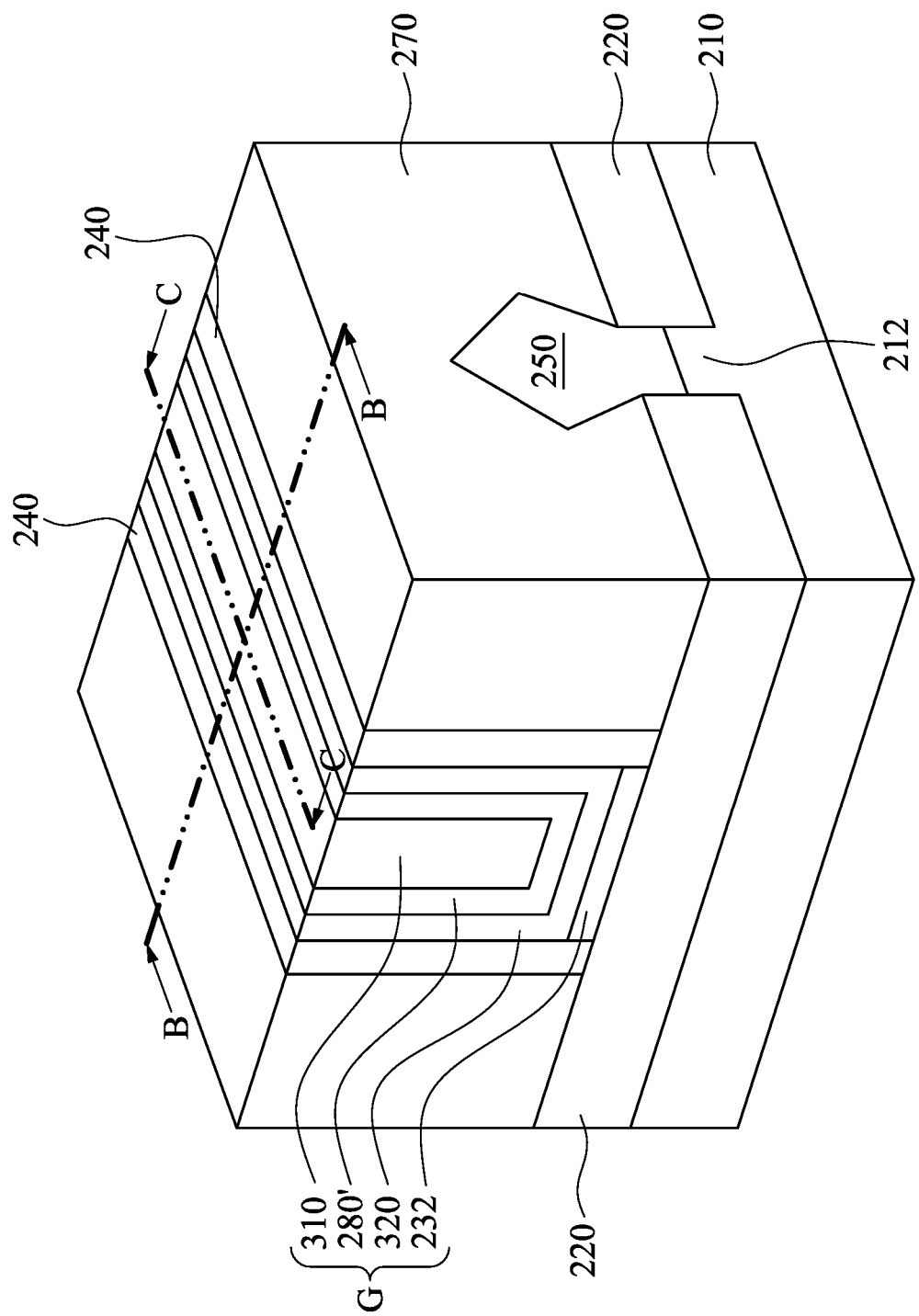
FIG. 18A is a perspective view of the method for manufacturing a semiconductor device in accordance with some embodiments of the present disclosure.
Figure 18B:
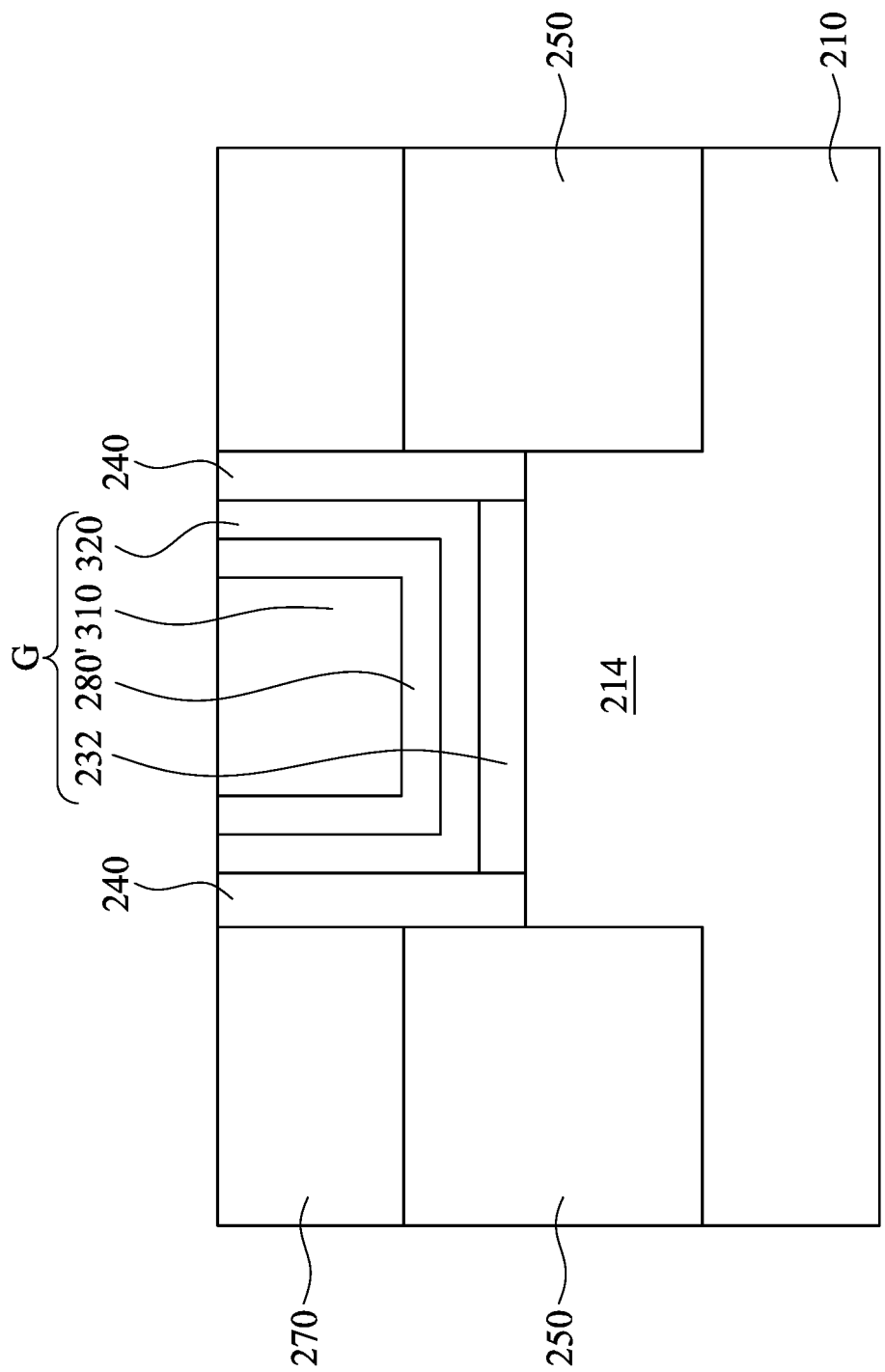
FIG. 18B is a cross-sectional view taking along line B-B of FIG. 18A.
Figure 18C:
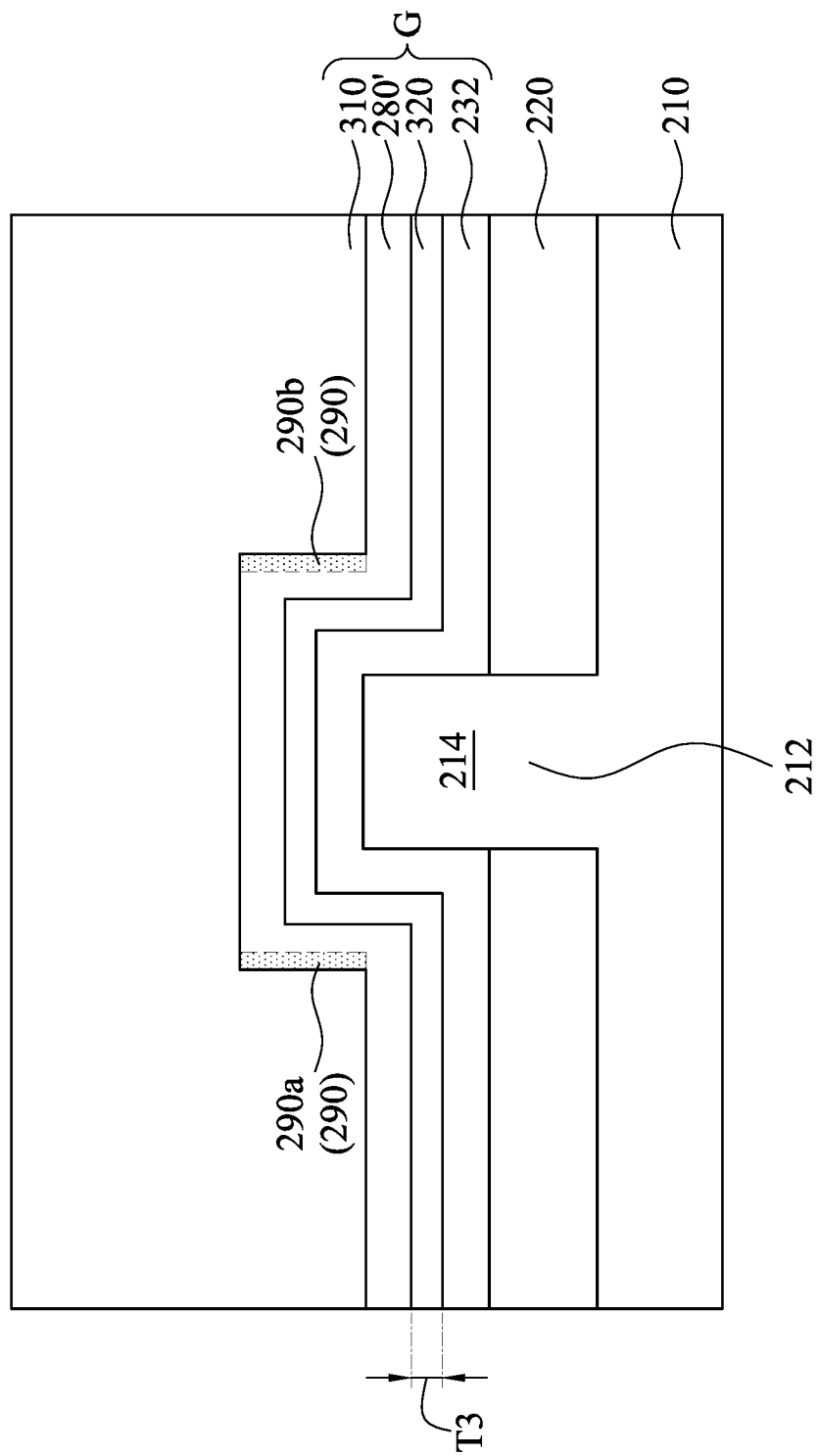
FIG. 18C is a cross-sectional view taking along line C-C of FIG. 18A.

FIG. 17 is a flowchart of a method M30' for making a semiconductor device according to aspects of the present disclosure in various embodiments, FIG. 18A is a perspective view of the method M30' for manufacturing a semiconductor device in accordance with some embodiments of the present disclosure, FIG. 18B is a cross-sectional view taking along line B-B of FIG. 18A, and FIG. 18C is a cross-sectional view taking along line C-C of FIG. 18A. Throughout the various views and illustrative embodiments, like reference numbers are used to designate like elements. The present embodiment may repeat reference numerals and/or letters used in FIGS. 10A-15C. This repetition is for the purpose of simplicity and clarity and does not in itself dictate a relationship between the various embodiments and/or configurations discussed. In the following embodiments, the structural and material details described before are not repeated hereinafter, and only further information is supplied to perform the semiconductor devices of FIGS. 18A-18C.

The difference between the method M30' and M30 pertains to operation S44. In the method M30', the operation S44 may be performed between the operations S36 and S38 (S38'). Specifically, in operation S44 of method M30', a barrier layer 320 is formed over the gate dielectric layer 232 before forming the ferroelectric material layer 280. The barrier layer 320 may be a metallic material such as Pt, Al, W, Ni, alloys thereof (such as aluminum copper alloy), or metal compound (such as titanium nitride or tantalum nitride). The barrier layer 320 may be used to shield the electric field formed in the doped ferroelectric layer 280' from the gate dielectric layer 232, such that the capacitance $C_{MOS}$ is not effected by the electric field (or the doped regions 290a and 290b). In some embodiments, the barrier layer 320 may have a thickness T3 in a range of about 3 nm to about 6 nm.

In operation S38' of method M30', a ferroelectric material layer 280 is formed over the barrier layer 320. In operation S40 of method M30', doped regions 290a and 290b are partially formed in the ferroelectric material layer 280. In operation S42 of method M30', a gate electrode 310 is formed over the doped ferroelectric layer 280'. Since the details of the operations S32, S34, S36, S38', S40, and S42 are similar to the operations S32, S34, S36, S38, S40, and S42 in the method M30 of FIG. 9, a description in this regard will not be repeated herein.

In FIGS. 18A-18C, the metal gate stack G, the semiconductor fin 112, and the source/drain structures 250 form a negative capacitance field effect transistor (NCFET). The metal gate stack G is a negative capacitance gate stack structure and includes the gate dielectric layer 232, the barrier layer 320, the doped ferroelectric layer 280', and the gate electrode 310. The barrier layer 320 is over the gate dielectric layer 232, the doped ferroelectric layer 280' is over the barrier layer 320, and the gate electrode 310 is over the doped ferroelectric layer 280'. The gate electrode 310 is in contact with the doped regions 290a and 290b, and the doped regions 290a and 290b are spaced apart from the barrier layer 320. Since the existence of the doped regions 290a and 290b, a dopant concentration of the doped ferroelectric layer 280' varies in the thickness direction of the doped ferroelectric layer 280'. In FIGS. 18A-18C, the dopant concentration decreases in the thickness direction.

In some embodiments, the semiconductor device may be a P-type NCFET. That is, the semiconductor fin 212 is P-type and the source/drain structures 250 are N-type. In this case, the dopants in the doped regions 290a and 290b may be N-type (such as Boron, Gallium, Indium, or other suitable materials). That is, the doped regions 290a and 290b are negative charged. In some other embodiments, the semiconductor device may be an N-type NCFET. That is, the semiconductor fin 212 is N-type and the source/drain structures 250 are P-type. In this case, the dopants in the doped regions 290a and 290b may be P-type (such as Phosphorus, Arsenic, Antimony, Bismuth, Lithium, or other suitable materials). That is, the doped regions 290a and 290b are positive charged.

Figure 19A:
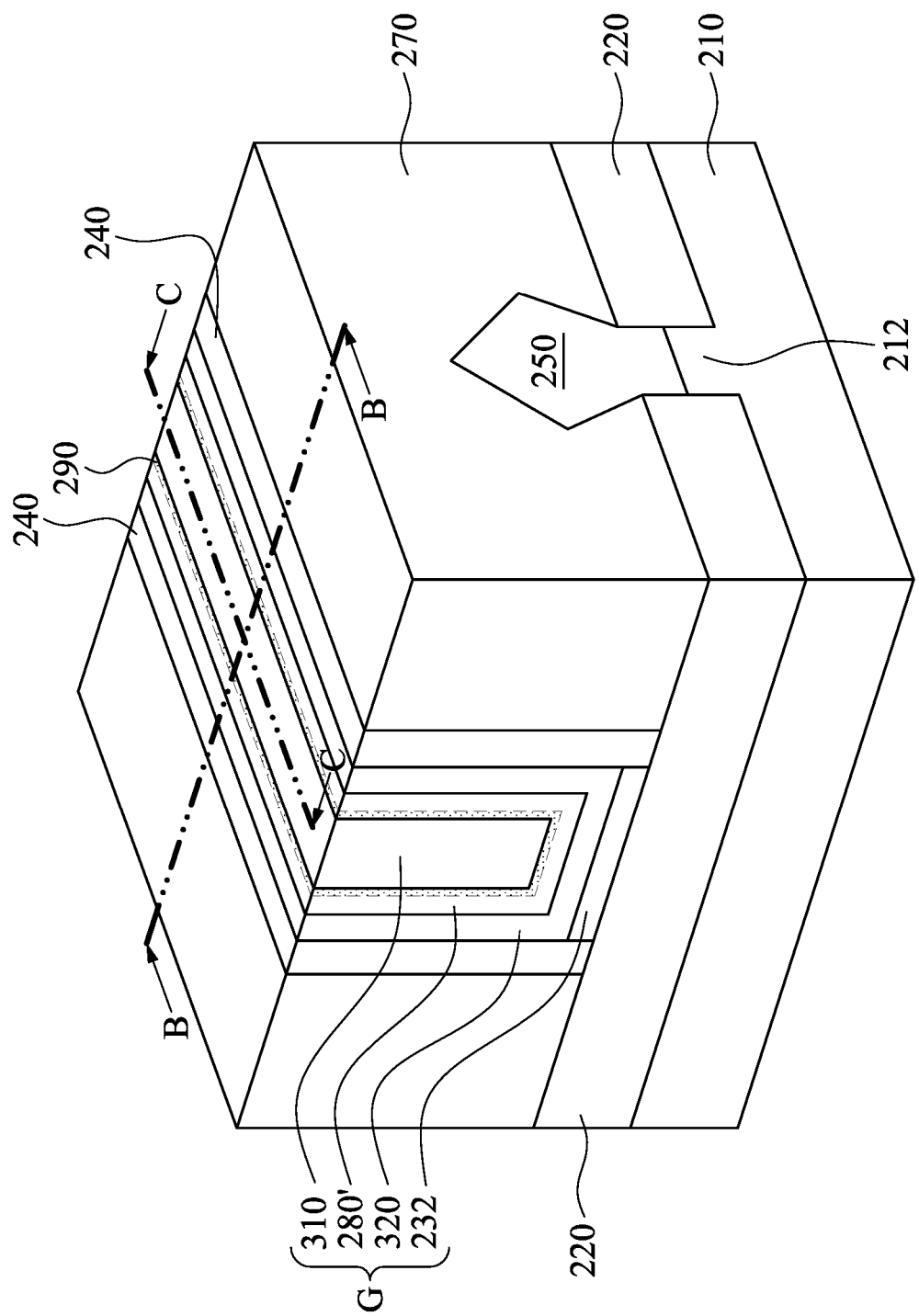
FIG. 19A is a perspective view of the method for manufacturing a semiconductor device in accordance with some embodiments of the present disclosure.
Figure 19B:
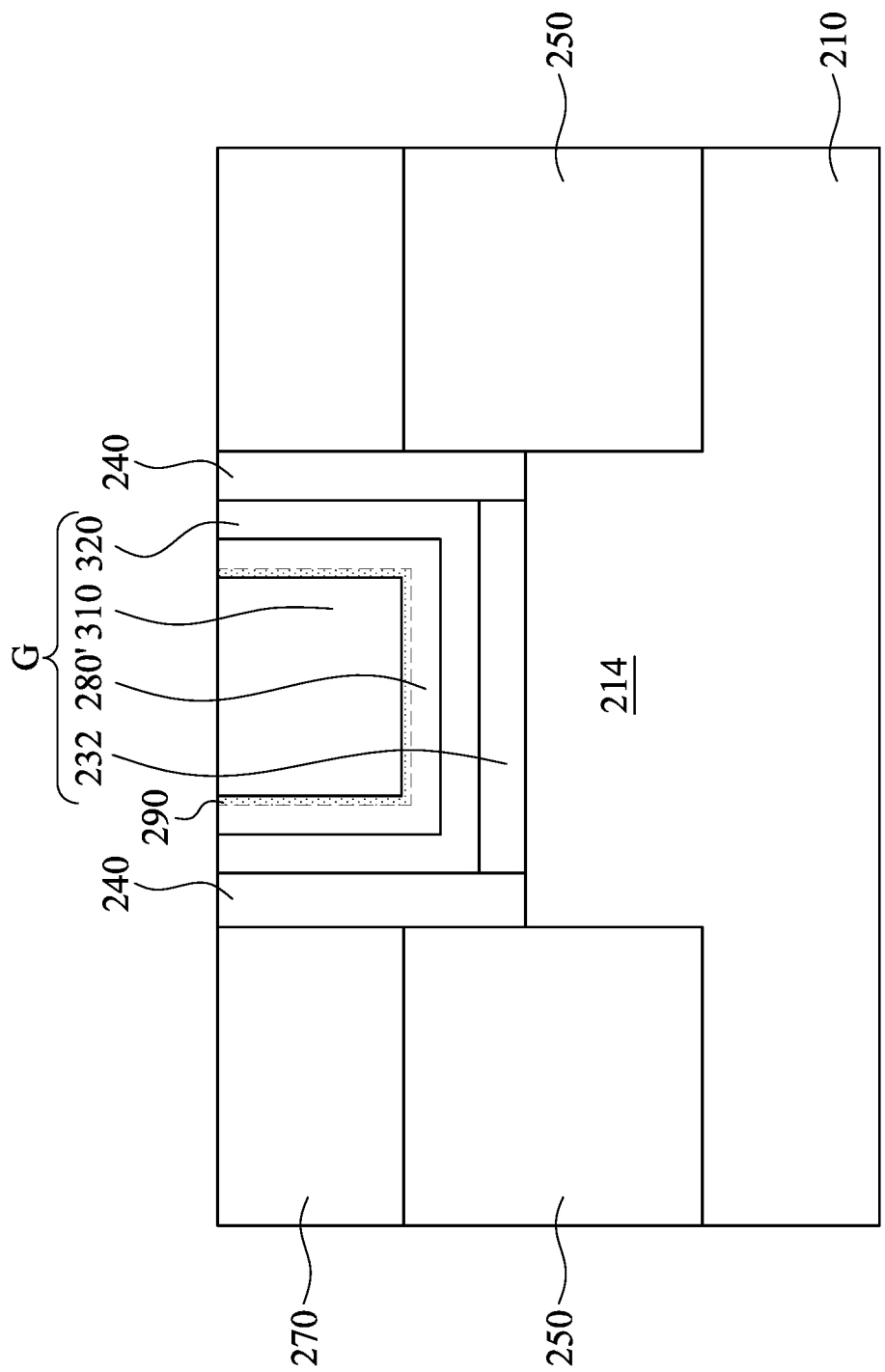
FIG. 19B is a cross-sectional view taking along line B-B of FIG. 19A.
Figure 19C:
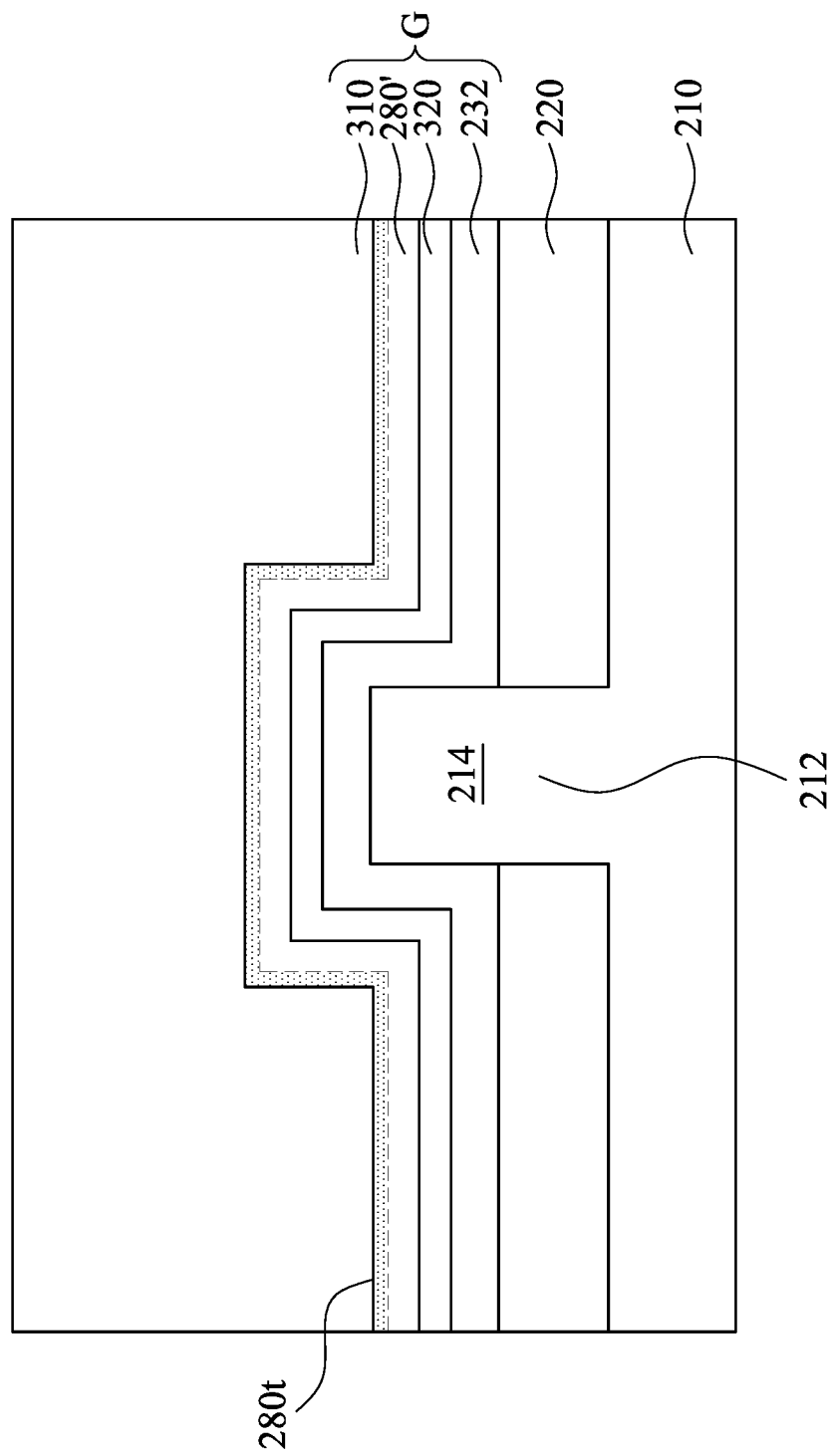
FIG. 19C is a cross-sectional view taking along line C-C of FIG. 19A.

FIG. 19A is a perspective view of the method M30' for manufacturing a semiconductor device in accordance with some embodiments of the present disclosure, FIG. 19B is a cross-sectional view taking along line B-B of FIG. 19A, and FIG. 19C is a cross-sectional view taking along line C-C of FIG. 19A. In some embodiments, the ion implantation process in operation S40 may be an on implantation process such as a diffusion process or multi-directional ion implantation process. Or, the ion implantation process may have a predetermined downward direction parallel to the protruding direction Dp (see FIG. 14C) of the semiconductor fin 212. Therefore, a doped region 290 conformal with the top surface 280t of the ferroelectric material layer 280 is formed. Since other manufacturing method of the semiconductor device in FIGS. 19A to 19C are similar to the semiconductor device in FIGS. 18A to 18C, a description in this regard will not be repeated herein.

Figure 20:
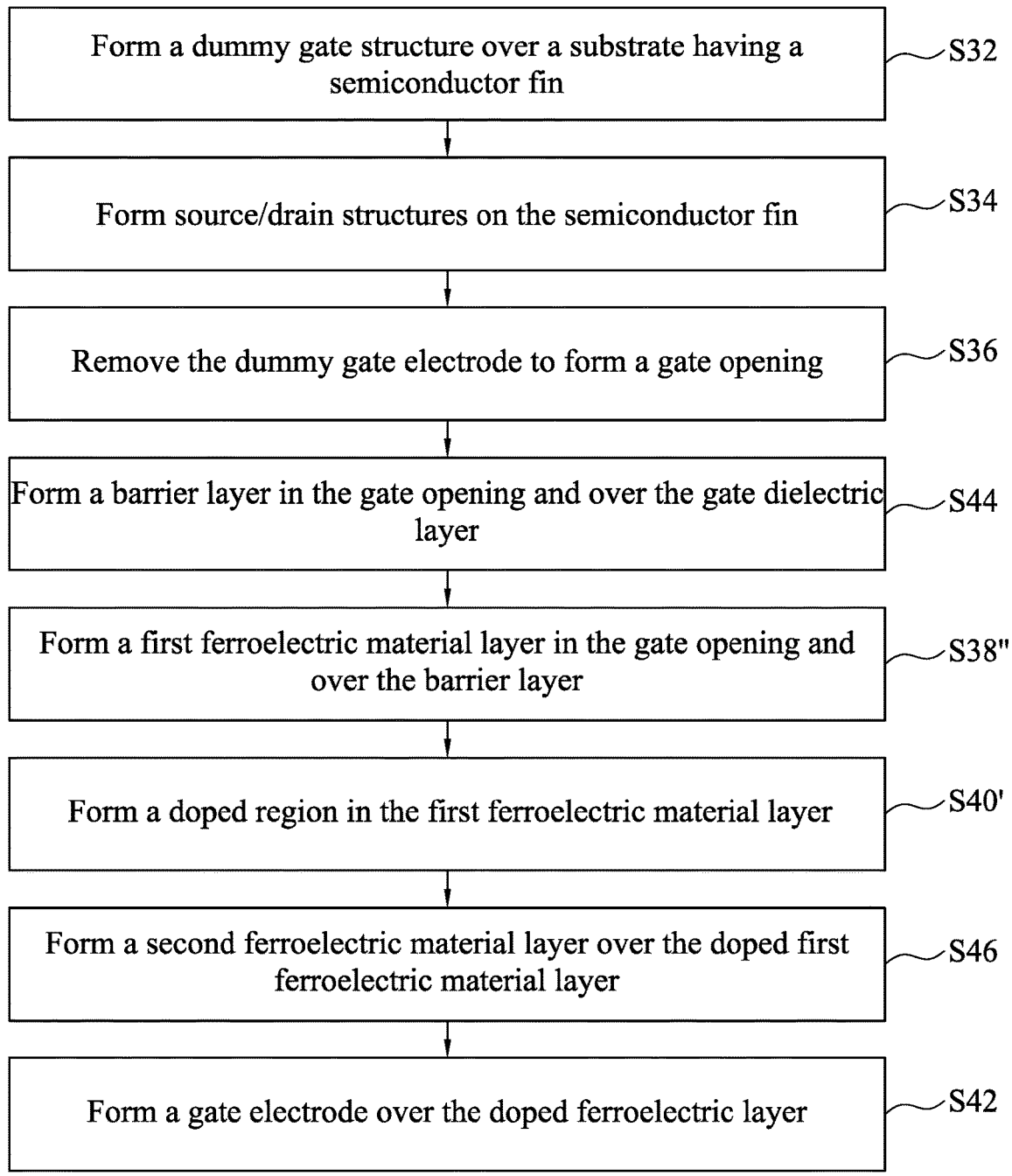
FIG. 20 is a flowchart of a method for making a semiconductor device according to aspects of the present disclosure in various embodiments.

FIG. 20 is a flowchart of a method M30" for making a semiconductor device according to aspects of the present disclosure in various embodiments. Various operations of the method M30" are discussed in association with perspective diagrams FIGS. 21A-26C. Throughout the various views and illustrative embodiments, like reference numbers are used to designate like elements. The present embodiment may repeat reference numerals and/or letters used in FIGS. 10A-15B and 18A-18C. This repetition is for the purpose of simplicity and clarity and does not in itself dictate a relationship between the various embodiments and/or configurations discussed. In the following embodiments, the structural and material details described before are not repeated hereinafter, and only further information is supplied to perform the semiconductor devices of FIGS. 21A-26C. FIGS. 21A, 22A, 23A, 24A, 25A, and 26A are perspective views of the method M30" for manufacturing a semiconductor device at various stages in accordance with some embodiments of the present disclosure, FIGS. 21B, 22B, 23B, 24B, 25B, and 26B are cross-sectional view respectively taking along line B-B of FIGS. 21A, 22A, 23A, 24A, 25A, and 26A, and FIGS. 22C, 23C, 24C, 25C, and 26C are cross-sectional view respectively taking along line C-C of FIGS. 22A, 23A, 24A, 25A, and 26A.

Figure 21A:
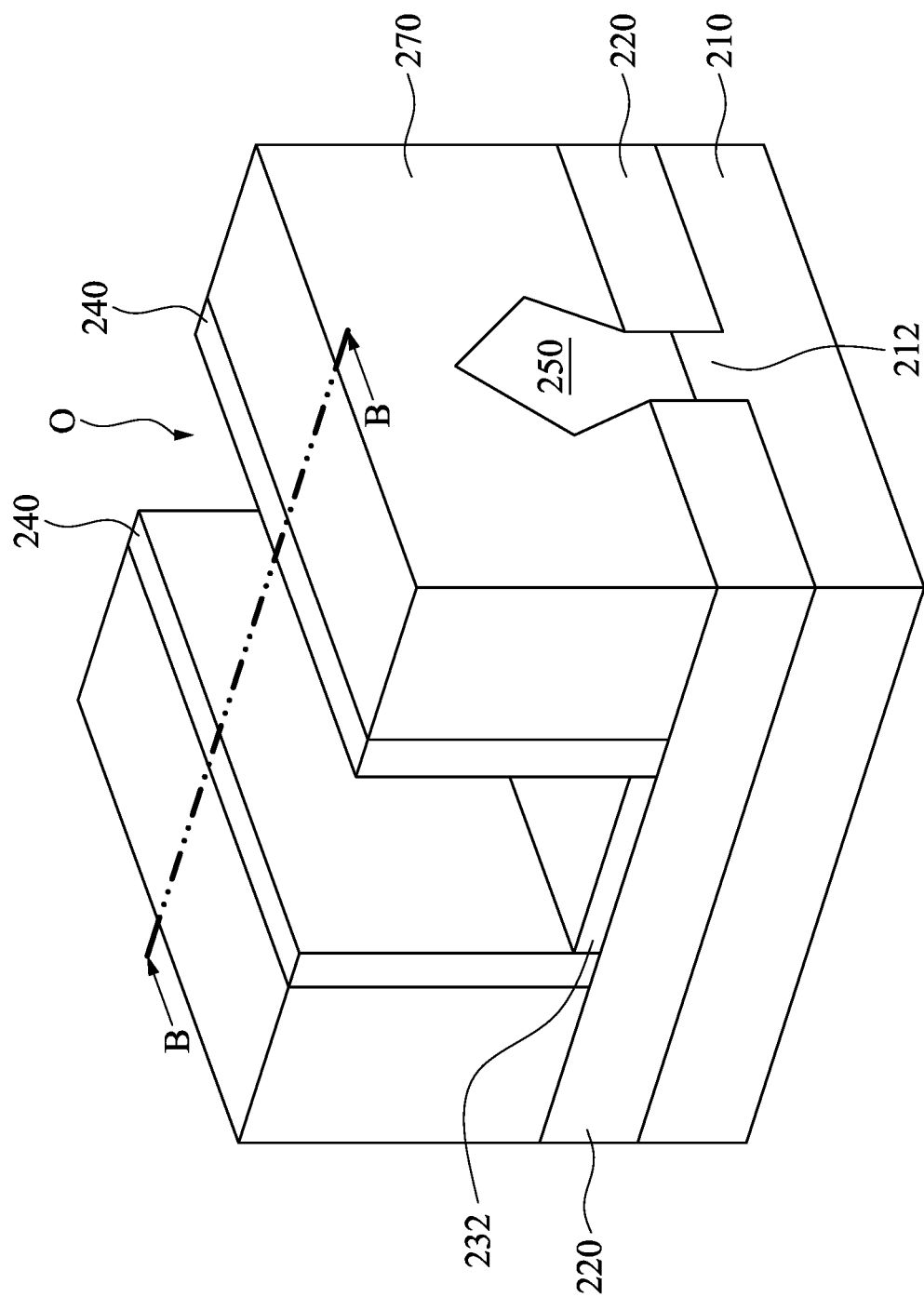
FIGS. 21A, 22A, 23A, 24A, 25A, and 26A are perspective views of the method for manufacturing a semiconductor device at various stages in accordance with some embodiments of the present disclosure.
Figure 21B:
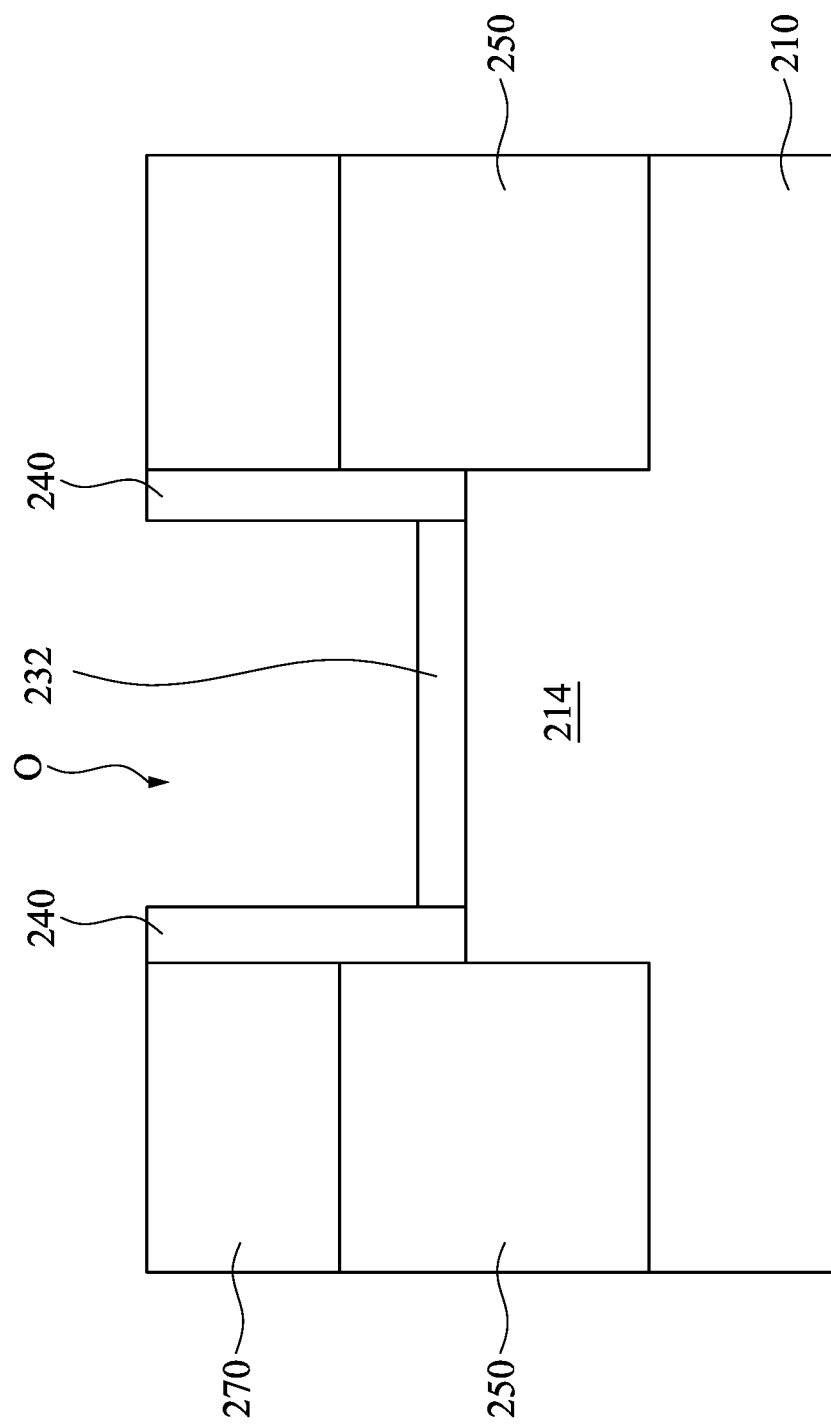
FIGS. 21B, 22B, 23B, 24B, 25B, and 26B are cross-sectional view respectively taking along line B-B of FIGS. 21A, 22A, 23A, 24A, 25A, and 26A.
Figure 22A:
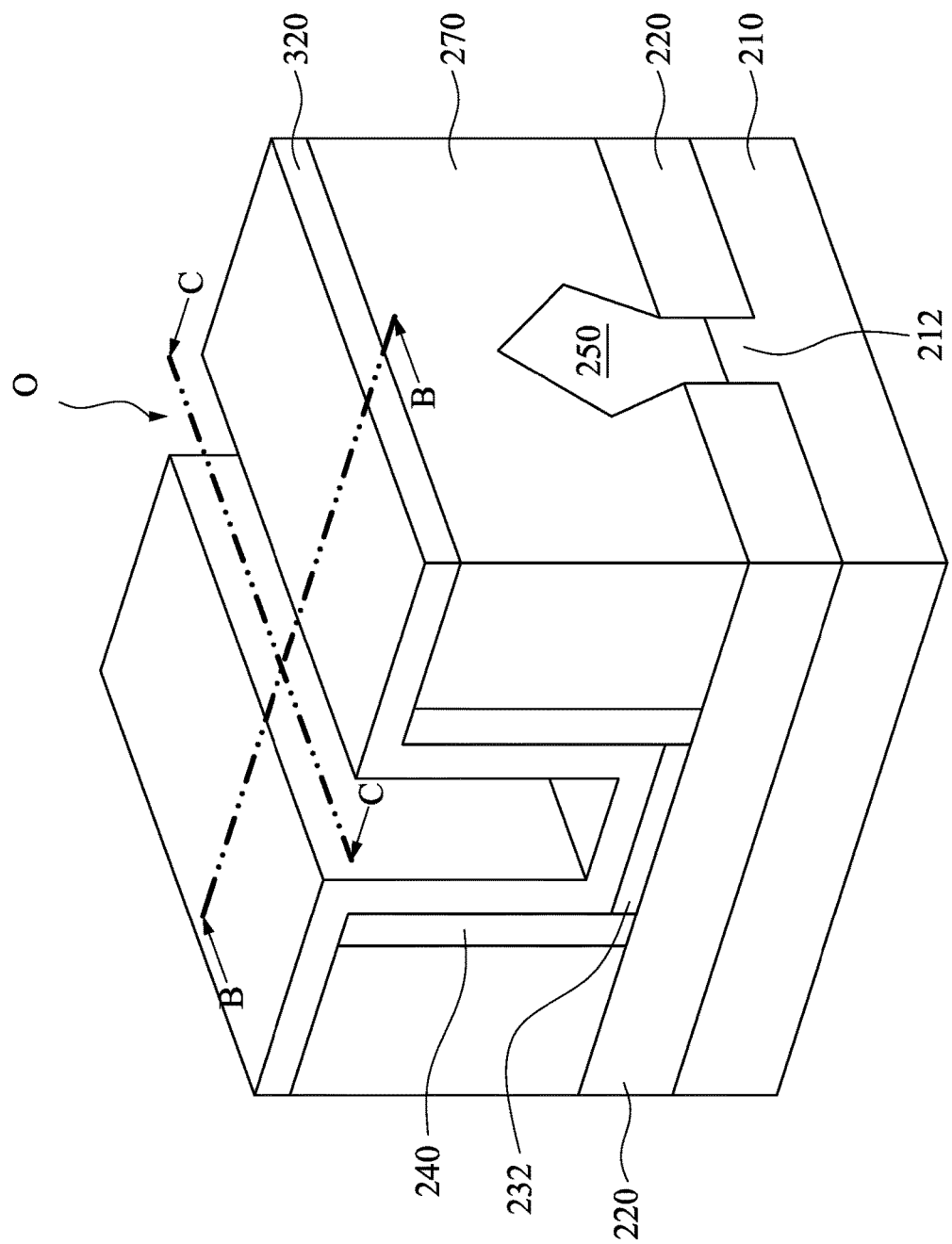
Figure 22B:
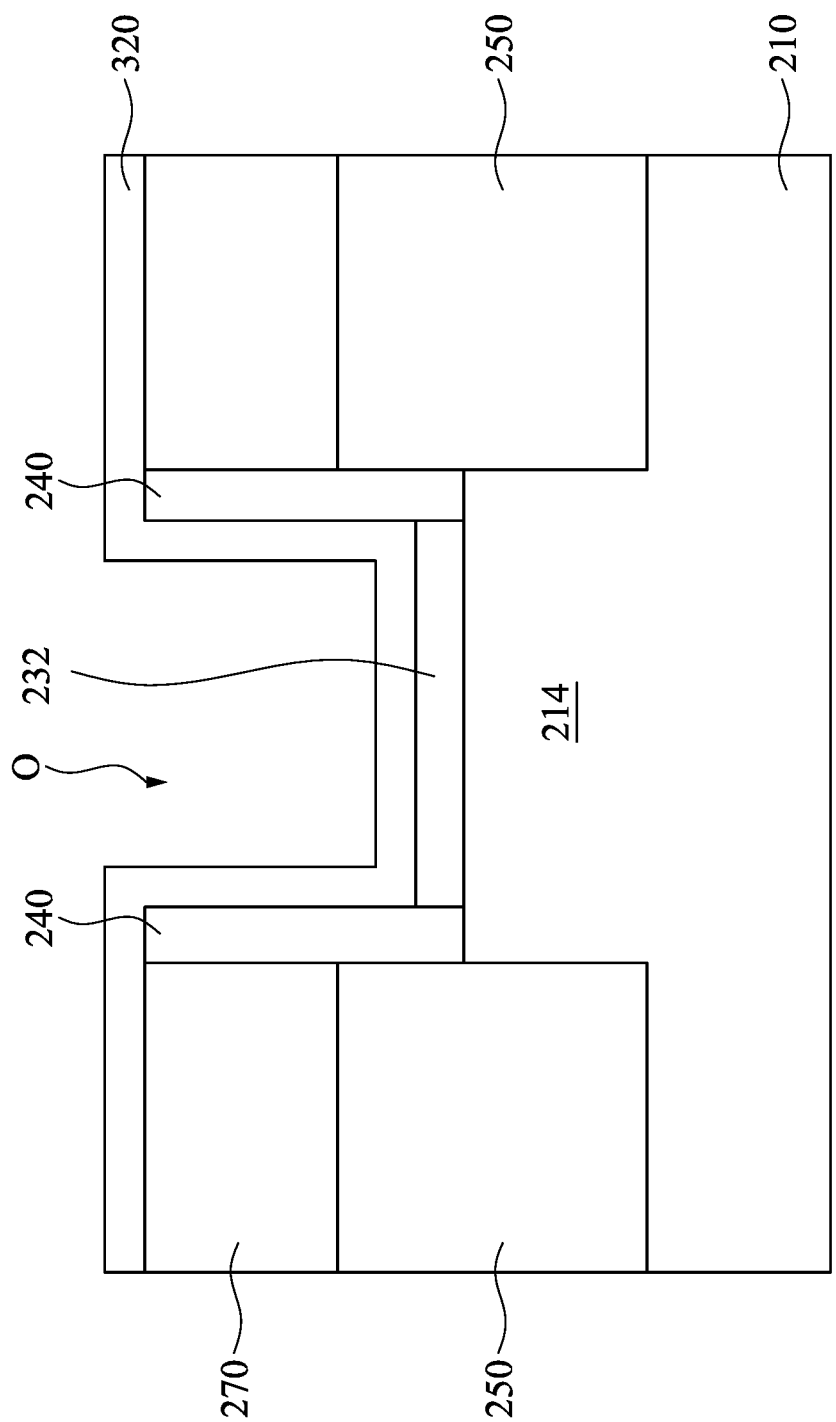
Figure 22C:
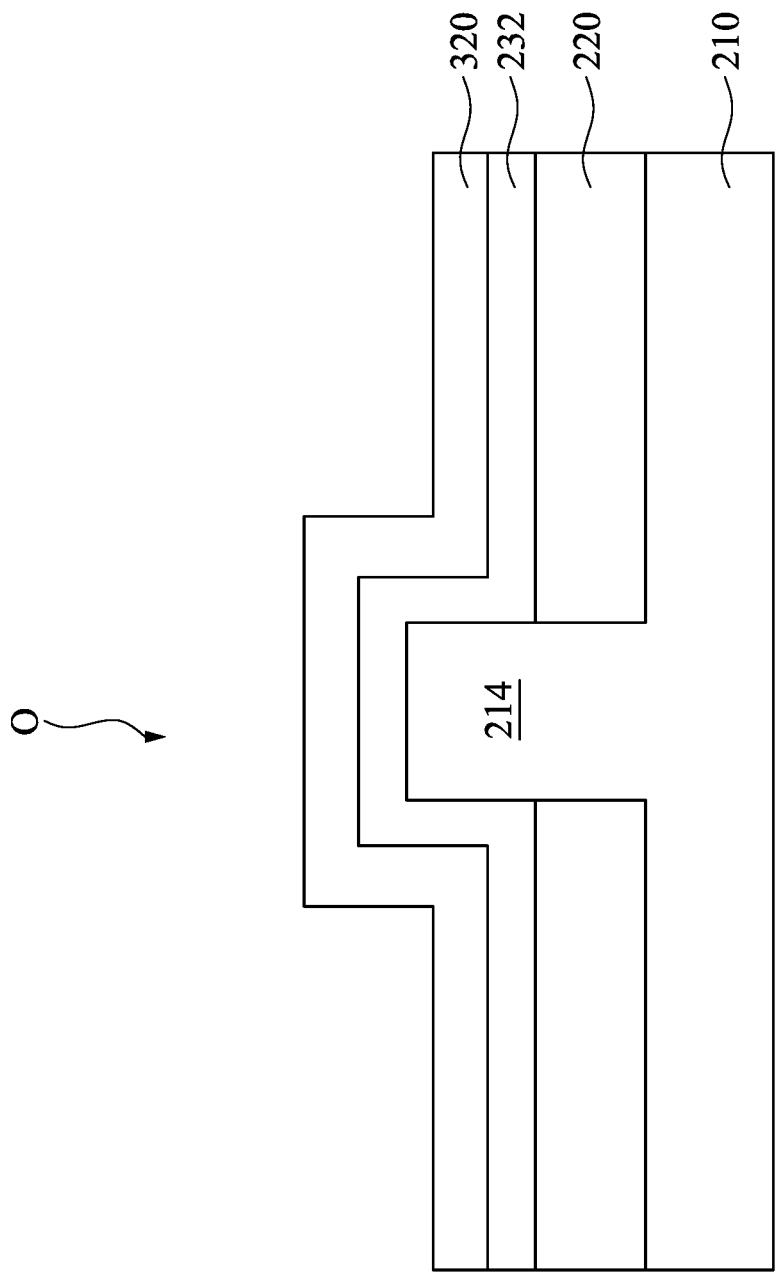
FIGS. 22C, 23C, 24C, 25C, and 26C are cross-sectional view respectively taking along line C-C of FIGS. 22A, 23A, 24A, 25A, and 26A.

In operation S32 of method M30", a dummy gate structure is formed over a substrate 210 having a semiconductor fin 212, in operation S34 of method M30", source/drain structures 250 are formed in the semiconductor fin 212, and in operation S36 of method M30", the dummy gate electrode of the dummy gate structure is removed to form a gate opening O, as shown in FIGS. 21A and 21B. In operation S44 of method M30", a barrier layer 320 is formed in the gate opening O and over the gate dielectric layer 232, as shown in FIGS. 22A and 22B.

Figure 23A:
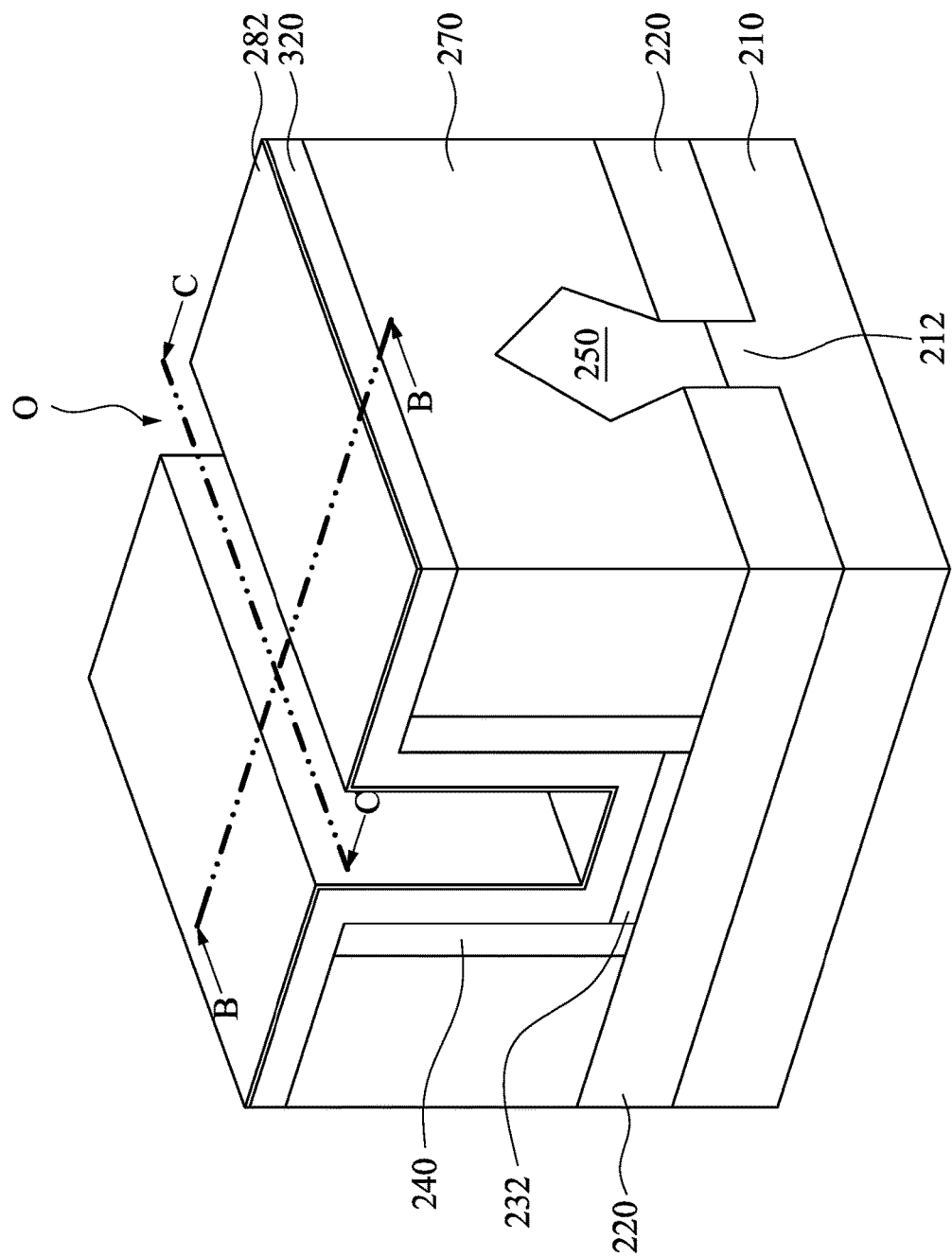
Figure 23B:
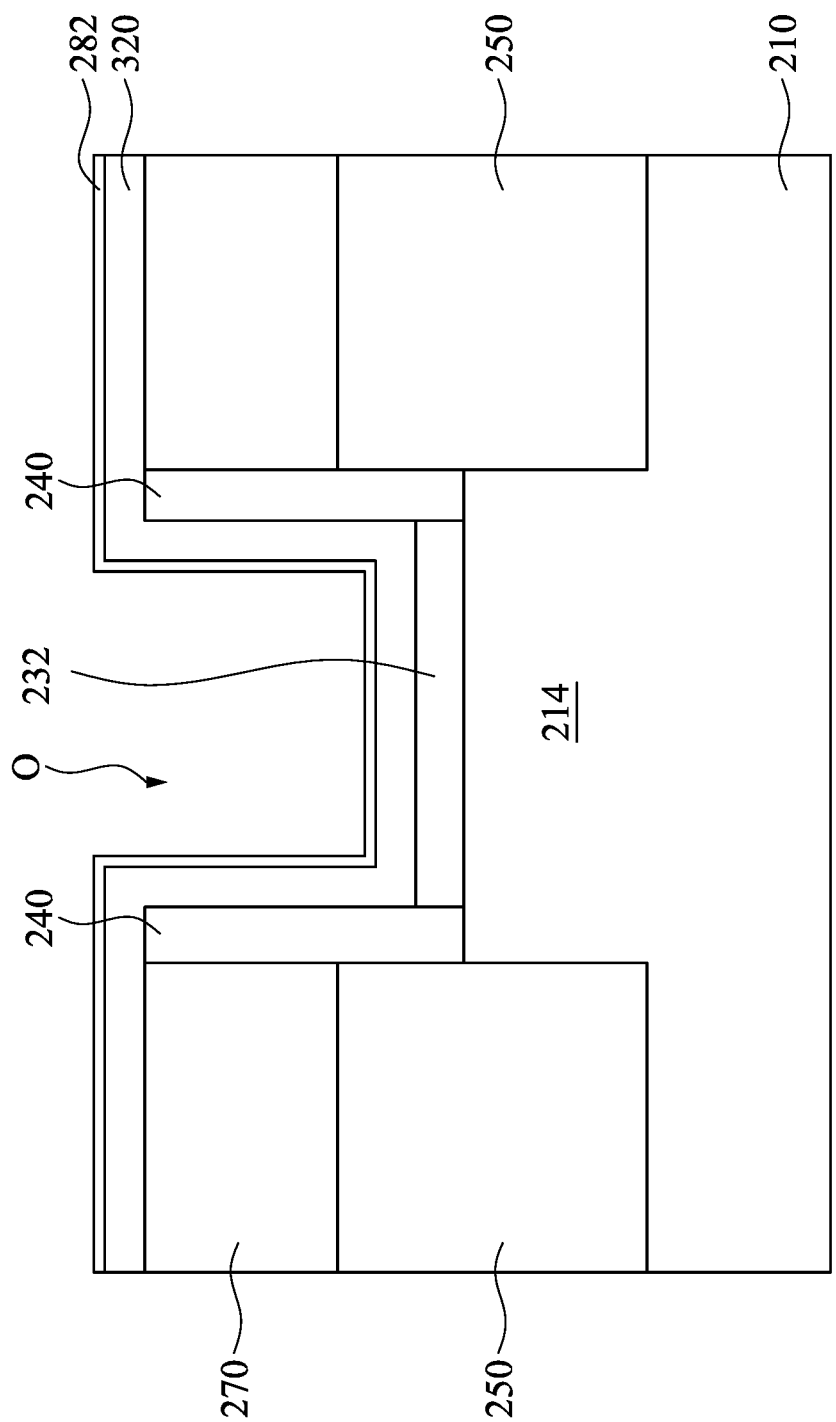
Figure 23C:
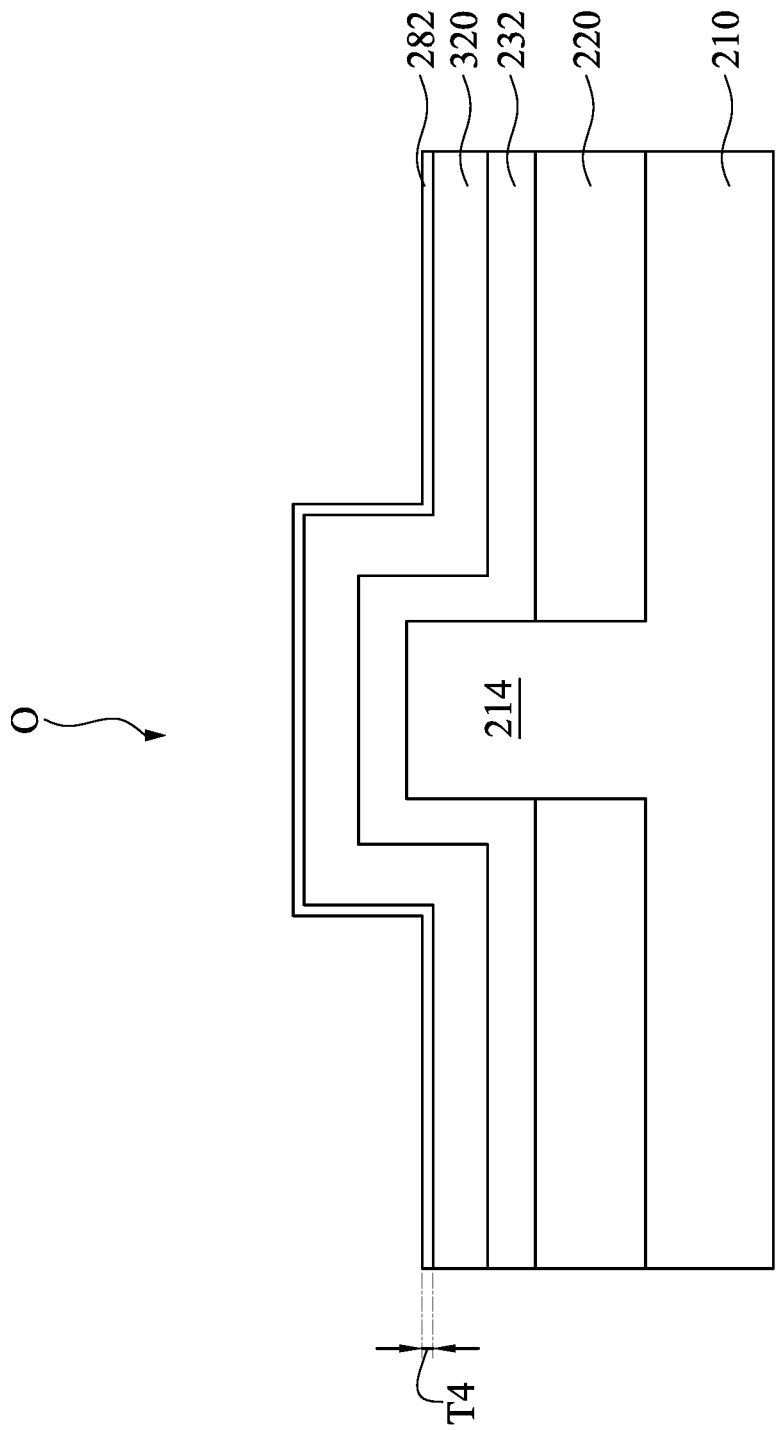

In operation S38" of method M30", a first ferroelectric material layer 282 is formed over the barrier layer 320, as shown in FIGS. 23A, 23B, and 23C. The first ferroelectric material layer 282 may have the similar material and manufacturing methods to the ferroelectric material layer 130 in FIG. 2B, and a description in this regard will not be provided hereinafter. In some embodiments, the thickness T4 of first ferroelectric material layer 282 may be smaller than about 2 nm, and may be in the range between about 1 nm and about 2 nm.

Figure 24A:
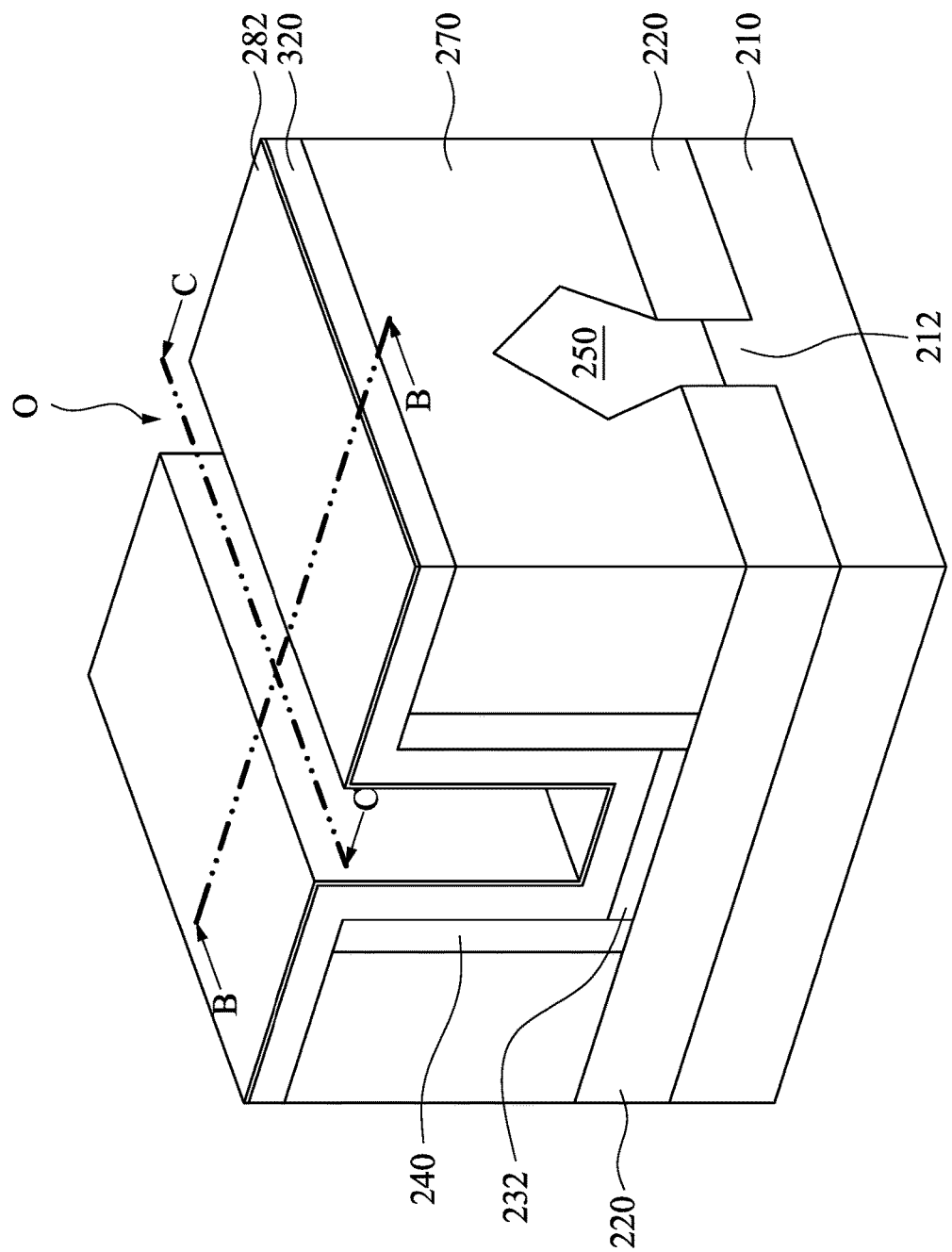
Figure 24B:
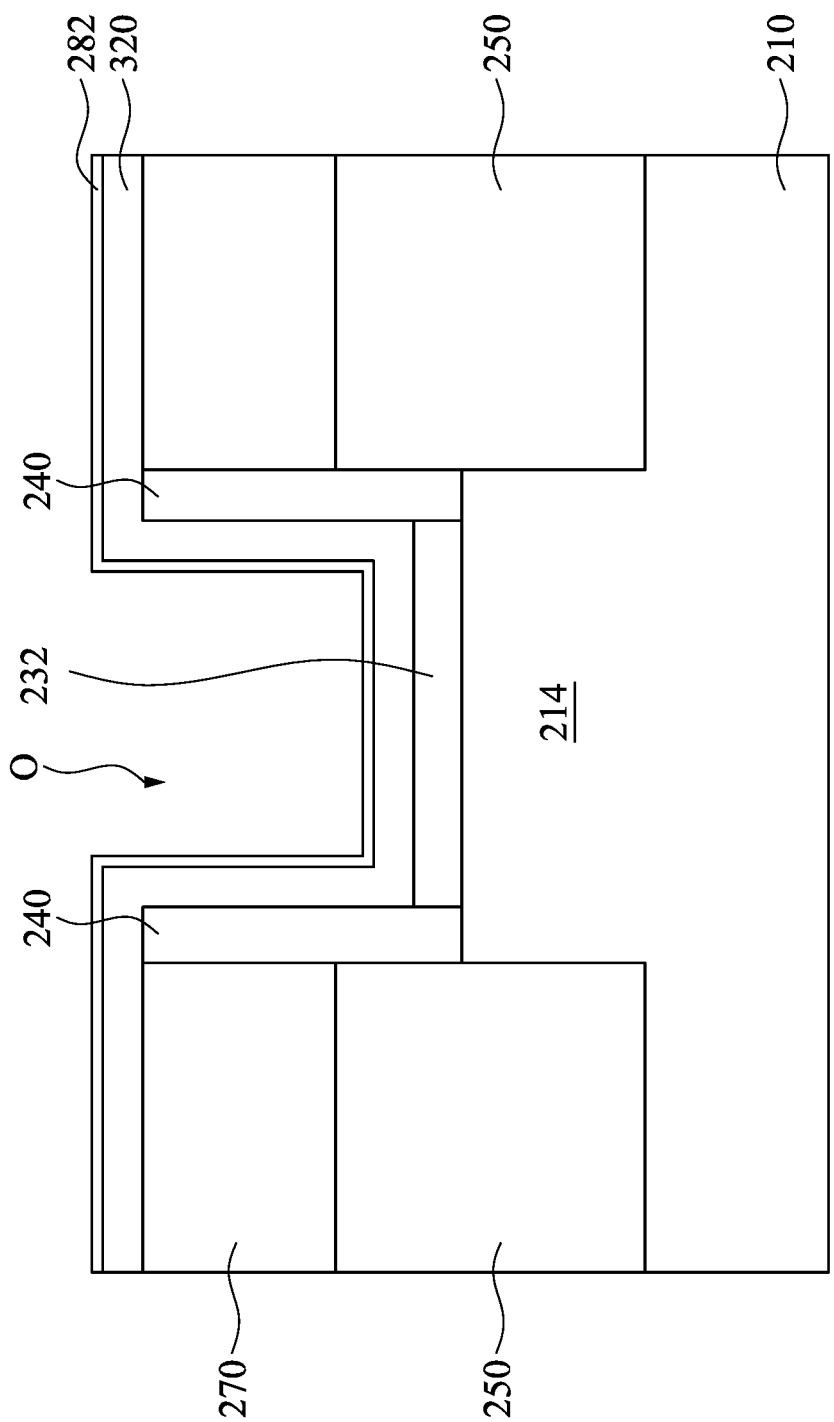
Figure 24C:
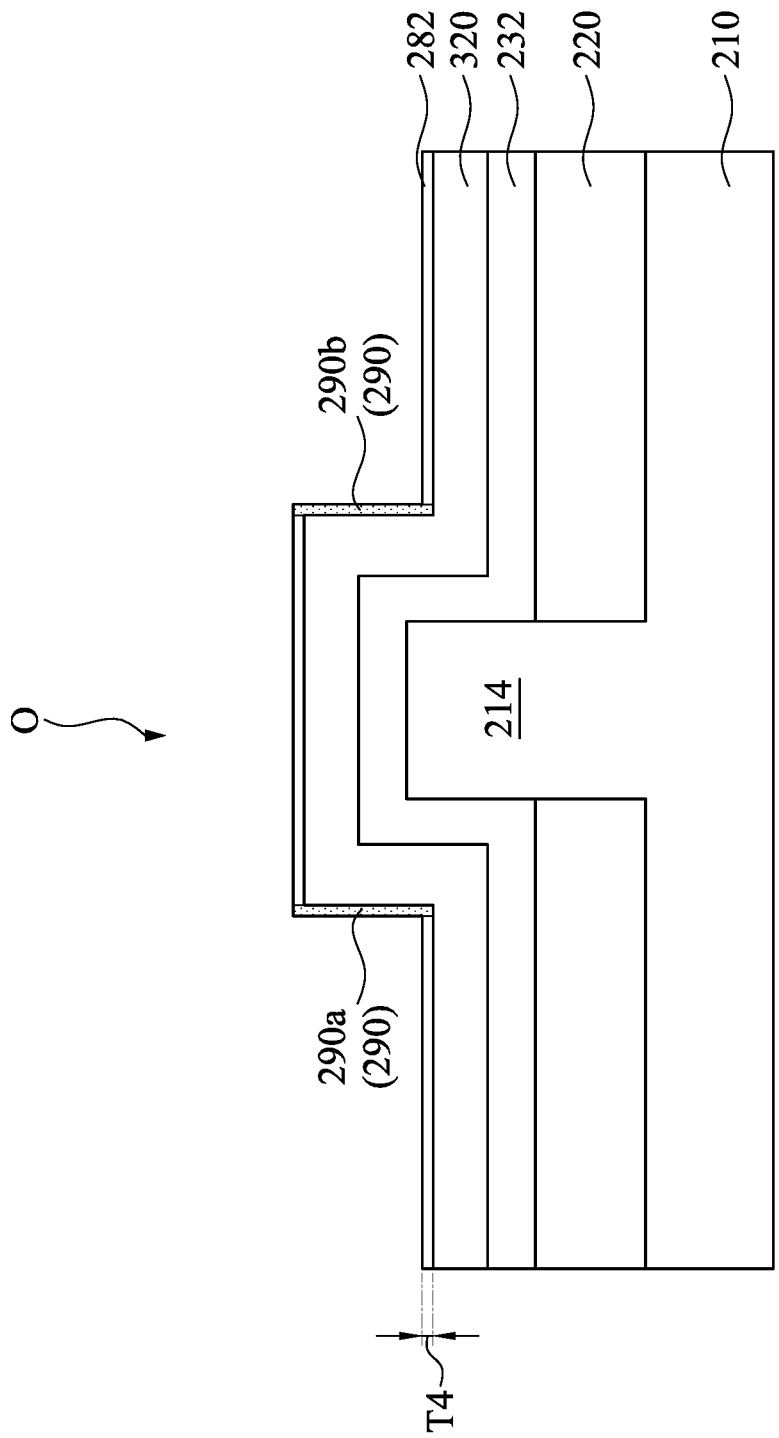

In operation S40' of method M30", at least one doped region is formed in the first ferroelectric material layer 282, as shown in FIGS. 24A, 24B, and 24C. In some embodiments, the doping depth of the doped regions 290a and 290b are substantially the same as the thickness T4 of the first ferroelectric material layer 282. As such, the doped regions 290a and 290b have the thickness T4, and are in contact with the barrier layer 320. Since the formation of the doped regions 290a and 290b are similar to the formation of the doped regions 290a and 290b in FIGS. 14A to 14C, a description with this regard will not be repeated herein.

Figure 25A:
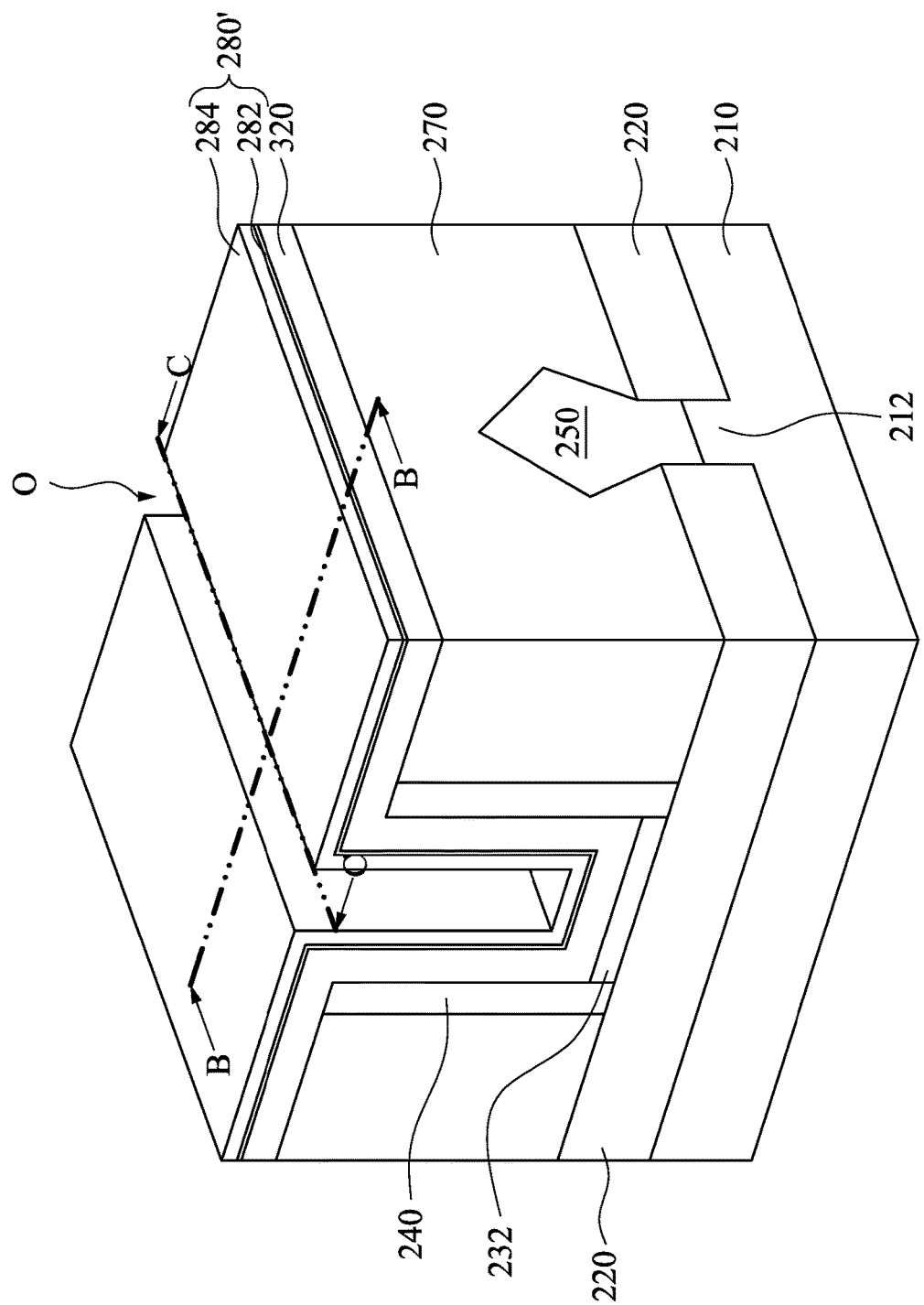
Figure 25B:
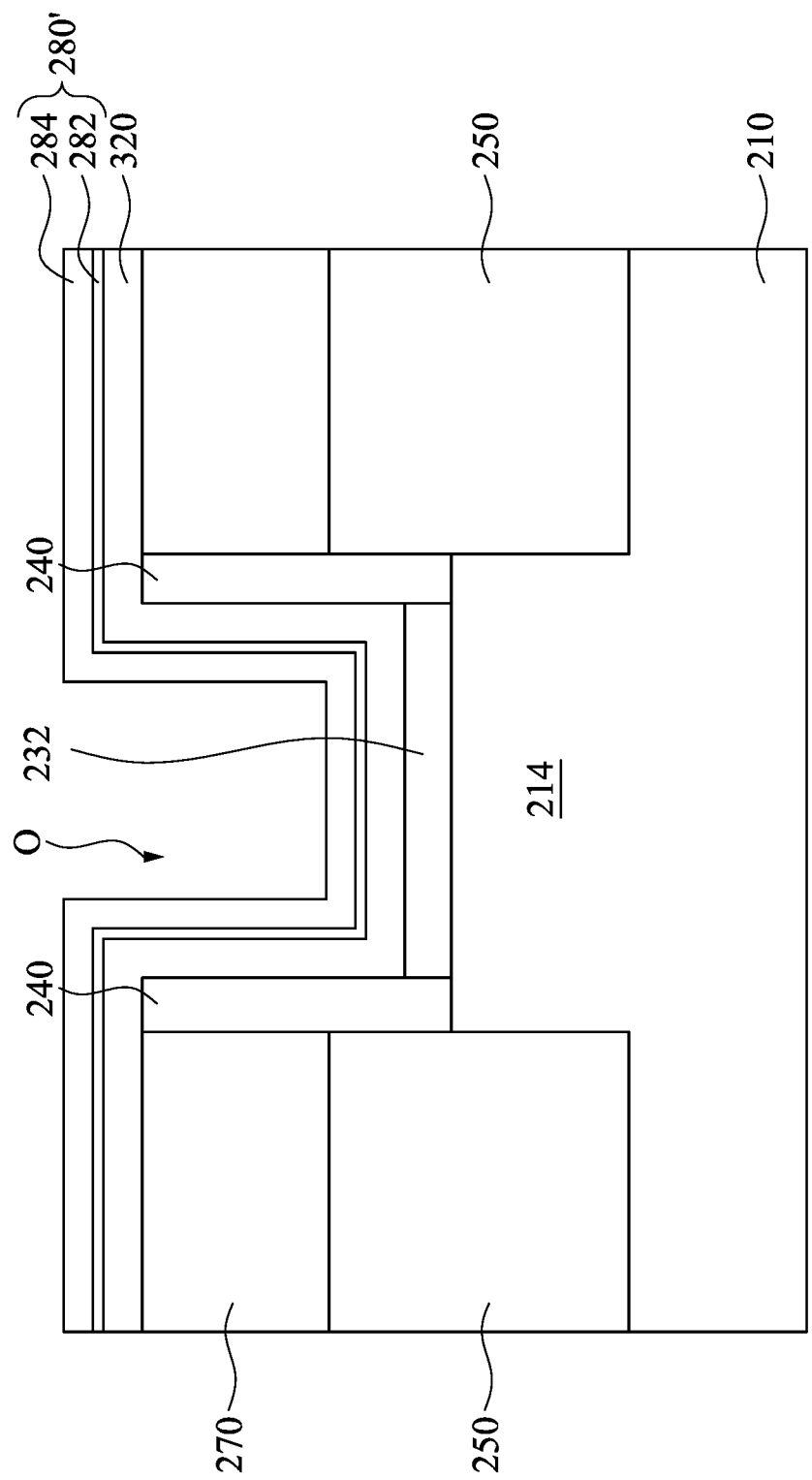
Figure 25C:
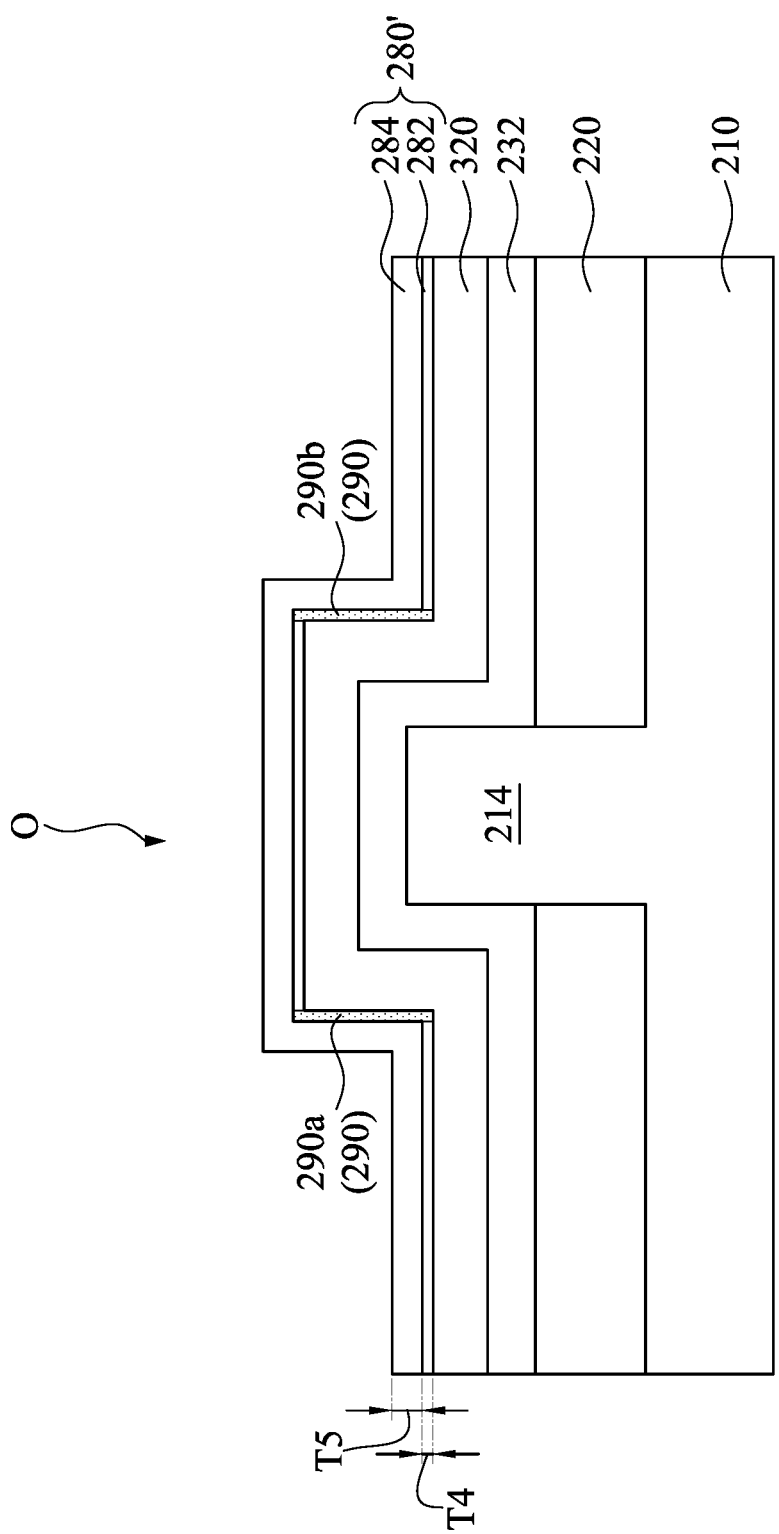

In operation S46 of method M30", a second ferroelectric material layer 284 is formed over the doped regions 290a and 290b and the first ferroelectric material layer 282, as shown in FIGS. 25A, 25B, and 25C. The second ferroelectric material layer 284 may have the similar material and manufacturing methods to the first ferroelectric material layer 282 in FIGS. 23A, 23B, and 23C, and a description in this regard will not be provided hereinafter. In some embodiments, the thickness T5 of the second ferroelectric material layer 284 may be smaller than about 10 nm, and may be in the range between about 1 nm and about 10 nm. Further, the thickness T5 is greater than the thickness T4. For example, the thickness T4 may be about 5% to about 15% of the thickness T5. In this regard, the doped regions 290a and 290b, the first ferroelectric material layer 282, and the second ferroelectric material layer 284 are together referred to as a doped ferroelectric layer 280'.

Figure 26A:
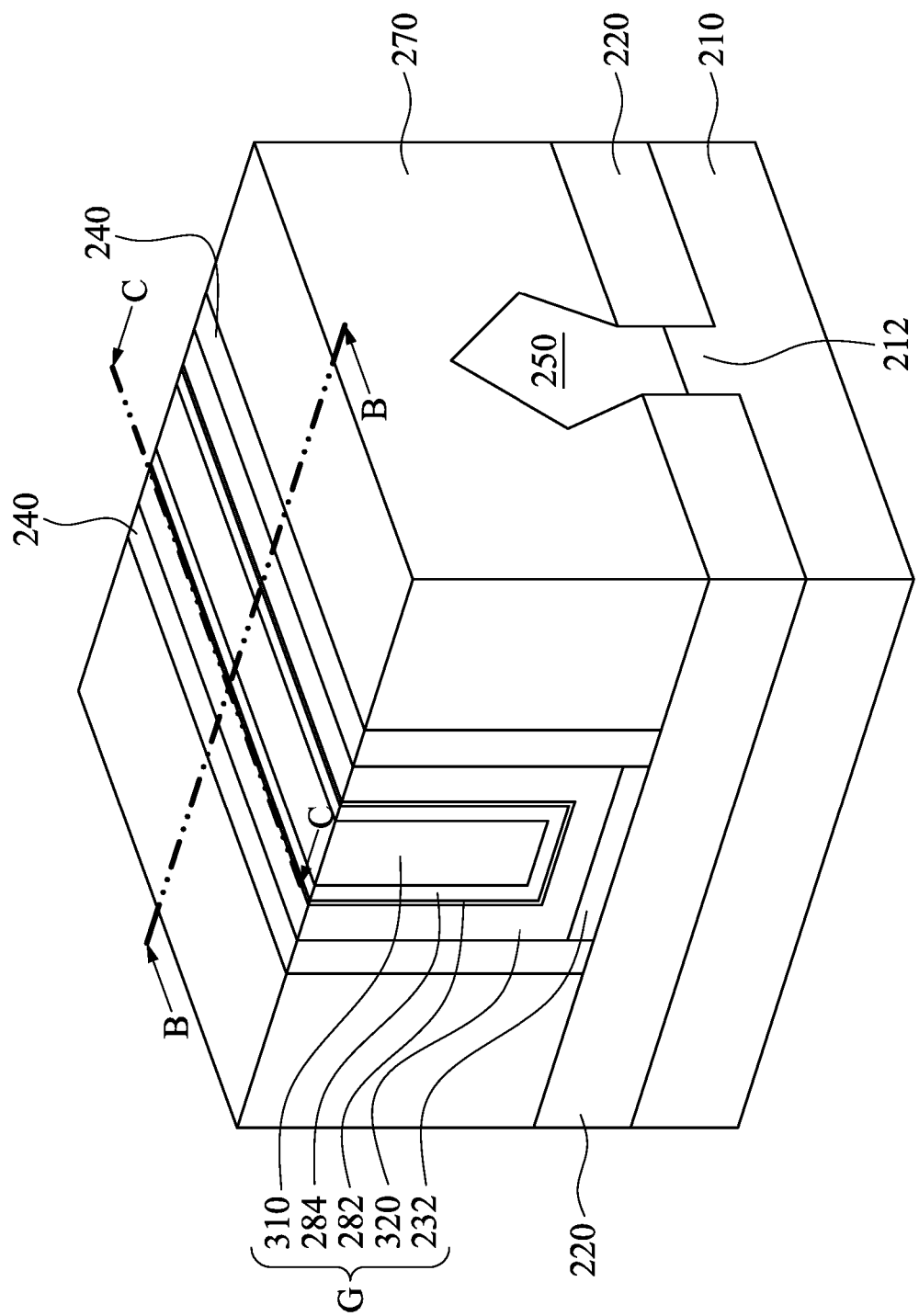
Figure 26B:
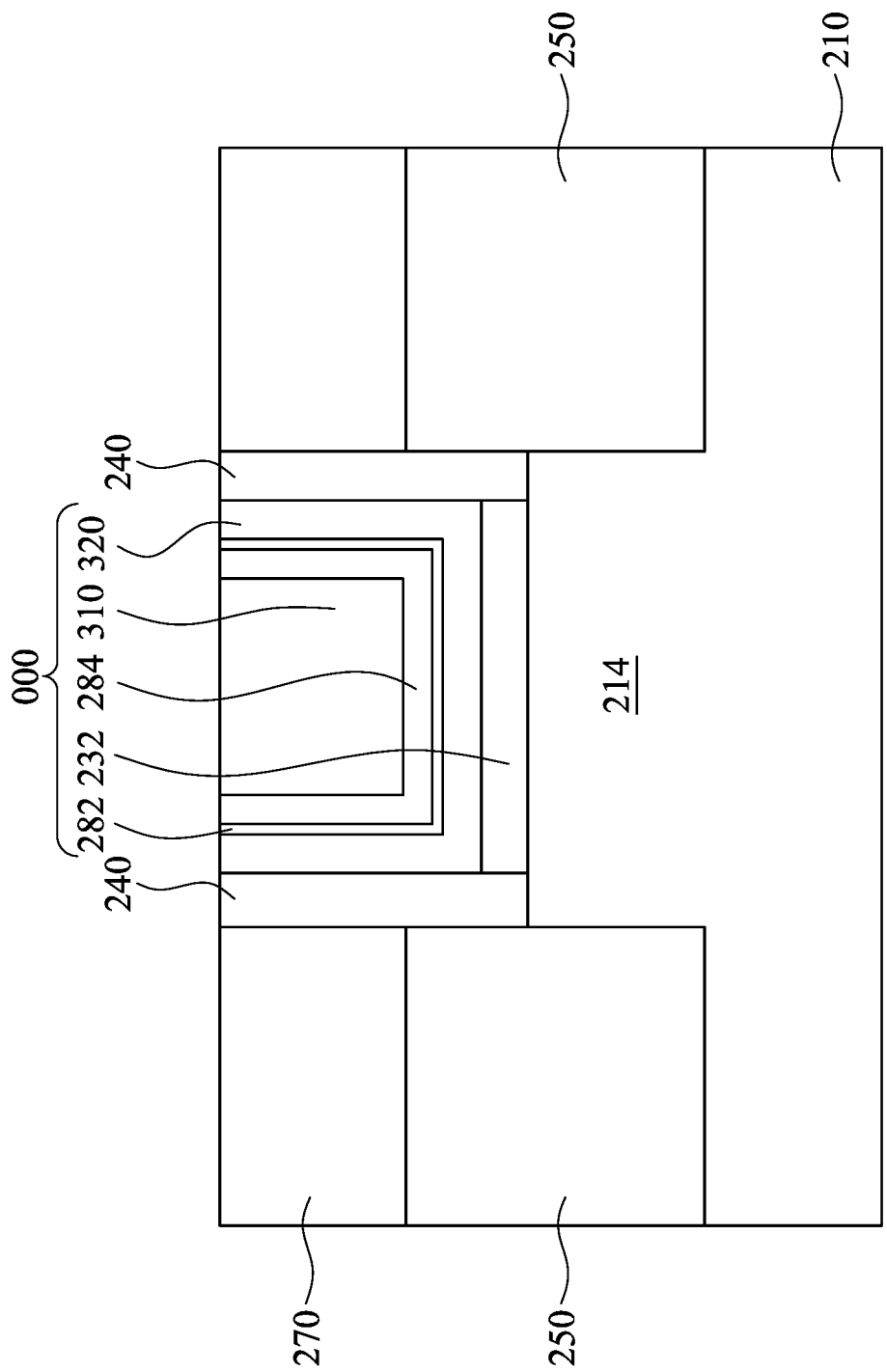
Figure 26C:
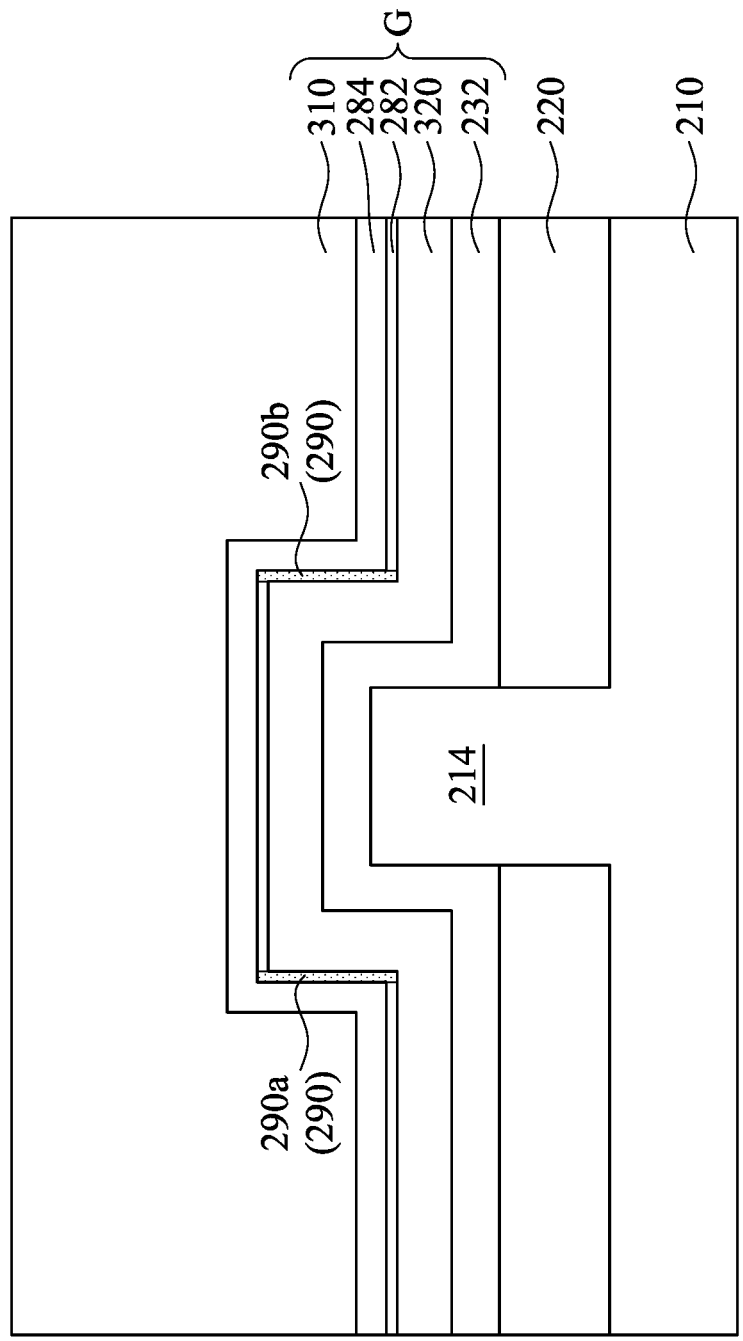

In operation S42 of method M30", a gate electrode 310 is formed over the doped ferroelectric layer 280', as shown in FIGS. 26A, 26B, and 26C. Since the details of the operation S32, S34, S36, S44, S42 is similar to the operations S32, S34, S36, S44, S42 in the methods M30, M30' of FIGS. 9 and 17, a description in this regard will not be repeated herein.

In FIGS. 26A, 26B, and 26C, the metal gate stack G, the semiconductor fin 212, and the source/drain structures 250 form a negative capacitance field effect transistor (NCFET). The metal gate stack G is a negative capacitance gate stack structure and includes the gate dielectric layer 232, the barrier layer 320, the doped ferroelectric layer 280', and the gate electrode 310. The barrier layer 320 is over the gate dielectric layer 232, the doped ferroelectric layer 280' is over the barrier layer 320, and the gate electrode 310 is over the doped ferroelectric layer 280'. The barrier layer 320 is in contact with the doped regions 290a and 290b, and the doped regions 290a and 290b are spaced apart from the gate electrode 310. In other words, the gate electrode 310 is in contact with the second ferroelectric material layer 284. Since the existence of the doped regions 290a and 290b, a dopant concentration of the doped ferroelectric layer 280' varies in a thickness direction of the doped ferroelectric layer 280' (or a direction from the gate electrode 310 toward the channel 214/semiconductor fin 212). In FIG. 26C, the dopant concentration increases in the thickness direction.

In FIGS. 26A, 26B, and 26C, the barrier layer 320 may be used to shield the electric field formed in the doped regions 290a and 290b from the gate dielectric layer 232, such that the capacitance $C_{MOS}$ is not effected by the electric field (or the doped regions 290a and 290b). In some embodiments, the semiconductor device is a P-type NCFET. That is, the semiconductor fin 212 is P-type and the source/drain structures 250 are N-type. In this case, the dopants in the doped regions 290a and 290b may be P-type (such as Phosphorus, Arsenic, Antimony, Bismuth, Lithium, or other suitable materials). That is, the doped regions 290a and 290b are positive charged. In some other embodiments, the semiconductor device is an N-type NCFET. That is, the semiconductor fin 212 is N-type and the source/drain structures 250 are P-type. In this case, the dopants in the doped regions 290a and 290b may be N-type (such as Boron, Gallium, Indium, or other suitable materials). That is, the doped regions 290a and 290b is negative charged.

Figure 27A:
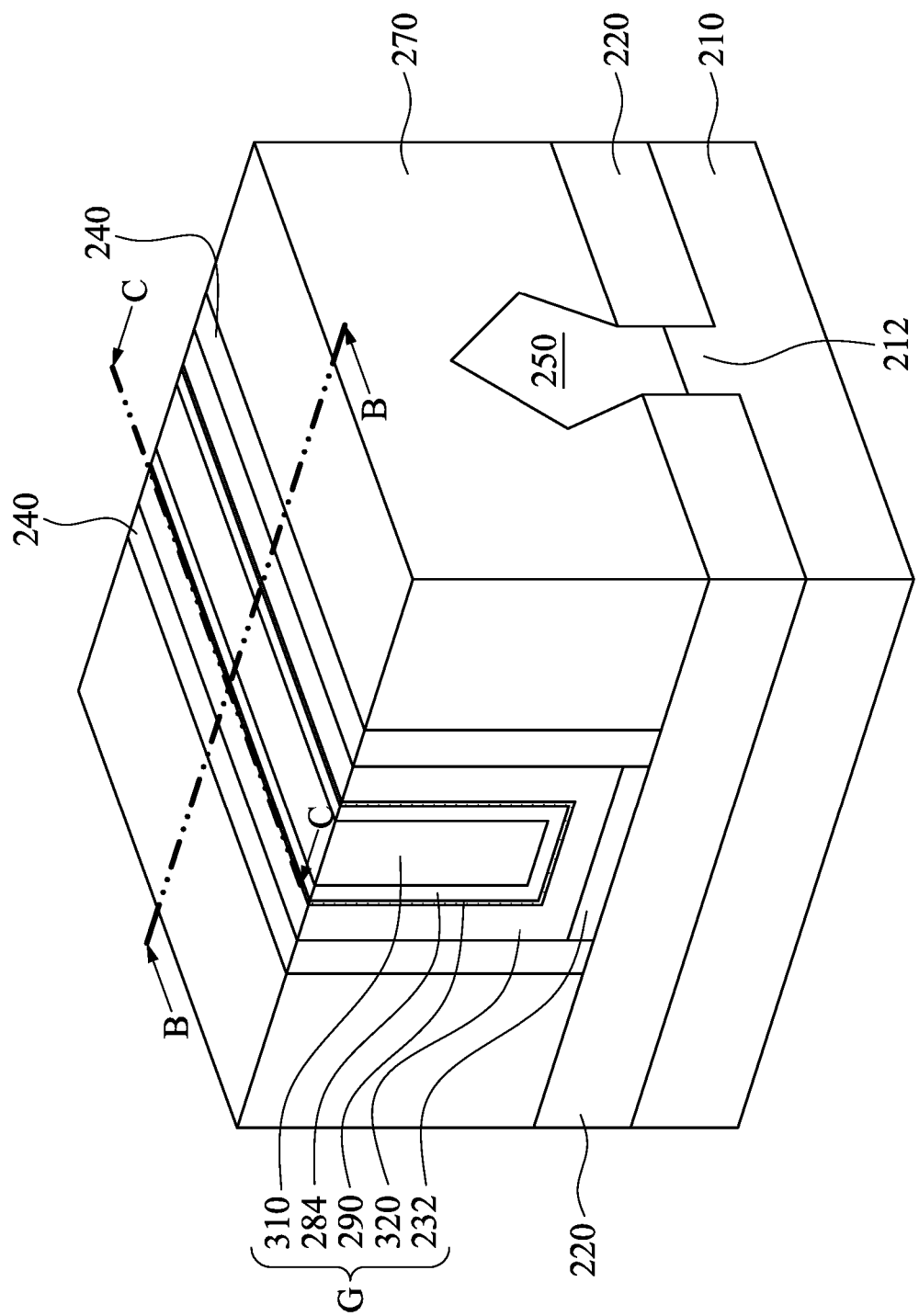
FIG. 27A is a perspective view of the method for manufacturing a semiconductor device in accordance with some embodiments of the present disclosure.
Figure 27B:
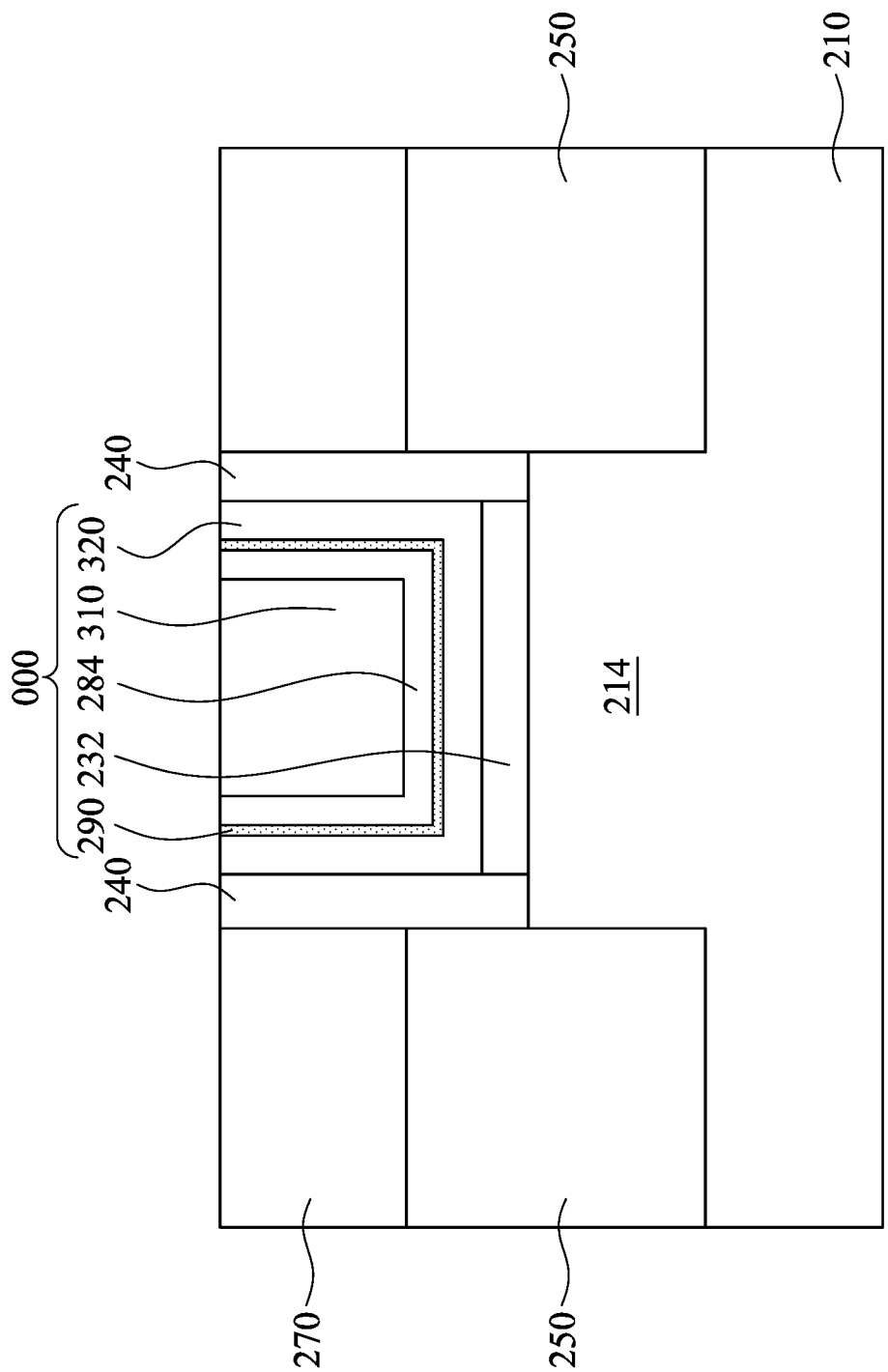
FIG. 27B is a cross-sectional view taking along line B-B of FIG. 27A.
Figure 27C:
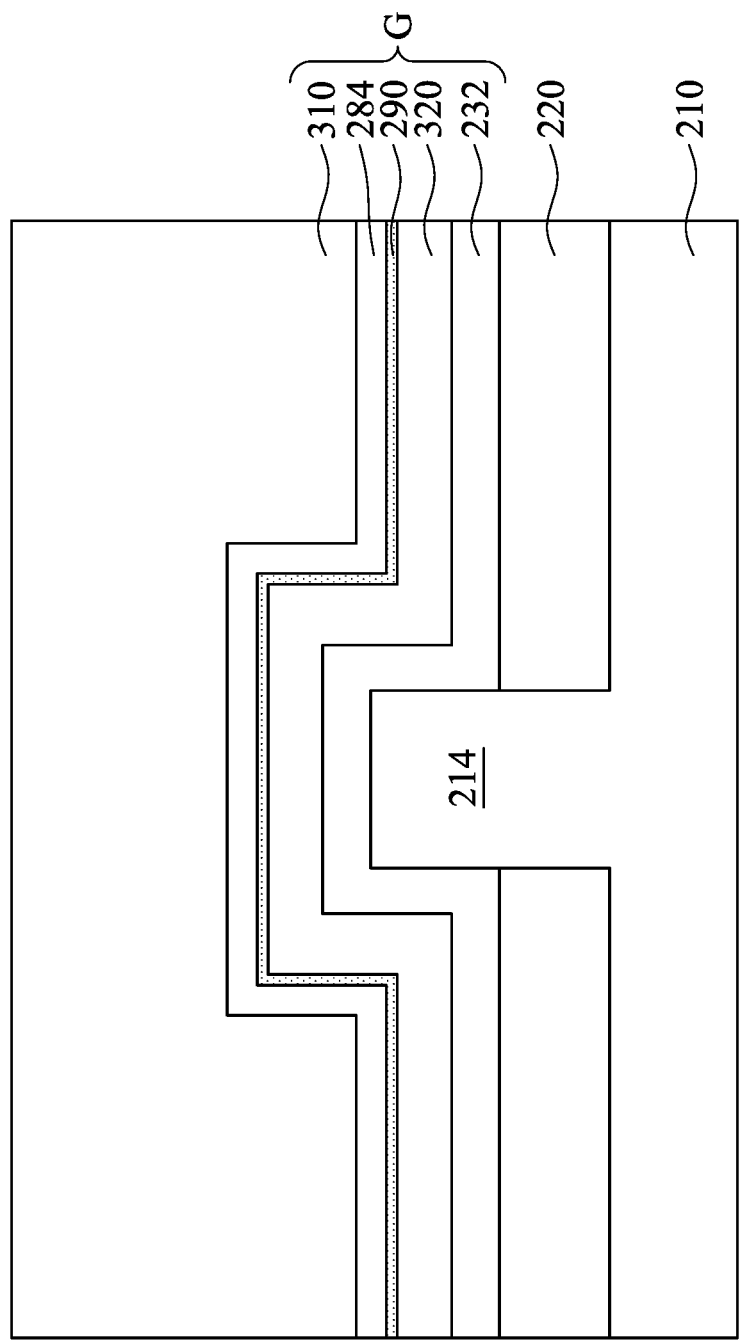
FIG. 27C is a cross-sectional view taking along line C-C of FIG. 27A.

FIG. 27A is a perspective view of the method M30" for manufacturing a semiconductor device in accordance with some embodiments of the present disclosure, FIG. 27B is a cross-sectional view taking along line B-B of FIG. 27A, and FIG. 27C is a cross-sectional view taking along line C-C of FIG. 27A. In some embodiments, the ion implantation process in operation S40' may be an ion implantation process such as a diffusion process or multi-directional ion implantation process. Or, the ion implantation process may have a predetermined downward direction parallel to the protruding direction Dp (see FIG. 14C) of the semiconductor fin 212. Therefore, a doped region 290 conformal with the top surface 280a of the ferroelectric material layer 280 is formed. Since other manufacturing method of the semiconductor device in FIGS. 27A to 27C are similar to the semiconductor device in FIGS. 26A to 26C, a description in this regard will not be repeated herein.

According to some embodiments, a semiconductor device includes a channel, source/drain structures, and a gate stack. The source/drain structures are on opposite sides of the channel. The gate stack is over the channel, and the gate stack includes a gate dielectric layer, a doped ferroelectric layer, and a gate electrode. The gate dielectric layer is over the channel. The doped ferroelectric layer is over the gate dielectric layer. The gate electrode is over the doped ferroelectric layer. A dopant concentration of the doped ferroelectric layer varies in a direction from the gate electrode toward the channel.

According to some embodiments, a method for manufacturing a semiconductor device includes forming a dummy gate stack over a channel in a substrate. Source/drain structures are formed on the substrate. A dielectric layer is formed to cover the source/drain structures and adjacent the dummy gate stack. A gate electrode of the dummy gate stack is removed to form a gate opening in the dielectric layer. A doped ferroelectric layer is formed in the gate opening. A gate electrode is formed over the doped ferroelectric layer and in the gate opening.

According to some embodiments, a method for manufacturing a semiconductor device includes forming a gate stack over a channel of a substrate including forming a gate dielectric layer over the channel of the substrate. A doped ferroelectric layer is formed over the gate dielectric layer. A gate electrode is formed over the doped ferroelectric layer.

The method further includes forming source/drain structures on opposite sides of the gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a channel;
   source/drain structures on opposite sides of the channel; and
   a gate stack over the channel, wherein the gate stack comprises:
      a gate dielectric layer over the channel;
      a doped ferroelectric layer over the gate dielectric layer, wherein the doped ferroelectric layer comprises a doped region and an undoped region, and a thickness of the undoped region of the doped ferroelectric layer is greater than a thickness of the doped region of the doped ferroelectric layer; and
      a gate electrode over the doped ferroelectric layer.

2. The semiconductor device of claim 1, wherein a dopant concentration of the doped ferroelectric layer decreases in the direction from the gate electrode toward the channel.

3. The semiconductor device of claim 1, wherein a dopant concentration of the doped ferroelectric layer increases in the direction from the gate electrode toward the channel.

4. The semiconductor device of claim 1, further comprising a barrier layer between the gate dielectric layer and the doped ferroelectric layer.

5. The semiconductor device of claim 1, wherein the doped region of the doped ferroelectric layer is in contact with the gate electrode.

6. The semiconductor device of claim 5, wherein dopants of the doped region are N-type, and the channel is P-type.

7. The semiconductor device of claim 5, wherein dopants of the doped region are P-type, and the channel is N-type.

8. The semiconductor device of claim 1, wherein the doped region of the doped ferroelectric layer is spaced apart from the gate electrode.

9. The semiconductor device of claim 8, wherein dopants of the doped region are P-type, and the channel is P-type.

10. The semiconductor device of claim 8, wherein dopants of the doped region are N-type, and the channel is N-type.

11. A method for manufacturing a semiconductor device comprising:
    forming a dummy gate stack over a semiconductor fin in a substrate;
    forming source/drain structures on the semiconductor fin;
    forming a dielectric layer covering the source/drain structures and adjacent the dummy gate stack;
    removing a gate electrode of the dummy gate stack to form a gate opening in the dielectric layer;
    forming a doped ferroelectric layer in the gate opening, such that the doped ferroelectric layer has a first portion on a side surface of the semiconductor fin and a second portion on a top surface of the semiconductor fin, and a dopant concentration of the first portion of the doped ferroelectric layer is higher than a dopant concentration of the second portion of the doped ferroelectric layer; and
    forming a gate electrode over the doped ferroelectric layer and in the gate opening.

12. The method of claim 11, wherein forming the doped ferroelectric layer comprises:
    forming a ferroelectric material layer in the gate opening; and
    doping a top portion of the ferroelectric material layer to form the doped ferroelectric layer.

13. The method of claim 12, wherein dopants of the doped ferroelectric layer and the semiconductor fin have different conductivity types.

14. The method of claim 11, wherein forming the doped ferroelectric layer comprises:
    forming a first ferroelectric material layer in the gate opening;
    doping the first ferroelectric material layer; and
    forming a second ferroelectric material layer over the first ferroelectric material layer to form the doped ferroelectric layer.

15. The method of claim 14, wherein dopants of the doped ferroelectric layer and the semiconductor fin have the same conductivity type.

16. The method of claim 11, further comprising forming a barrier layer in the gate opening, and the doped ferroelectric layer is formed over the barrier layer.

17. A method for manufacturing a semiconductor device comprising:
    forming a gate stack over a channel of a substrate, comprising:
       forming a gate dielectric layer over the channel of the substrate;
       forming a doped ferroelectric layer over the gate dielectric layer, wherein a doping concentration of the doped ferroelectric layer is in a range of about 1E12 $cm^{-2}$ to about 5E13 $cm^{-2}$; and
       forming a gate electrode over the doped ferroelectric layer; and
    forming source/drain structures on opposite sides of the gate stack.

18. The method of claim 17, wherein forming the doped ferroelectric layer comprises:
    forming a ferroelectric material layer over the gate dielectric layer; and
    doping a top portion of the ferroelectric material layer to form the doped ferroelectric layer.

19. The method of claim 17, wherein forming the doped ferroelectric layer comprises:
    forming a first ferroelectric material layer over the gate dielectric layer;
    doping the first ferroelectric material layer; and
    forming a second ferroelectric material layer over the first ferroelectric material layer to form the doped ferroelectric layer.

20. The method of claim 17, further comprising forming a barrier layer over the gate dielectric layer, and the doped ferroelectric layer is formed over the barrier layer.

* * * * *